(12) United States Patent
Murooka

(10) Patent No.: US 9,343,144 B2
(45) Date of Patent: *May 17, 2016

(54) MEMORY DEVICE AND METHOD OF CONTROLLING MEMORY DEVICE

(71) Applicant: Kabushiki Kaisha Toshiba, Minato-ku (JP)

(72) Inventor: Kenichi Murooka, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/810,074

(22) Filed: Jul. 27, 2015

(65) Prior Publication Data

US 2015/0332761 A1    Nov. 19, 2015

Related U.S. Application Data

(63) Continuation of application No. 14/282,047, filed on May 20, 2014, now Pat. No. 9,129,677.

(60) Provisional application No. 61/909,033, filed on Nov. 26, 2013.

(51) Int. Cl.
*G11C 11/00* (2006.01)
*G11C 13/00* (2006.01)
*H01L 27/24* (2006.01)

(52) U.S. Cl.
CPC ........ *G11C 13/0021* (2013.01); *G11C 13/0002* (2013.01); *G11C 13/0023* (2013.01); *G11C 13/0026* (2013.01); *G11C 13/0028* (2013.01); *G11C 13/0069* (2013.01); *G11C 2213/71* (2013.01); *H01L 27/249* (2013.01); *H01L 27/2454* (2013.01)

(58) Field of Classification Search
CPC ........... G11C 13/0069; G11C 13/0026; G11C 13/0028
USPC ............................ 365/46, 63, 148, 158, 163
See application file for complete search history.

(56) References Cited

U.S. PATENT DOCUMENTS 7,983,065 B2   7/2011  Samachisa
8,331,152 B2   12/2012 Yoon et al.
8,406,034 B2   3/2013  Murooka
(Continued)

FOREIGN PATENT DOCUMENTS

JP    2010-199181    9/2010

OTHER PUBLICATIONS

U.S. Appl. No. 14/017,727, filed Sep. 4, 2013, Murooka.
(Continued)

*Primary Examiner* — Tha-O H Bui
(74) *Attorney, Agent, or Firm* — Oblon, McClelland, Maier & Neustadt, L.L.P.

(57) ABSTRACT

According to one embodiment, a memory device includes a plurality of global column lines arranged in parallel and extending in a first direction; a plurality of row lines extending in a second direction which is perpendicular to the first direction; a plurality of column lines in a two-dimensional arrangement, which extend in a third direction which is perpendicular to the first direction and the second direction; and a memory cell array including a plurality of memory cells arranged at intersections between the row lines and the column lines.

19 Claims, 52 Drawing Sheets

(56) References Cited

U.S. PATENT DOCUMENTS

| | | |
|---|---|---|
| 8,963,115 B2 | 2/2015 | Murooka |
| 8,971,093 B2 | 3/2015 | Murooka |
| 2010/0080041 A1 | 4/2010 | Tonomura |
| 2010/0142091 A1* | 6/2010 | Tsukamoto ............ B82Y 10/00 360/135 |
| 2010/0213550 A1 | 8/2010 | Kanno et al. |
| 2010/0271862 A1* | 10/2010 | Yoon ........................ G11C 8/10 365/148 |
| 2012/0147644 A1* | 6/2012 | Scheuerlein ....... G11C 13/0002 365/51 |
| 2012/0147645 A1 | 6/2012 | Scheuerlein |
| 2012/0147646 A1 | 6/2012 | Scheuerlein |
| 2012/0147647 A1 | 6/2012 | Scheuerlein |
| 2012/0147648 A1 | 6/2012 | Scheuerlein |
| 2012/0147649 A1 | 6/2012 | Samachisa et al. |
| 2012/0147650 A1 | 6/2012 | Samachisa et al. |
| 2012/0147651 A1 | 6/2012 | Scheuerlein et al. |
| 2012/0147652 A1 | 6/2012 | Scheuerlein |
| 2012/0147689 A1 | 6/2012 | Scheuerlein et al. |
| 2013/0148400 A1 | 6/2013 | Murooka |
| 2013/0187118 A1 | 7/2013 | Murooka |
| 2015/0103581 A1 | 4/2015 | Murooka |

OTHER PUBLICATIONS

U.S. Appl. No. 14/593,254, filed Jan. 9, 2015, Murooka.
U.S. Appl. No. 14/593,344, filed Jan. 9, 2015, Murooka.

* cited by examiner

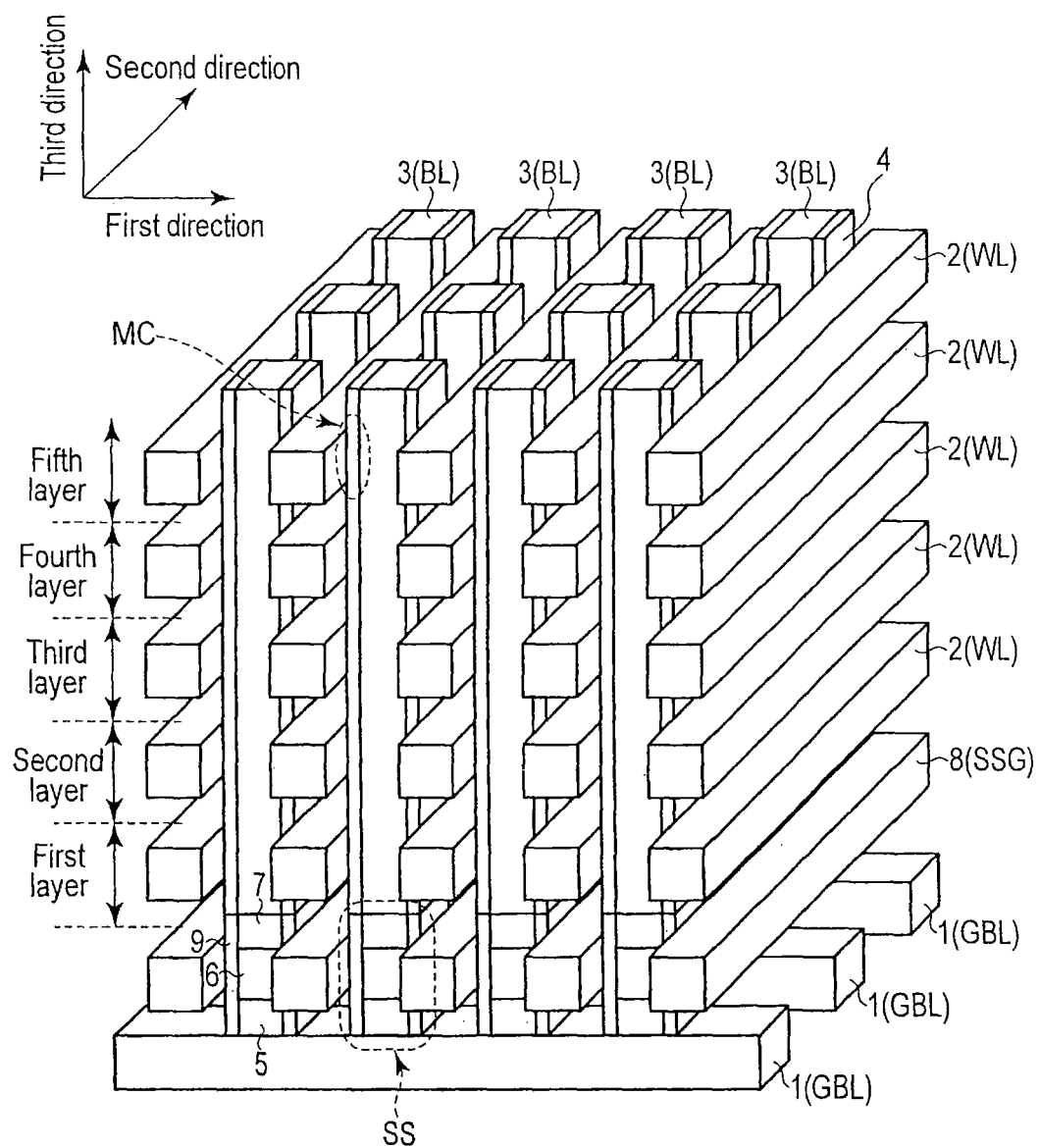
F I G. 2

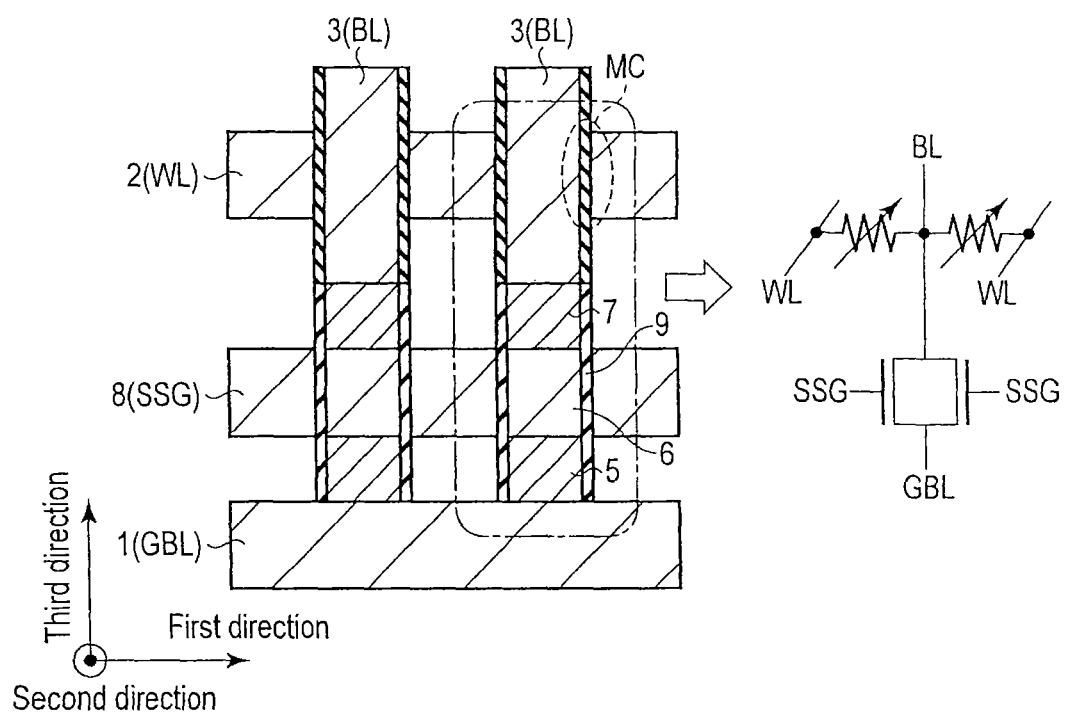
F I G. 4

|  | Write | Erase | Read |
|---|---|---|---|
| SSG_s | Vg_w, 0 | Vg_e, 0 | Vg_r, 0 |
| SSG_n | Vg_w, 0 | Vg_e, 0 | Vg_r, 0 |
| SSG_u | 0 | 0 | 0 |
| GBL_s | Vw, Vwf | Vof, Vef+Vof | Vr+Vo |
| GBL_u | Vwf | Vef+Vof | Vr+Vo |
| WL_s | 0, Vwf | Ves+Vof, Vef+Vof | Vo, Vr+Vo |
| WL_u | Vwf | Vef+Vof | Vr+Vo |

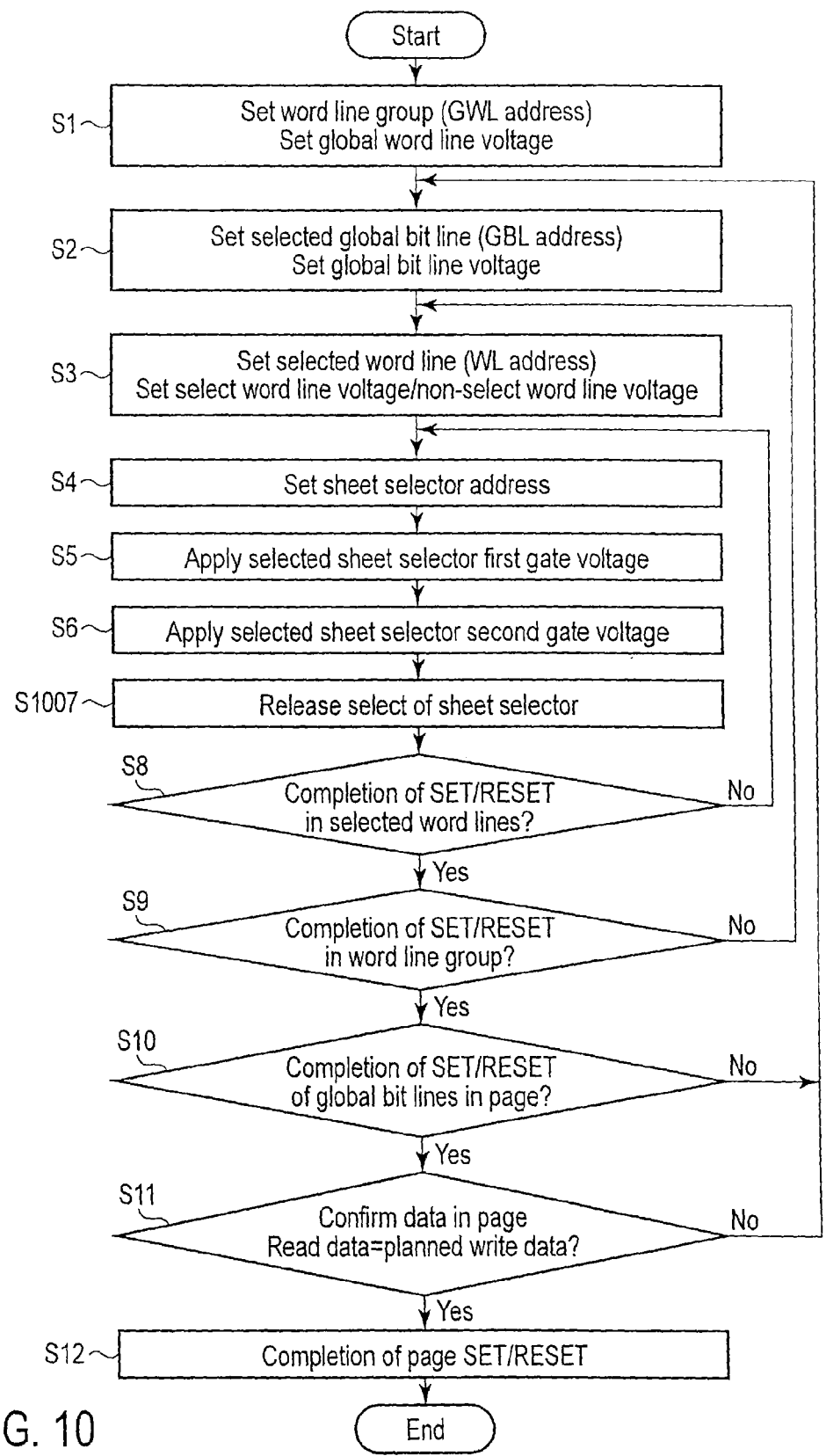
F I G. 10

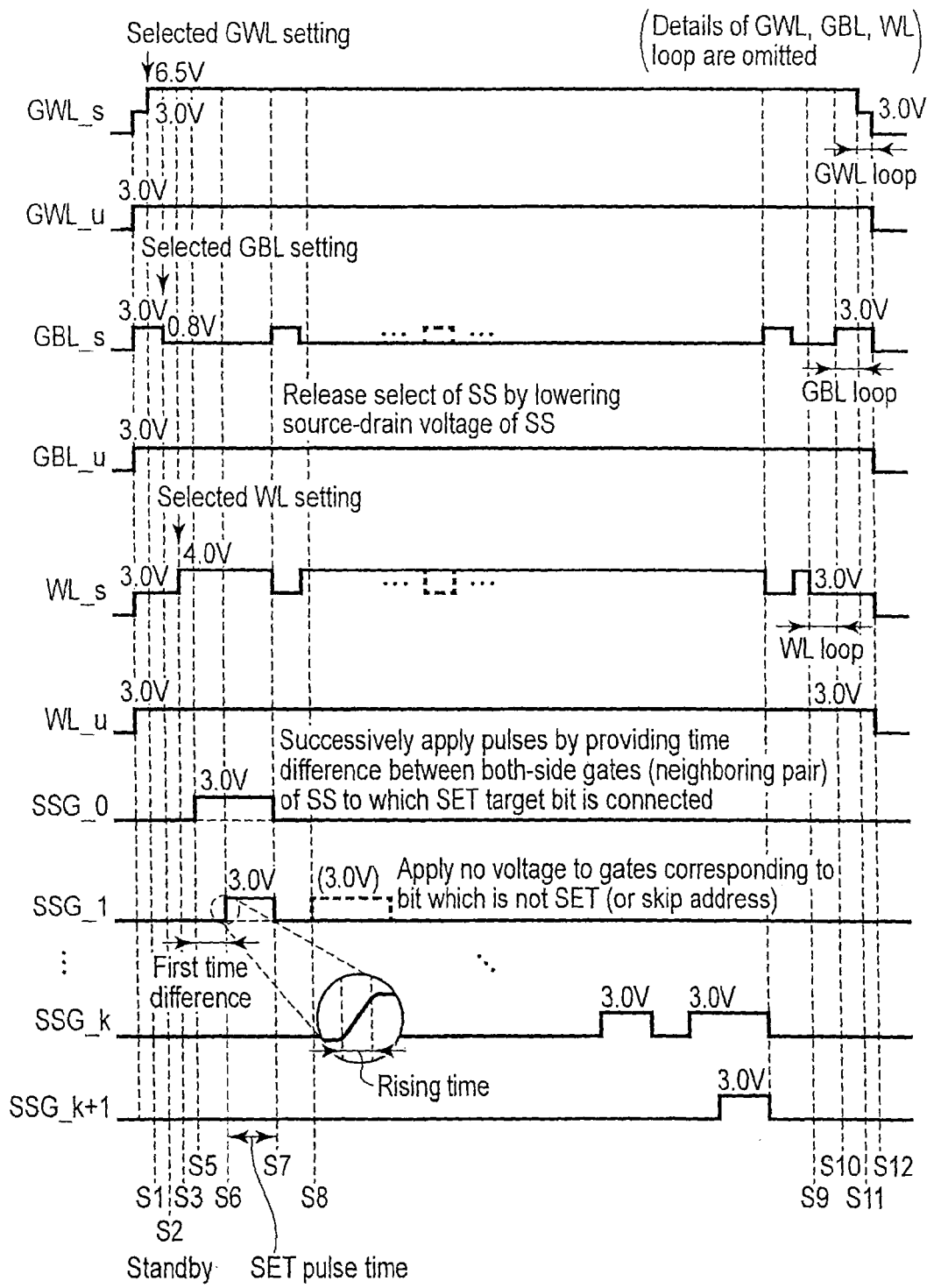
F I G. 11

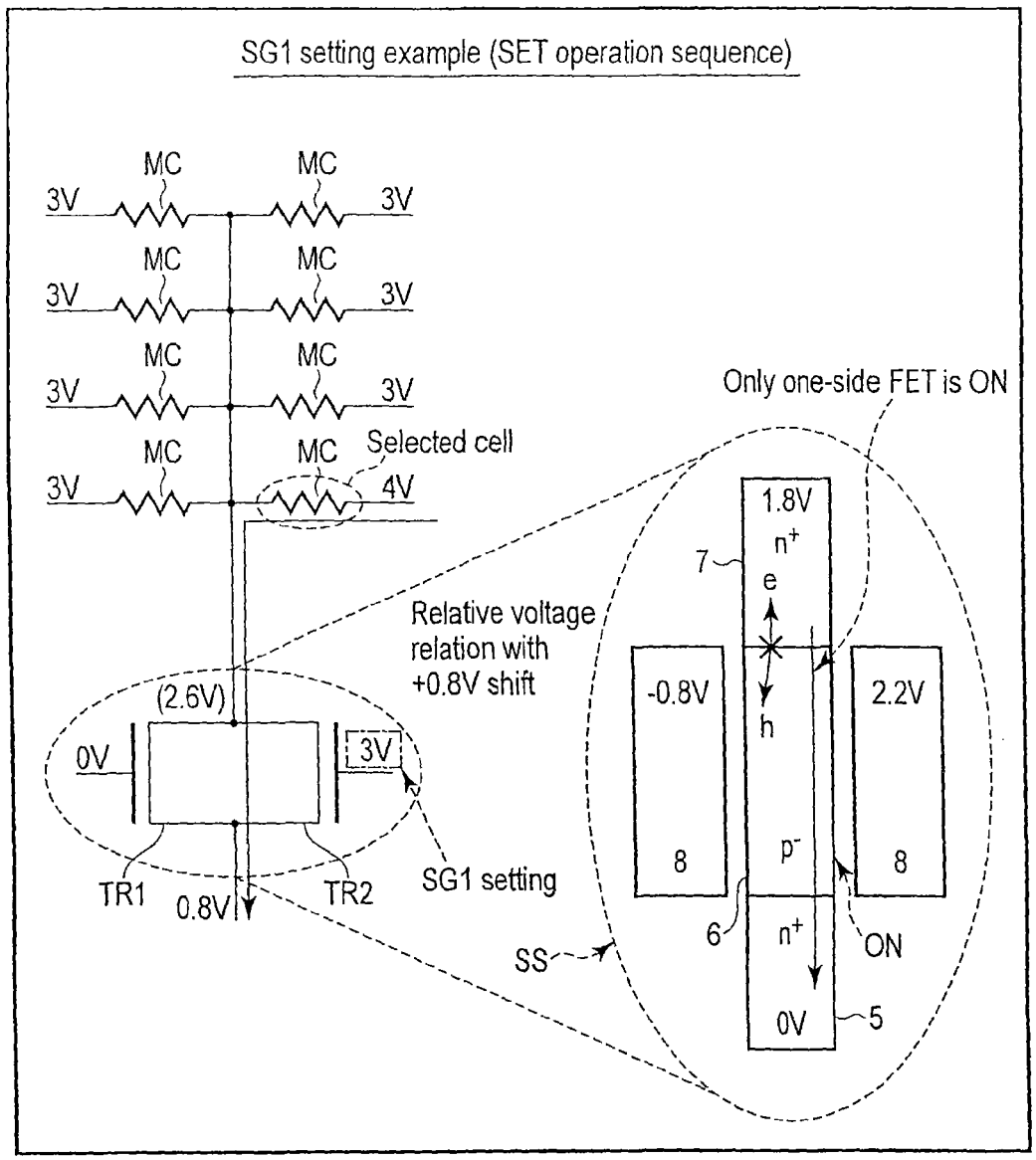
F I G. 14

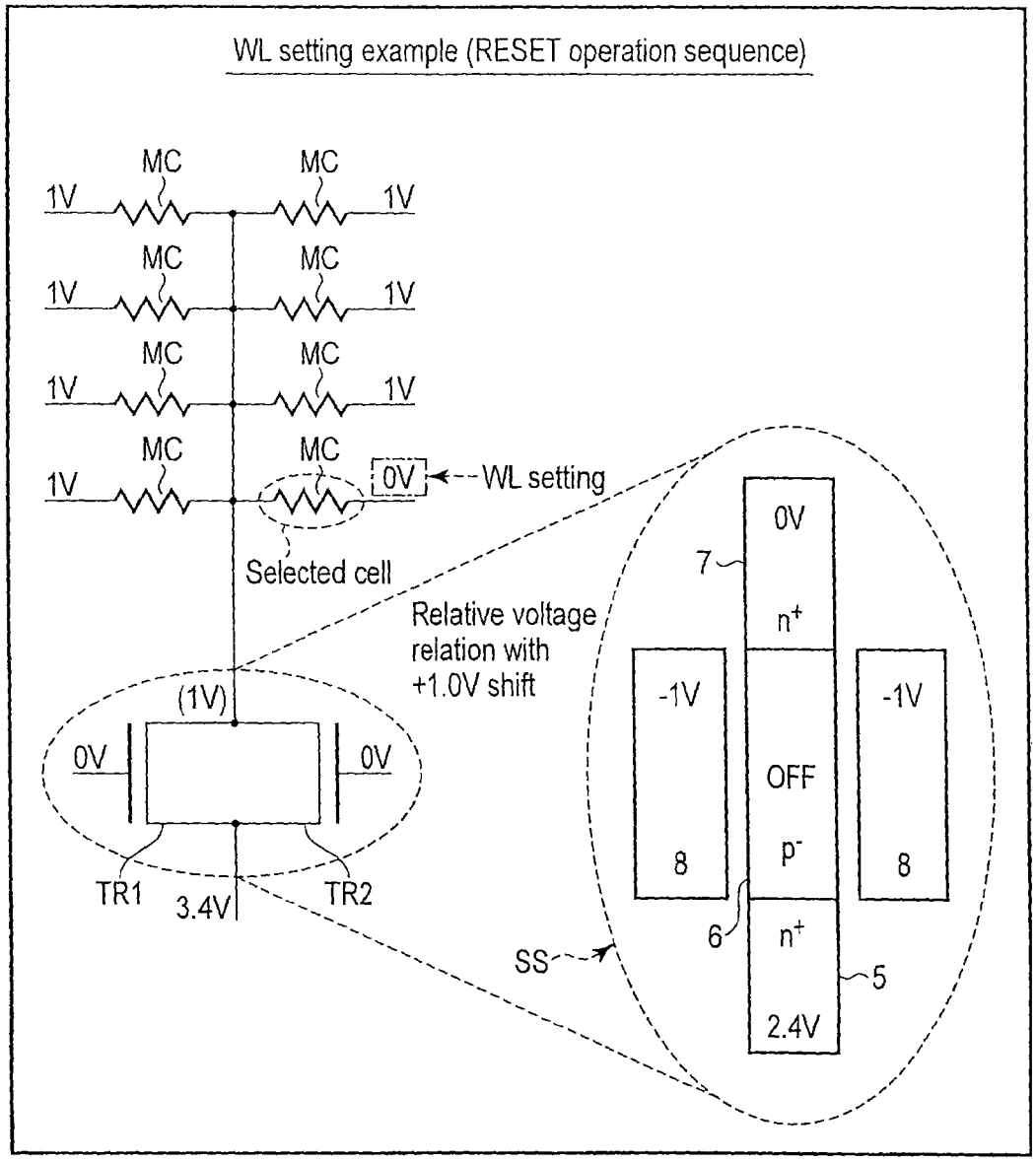
F I G. 20

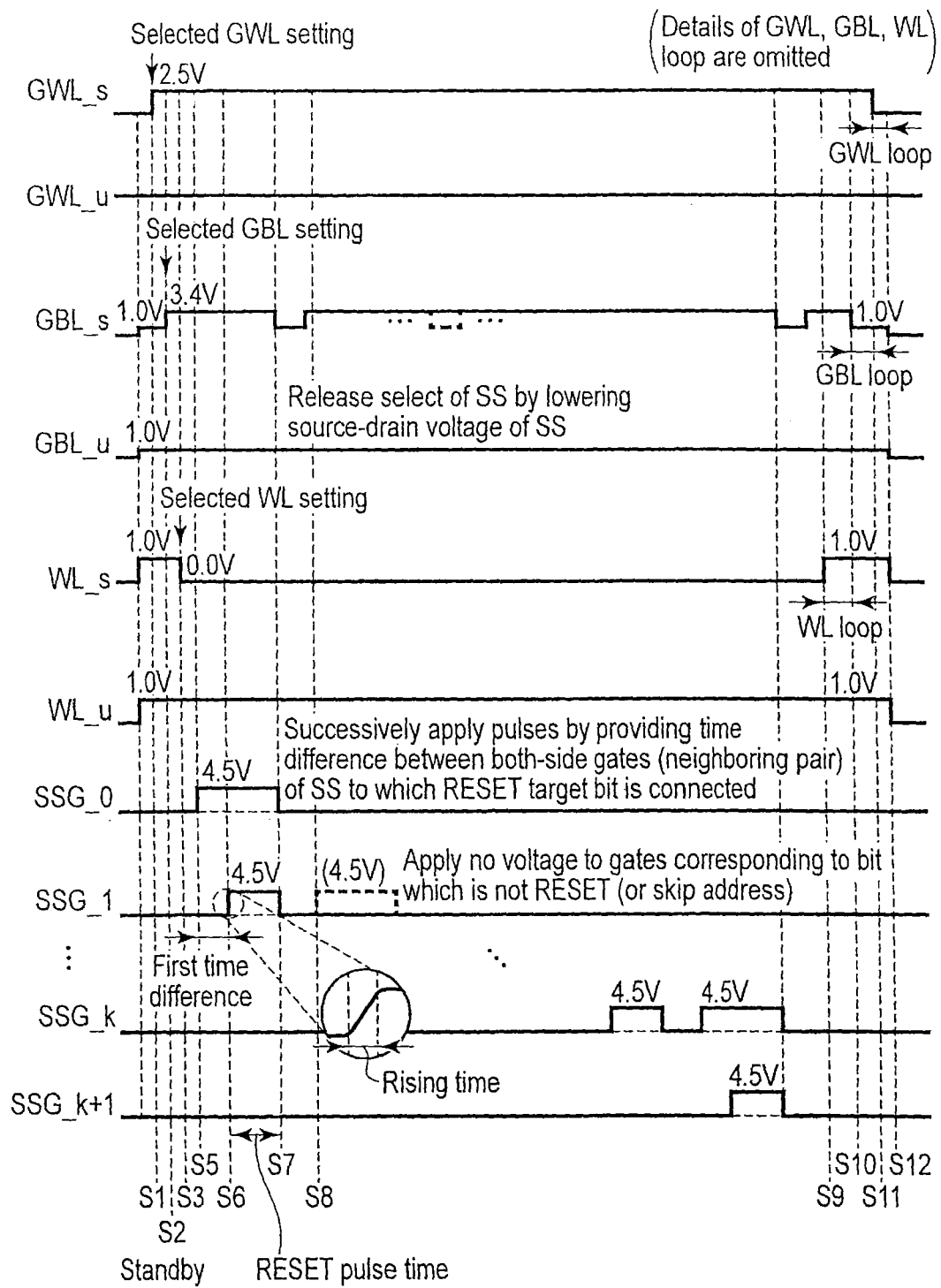
F I G. 26

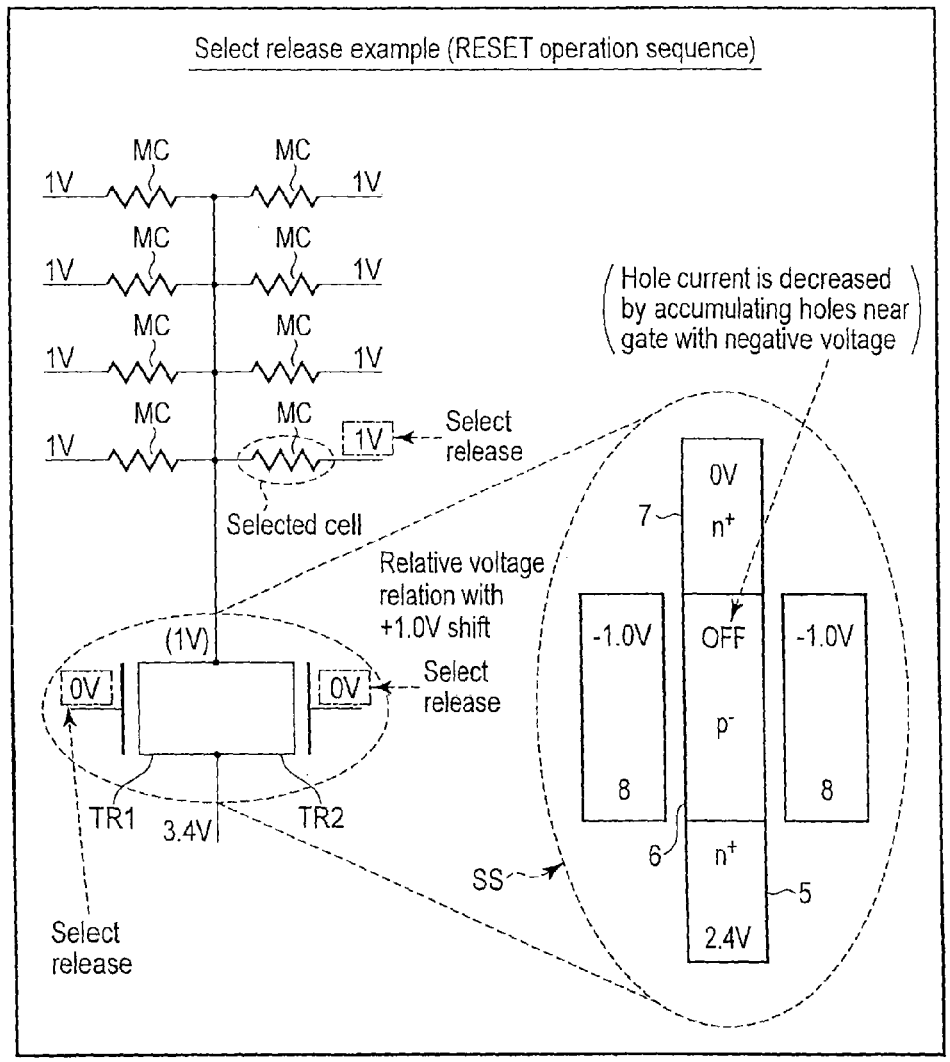
F I G. 31

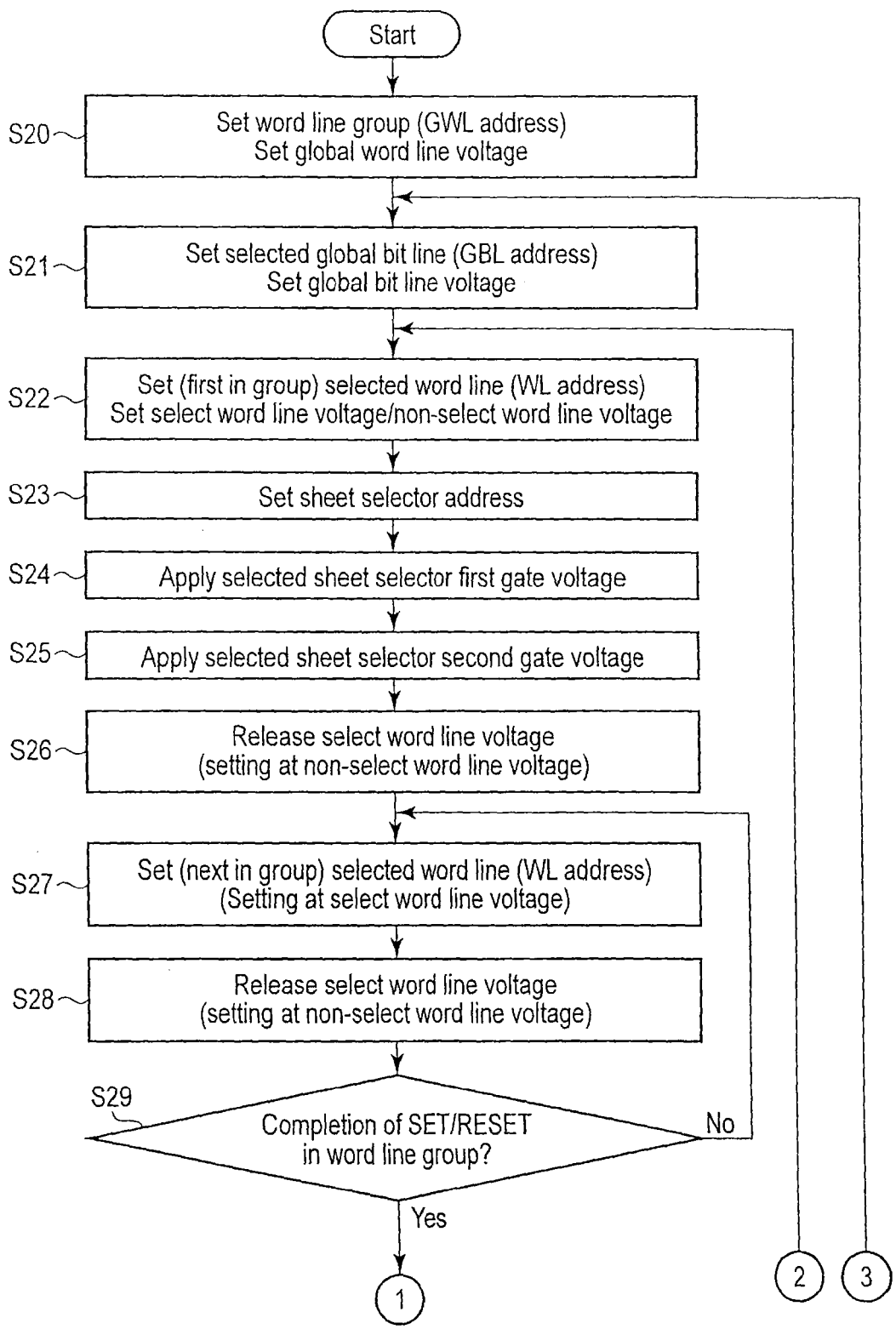
F I G. 36A

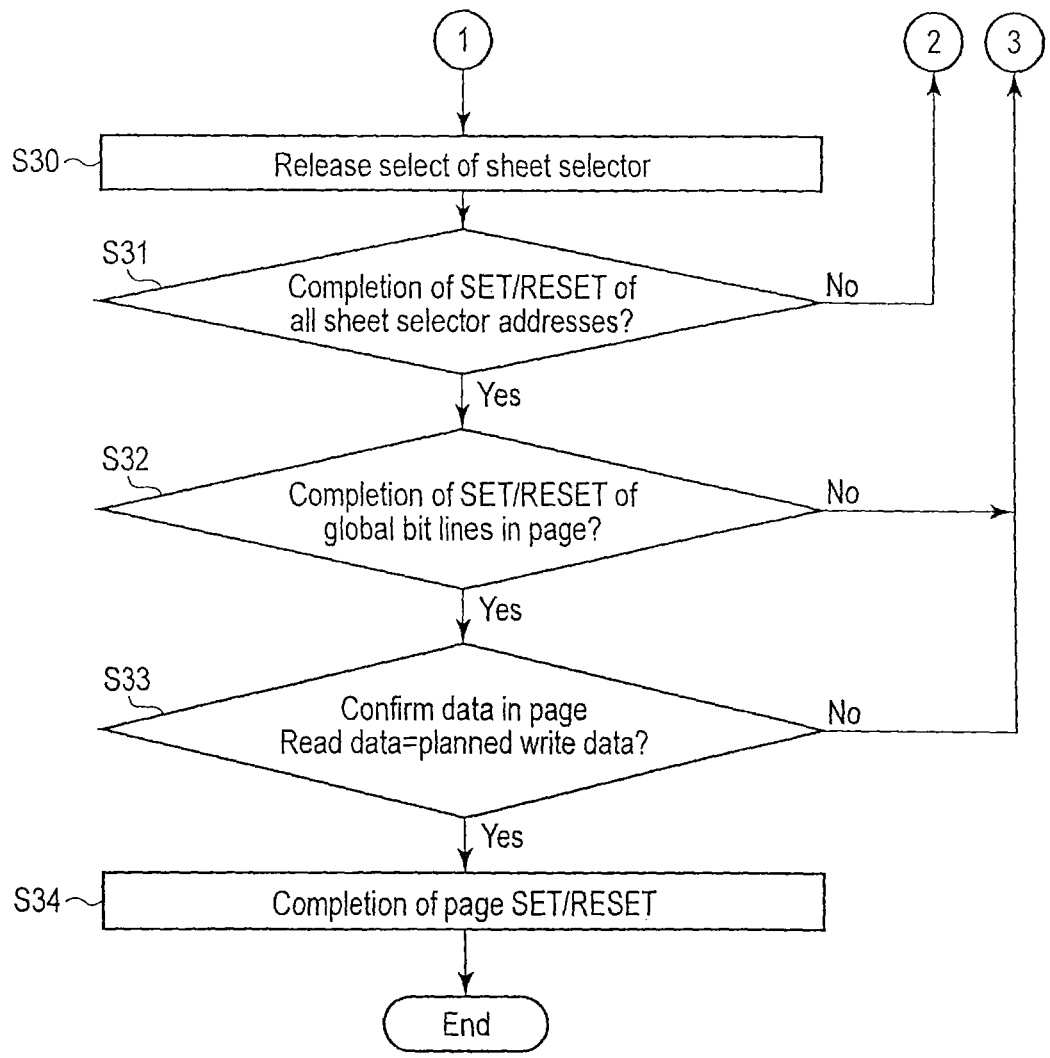
F I G. 36B

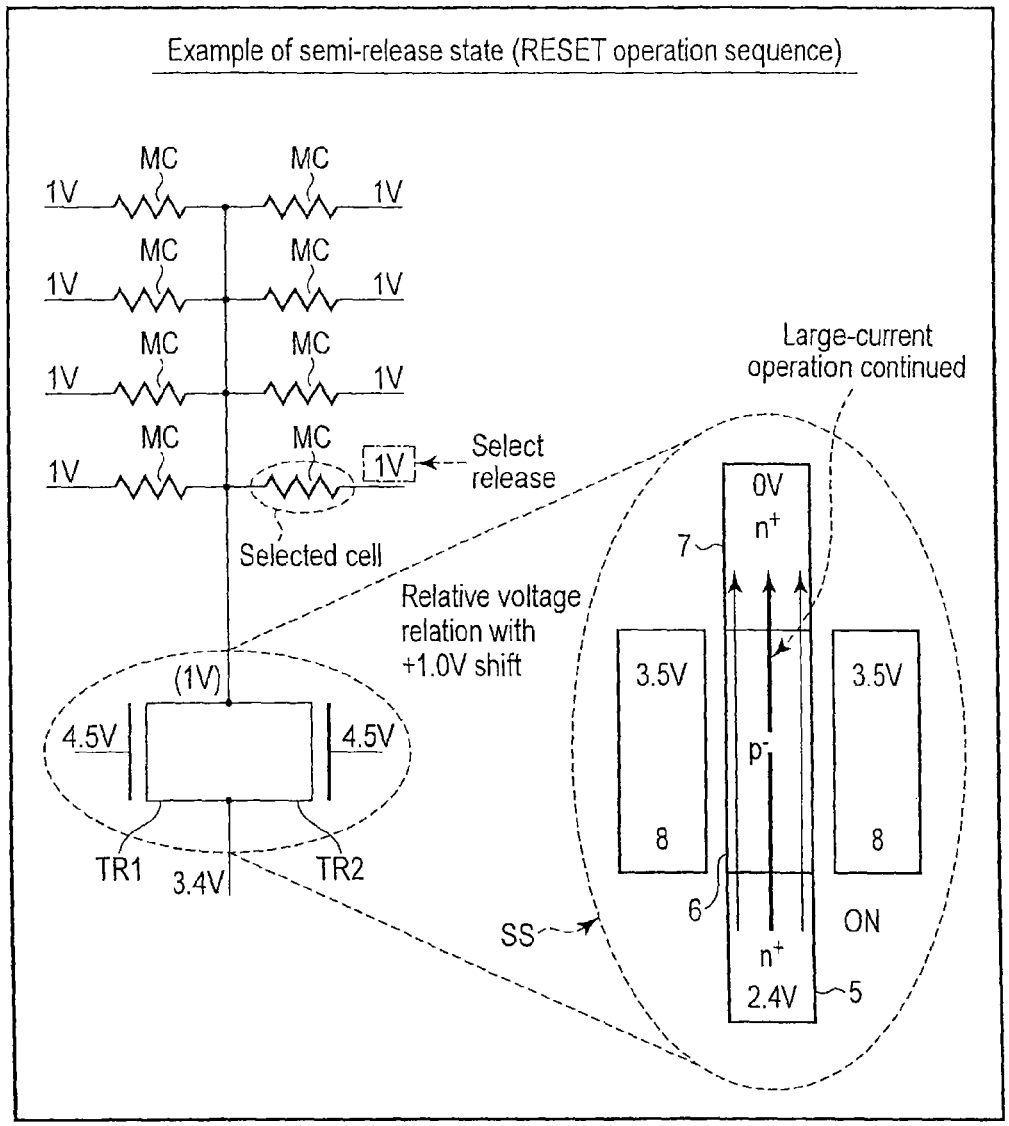
F I G. 41

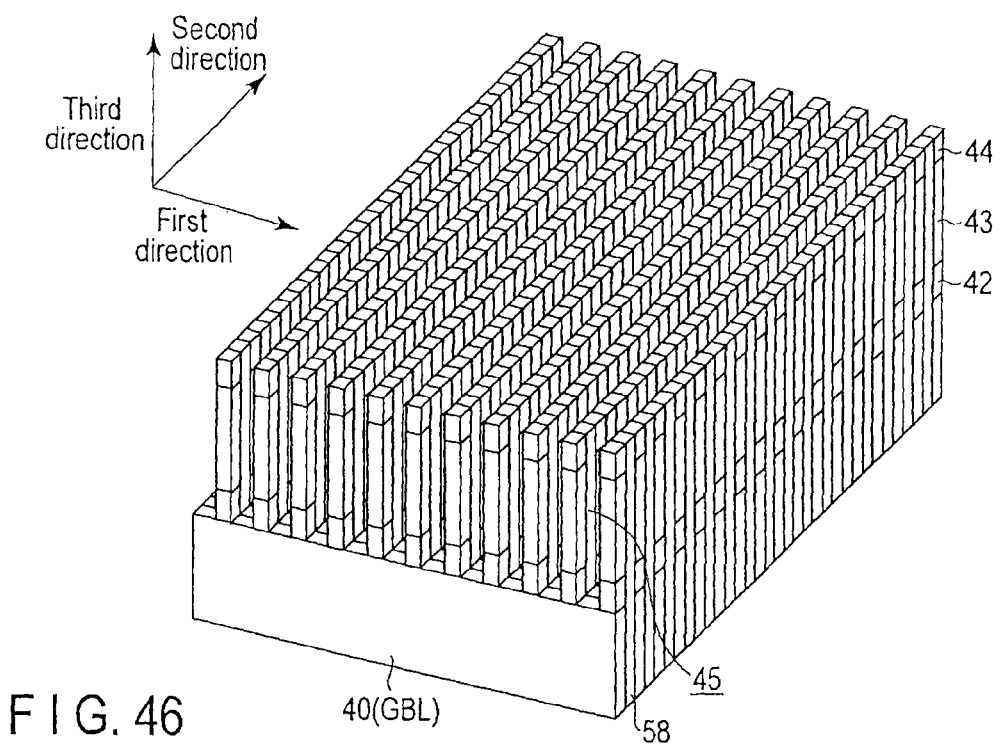
F I G. 46
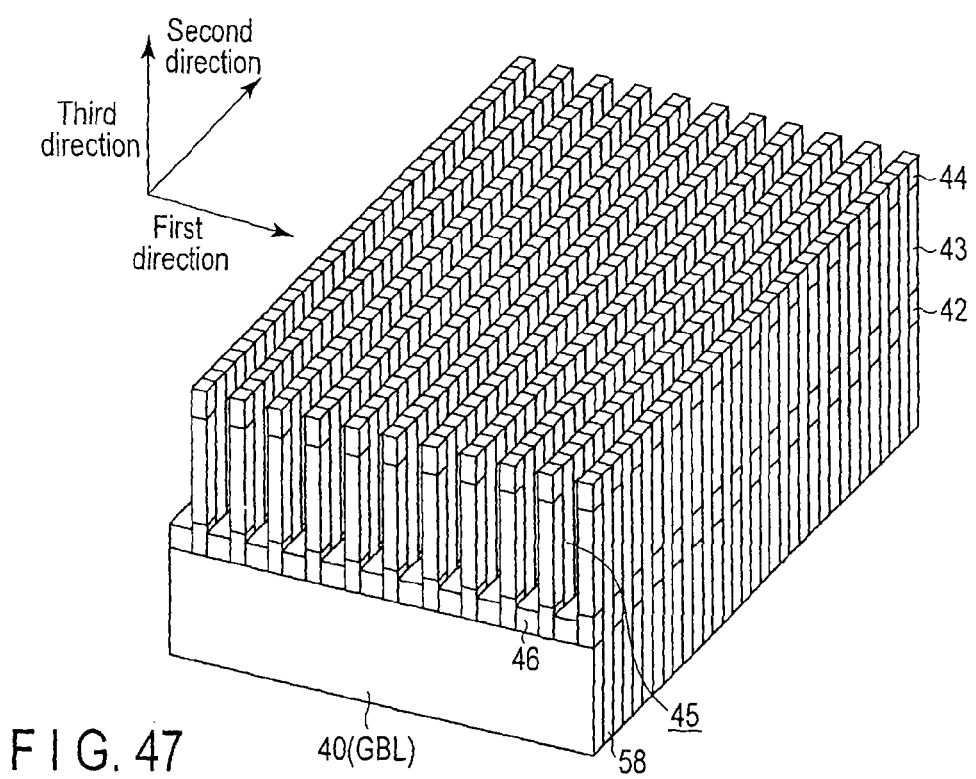
F I G. 47

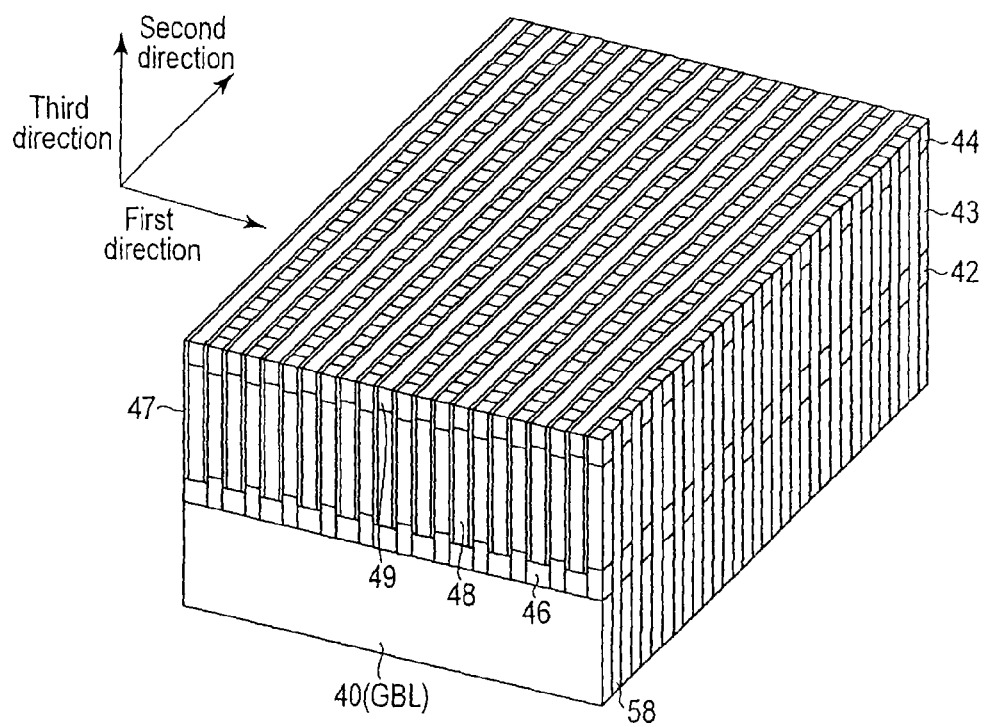
F I G. 50

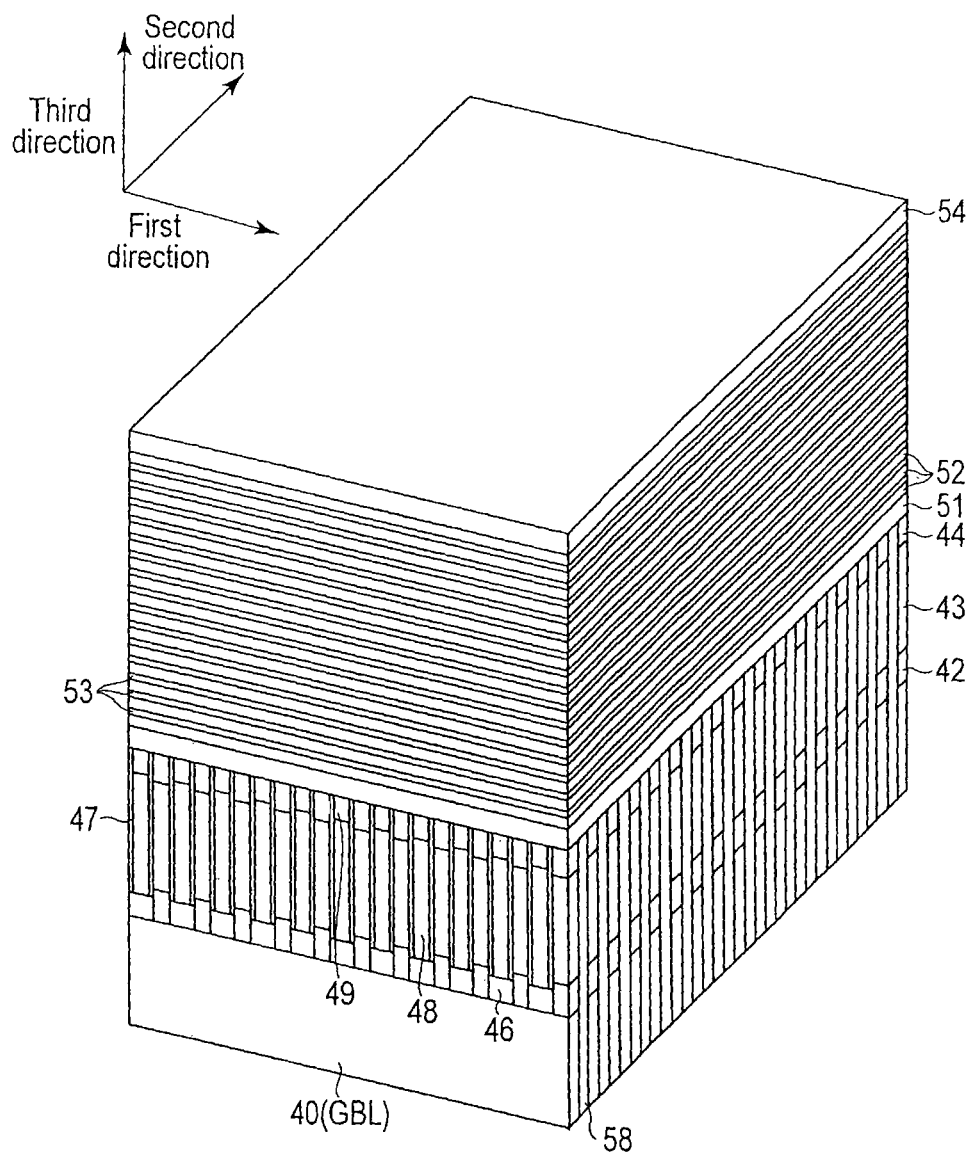
F I G. 51

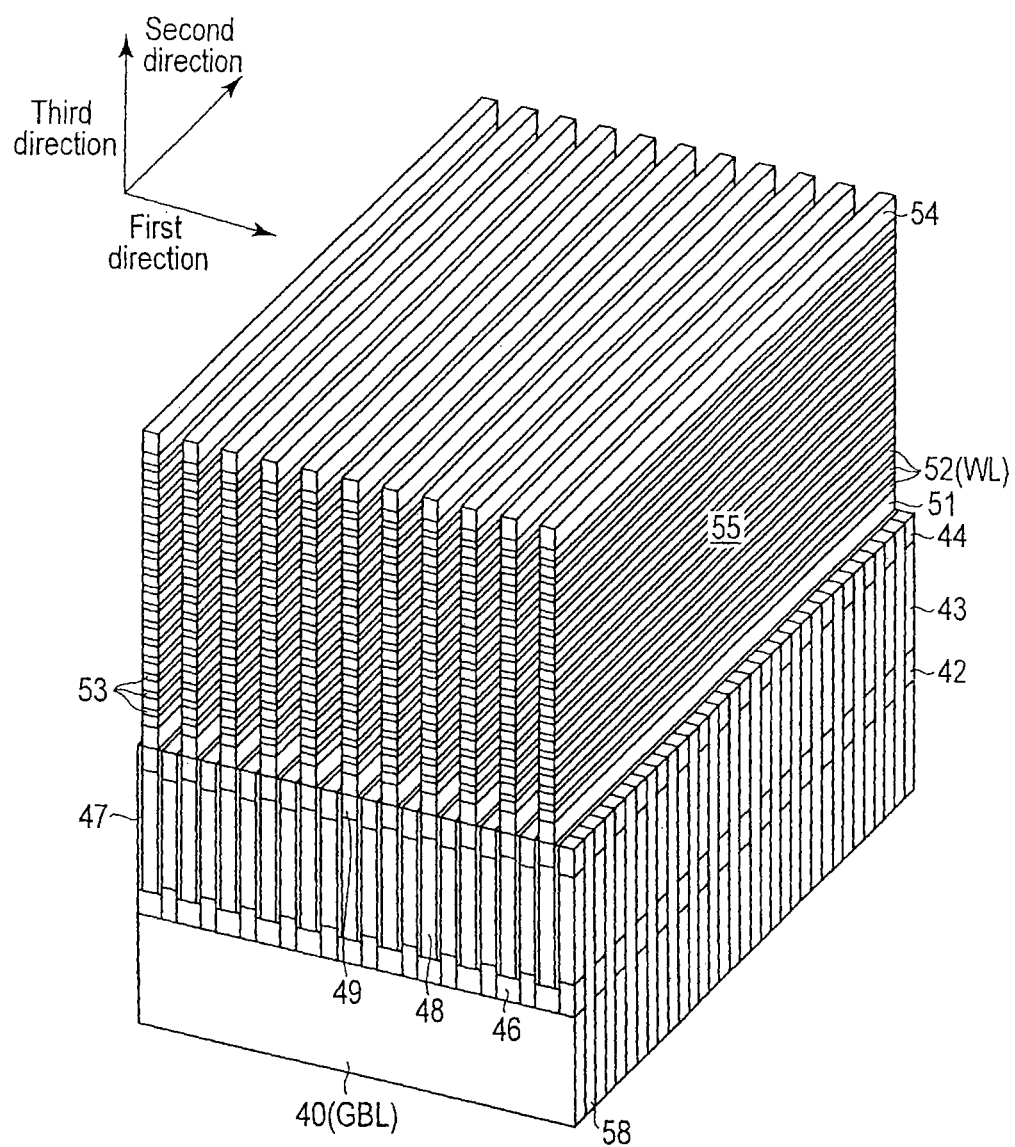
F I G. 52

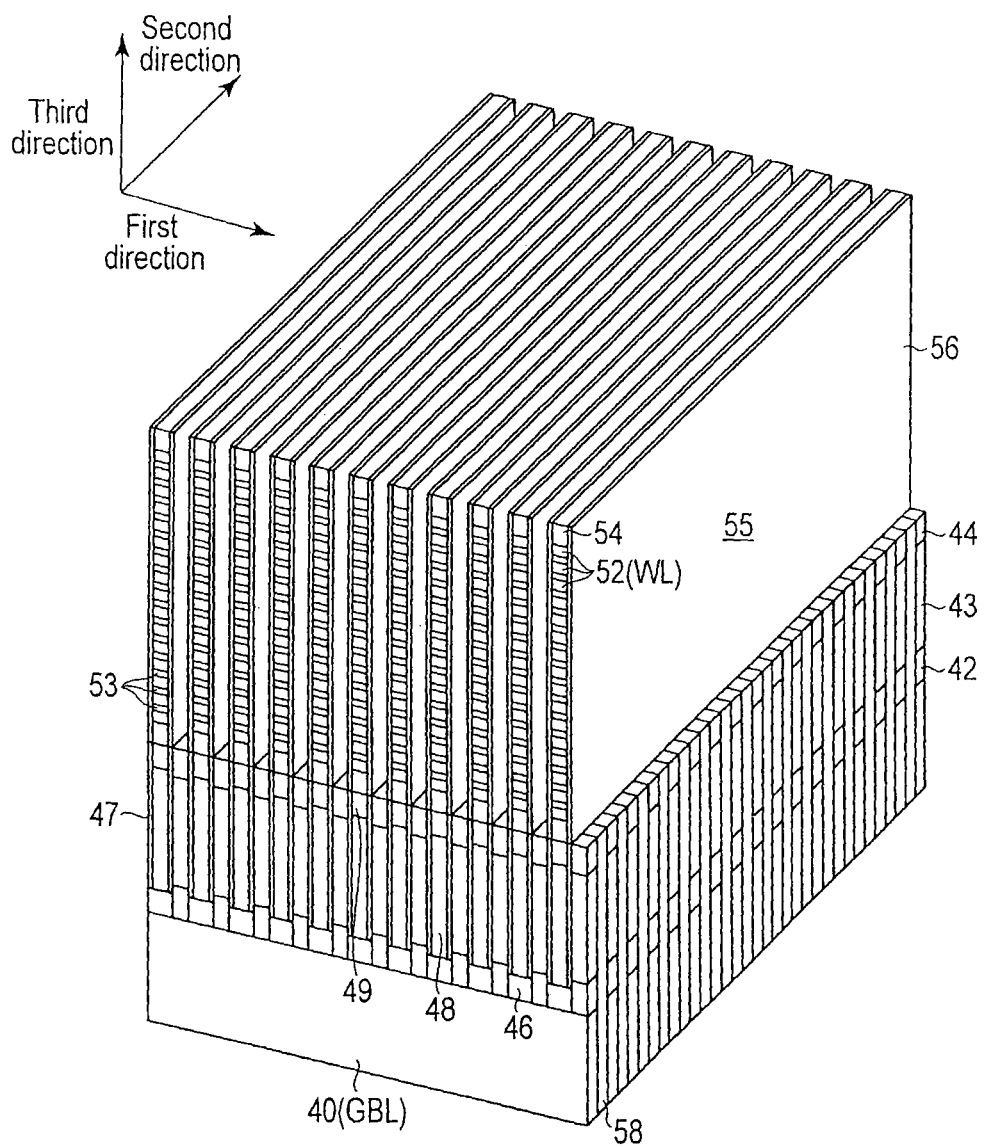
F I G. 53

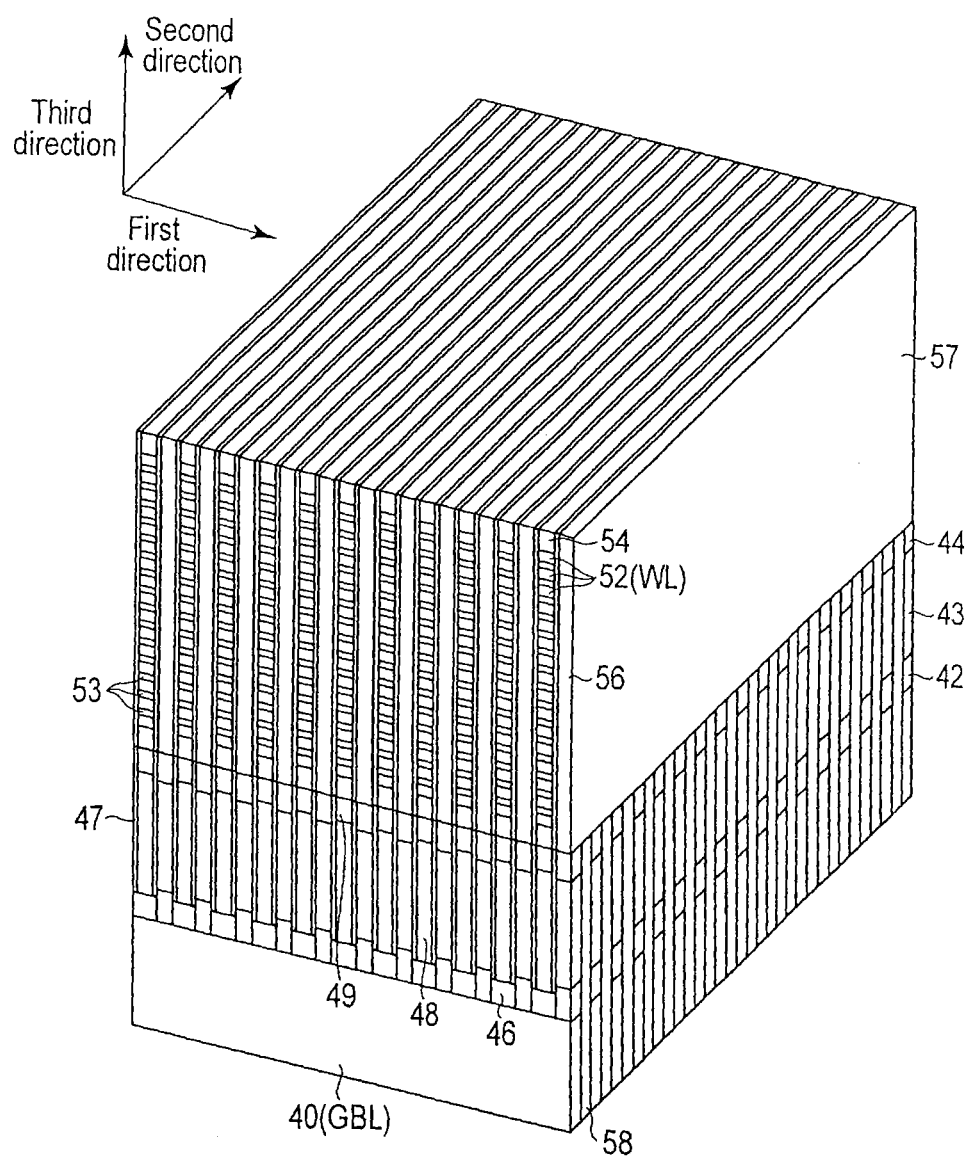
F I G. 54

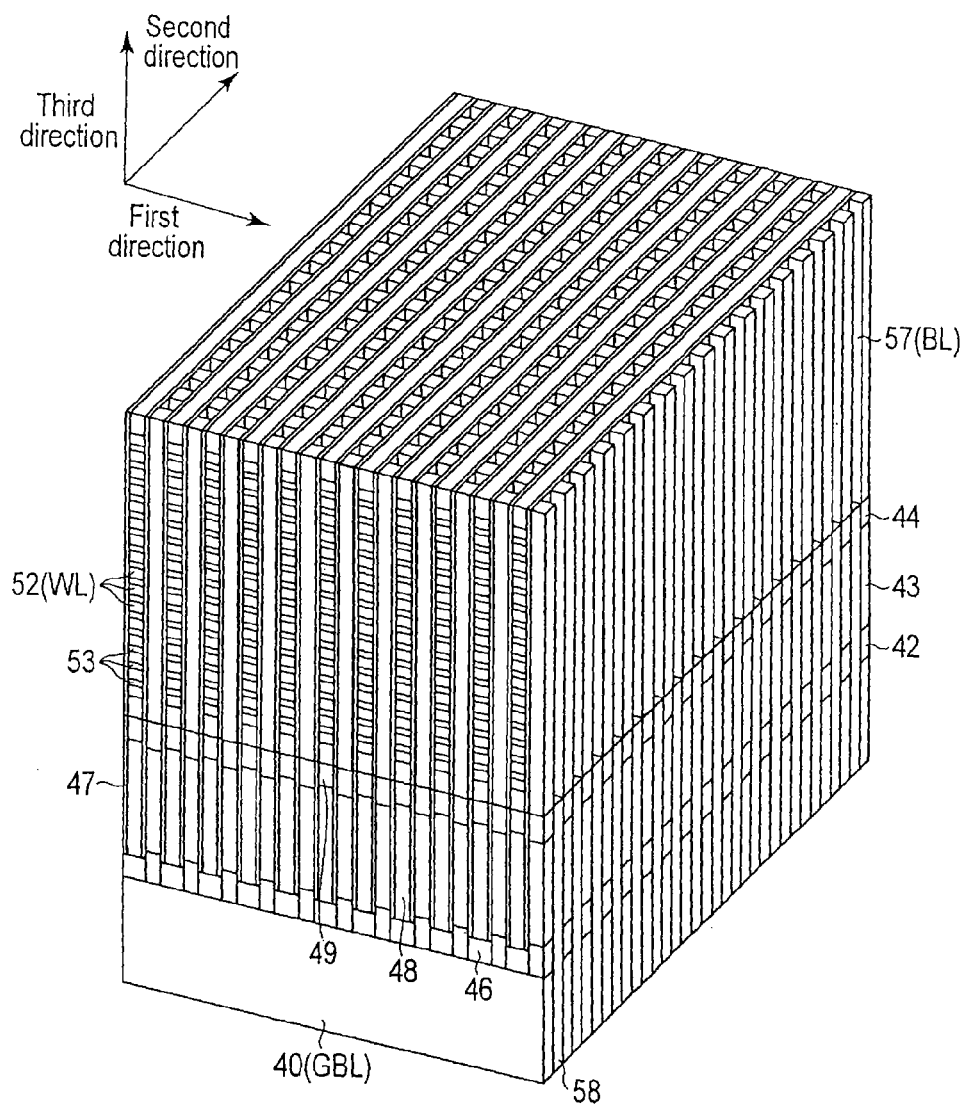
F I G. 55

MEMORY DEVICE AND METHOD OF CONTROLLING MEMORY DEVICE

CROSS REFERENCE TO RELATED APPLICATIONS

This application is a continuation of U.S. Ser. No. 14/282,047 (now U.S. Pat. No. 9,129,677), filed May 20, 2014 which claims the benefit of priority of U.S. Provisional Application No. 61/909,033, filed Nov. 26, 2013, the entire contents of both of which are incorporated herein by reference.

FIELD

Embodiments described herein relate generally to a memory device and a method of controlling a memory device.

BACKGROUND

In recent years, a memory called a ReRAM (Resistive RAM), in which memory cells are formed of a resistance change material, has been proposed. It is expected that memory cells of the ReRAM can realize a higher integration than in the conventional trend.

BRIEF DESCRIPTION OF THE DRAWINGS

FIG. 2 is an example of a perspective view of a memory cell array.

FIG. 4 is an example of a partial cross-sectional view of the memory cell array.

FIG. 10 is an example of a flowchart relating to a first embodiment.

FIG. 11 is an example of a waveform diagram of a SET operation relating to the first embodiment.

FIG. 12 to FIG. 16 illustrate bias examples at a time of the SET operation.

FIG. 19 to FIG. 23 illustrate bias examples at a time of the RESET operation.

FIG. 26 is an example of a waveform diagram of a RESET operation relating to Modification 1.

FIG. 31 illustrates an example of sheet selector select release at a time of the RESET operation relating to Modification 2.

FIG. 36A is an example of a flowchart relating to a second embodiment.

FIG. 36B is an example of a flowchart relating to the second embodiment.

FIG. 41 and FIG. 42 illustrate bias examples at a time of the RESET operation relating to the second embodiment.

FIG. 44 to FIG. 55 are examples of perspective views illustrating a manufacturing method relating to a third embodiment.

DETAILED DESCRIPTION

Figure 1:
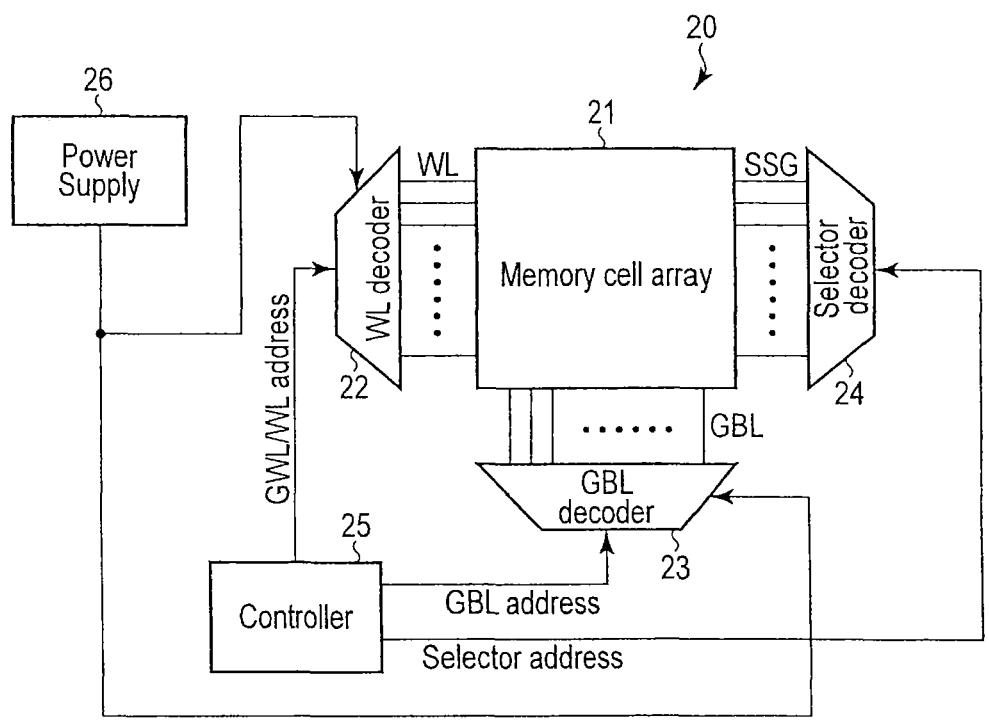
FIG. 1 is an example of a block diagram of a memory device.

In general, according to one embodiment, a memory device includes:

a plurality of global column lines arranged in parallel and extending in a first direction;

a plurality of row lines extending in a second direction which is perpendicular to the first direction;

a plurality of column lines in a two-dimensional arrangement, which extend in a third direction which is perpendicular to the first direction and the second direction;

a memory cell array including a plurality of memory cell each including a resistance change material, the memory cells being arranged at intersections between the row lines and the column lines;

a plurality of sheet selectors disposed between the global column lines and the column lines; and a controller configured to control the global column lines, the row lines, the column lines, the memory cells and the sheet selectors, the plurality of sheet selectors each comprising:

a first transistor including a channel region, a first insulation layer formed on a first side surface of the channel region, and a first select gate line extending in the second direction and formed on the first insulation layer in the first direction; and a second transistor including a channel region, a second insulation layer formed on a second side surface of the channel region, which is opposed to the first side surface in the first direction, and a second select gate line extending in the second direction and formed on the second insulation layer in the first direction, and the controller being configured, at a time of storing or easing data in the memory cell array, to execute:

selecting the global column line, the row line and the select gate line in order to select the memory cell;

applying a select row line voltage to a selected row line of the plurality of row lines;

applying a non-select row line voltage to a non-selected row line of the plurality of row lines;

applying a select global column line voltage to a selected global column line of the plurality of global column lines;

applying a non-select global column line voltage to a non-selected global column line of the plurality of global column lines;

applying a non-select selector voltage to the first and second select gate lines;

applying a first select selector voltage to the first select gate line of the first and second transistors of a selected sheet selector of the plurality of sheet selectors; and applying, after passage of a first time after the applying of the first select selector voltage, a second select selector voltage to the second select gate line of the selected sheet selector.

Hereinafter, embodiments will be described with reference to the accompanying drawings. In the description below, structural elements having substantially the same functions and structures are denoted by like reference signs, and an overlapping description is given only where necessary. In addition, embodiments to be described below illustrate, by way of example, devices or methods for embodying technical concepts of the embodiments, and the technical concepts of the embodiments do not specifically restrict the material, shape, structure, arrangement, etc. of structural components to those described below. Various changes may be made in the technical concepts of the embodiments within the scope of the claims.

First Embodiment

Whole Structure of Memory Device

To begin with, referring to FIG. 1, a memory device relating to a first embodiment is schematically described. FIG. 1 is an example of a block diagram illustrating the basic entire structure of the memory device.

As illustrated in FIG. 1, a memory device 20 includes a memory cell array 21, a WL decoder 22, a GBL decoder 23, a selector decoder 24, a controller 25, and a power supply 26.

In the memory cell array 21, as will be described later, memory cells (not shown) including variable resistance elements (not shown) are arranged in a matrix. In the memory cell MC, one end of the variable resistance element is connected to any one of bit lines BL (BL0, BL1, . . . ), and the other end thereof is connected to any one of word line combs WLcomb (WLcomb_a, WLcomb_b).

The WL decoder 22 includes a word line selector and a word line driver. The word line selector selects a word line WL, based on a WL address which has been received from the controller 25. The word line driver can apply voltages, which are necessary for data read, write and erase, to a selected word line and a non-selected word line.

The GBL decoder 23 includes a global bit line selector and a global bit line driver. The global bit line selector selects a global bit line GBL, based on a column address which has been received from the controller 25. The global bit line driver can apply voltages, which are necessary for data read, write and erase, to a selected global bit line and a non-selected global bit line.

The selector decoder 24 includes a selector select module and a select gate line driver. The selector select module selects a select gate line SSG, based on a sheet address which has been received from the controller 25. The select gate line driver can apply voltages, which are necessary for data read, write and erase, to a selected select gate line and a non-selected select gate line.

The controller 25 controls the entire operation of the memory device 20. In addition, the controller 25 can send a row address to the WL decoder 22, send a column address (GBL address) to the GBL decoder 23, and send a selector address to the selector decoder 24.

In addition, the controller 25 can instruct, at a time of data write, the WL decoder 22, GBL decoder 23 and selector decoder 24 to apply necessary voltages, thereby to change the resistance state of the variable resistance element of a selected memory cell MC.

At a time of data read, the controller 25 can instruct the WL decoder 22, GBL decoder 23 and selector decoder 24 to apply necessary voltages, thereby to detect a resistance value of the variable resistance element of a selected memory cell MC as a memory state of the memory cell MC.

Further, the controller 25 includes a sense amplifier, and can sense (amplify), by this sense amplifier, data which has been read out to the global bit line GBL.

The power supply 26 generates a voltage set which is necessary for data read, write and erase. The voltages generated by the power supply 26 are applied to the word lines WL and bit lines BL.

For example, at a time of data write, a large potential difference is produced between a selected word line and a selected bit line, and the resistance state of the variable resistance element is transitioned. In addition, at a time of data read, a potential difference is produced between a selected word line and a selected bit line within such a range that no transition occurs in the resistance state, and a current flowing in the bit line or word line can be detected.

<Memory Cell Array>

Figure 3:
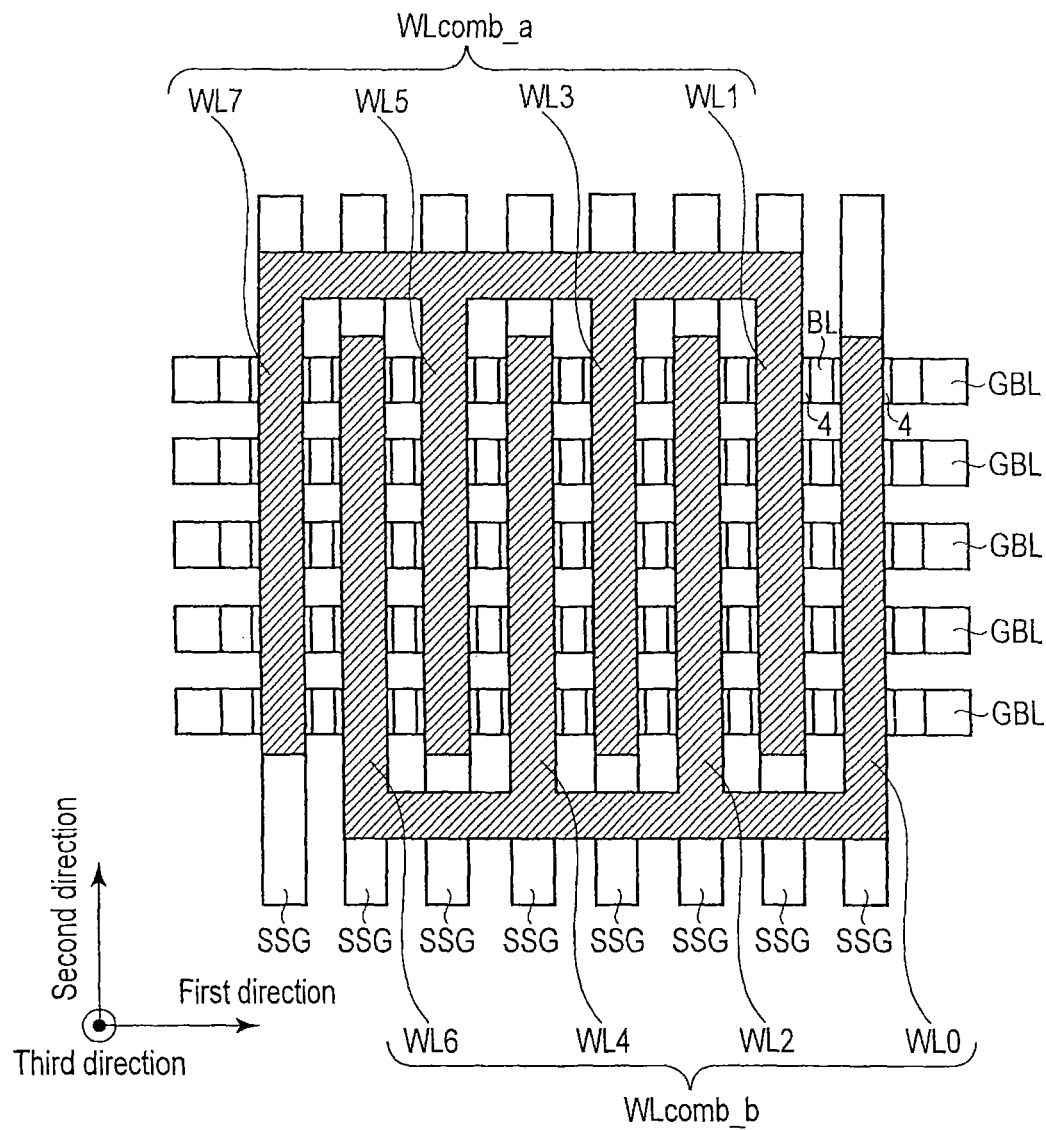
FIG. 3 is an example of a plan view of the memory cell array.
Figure 5:
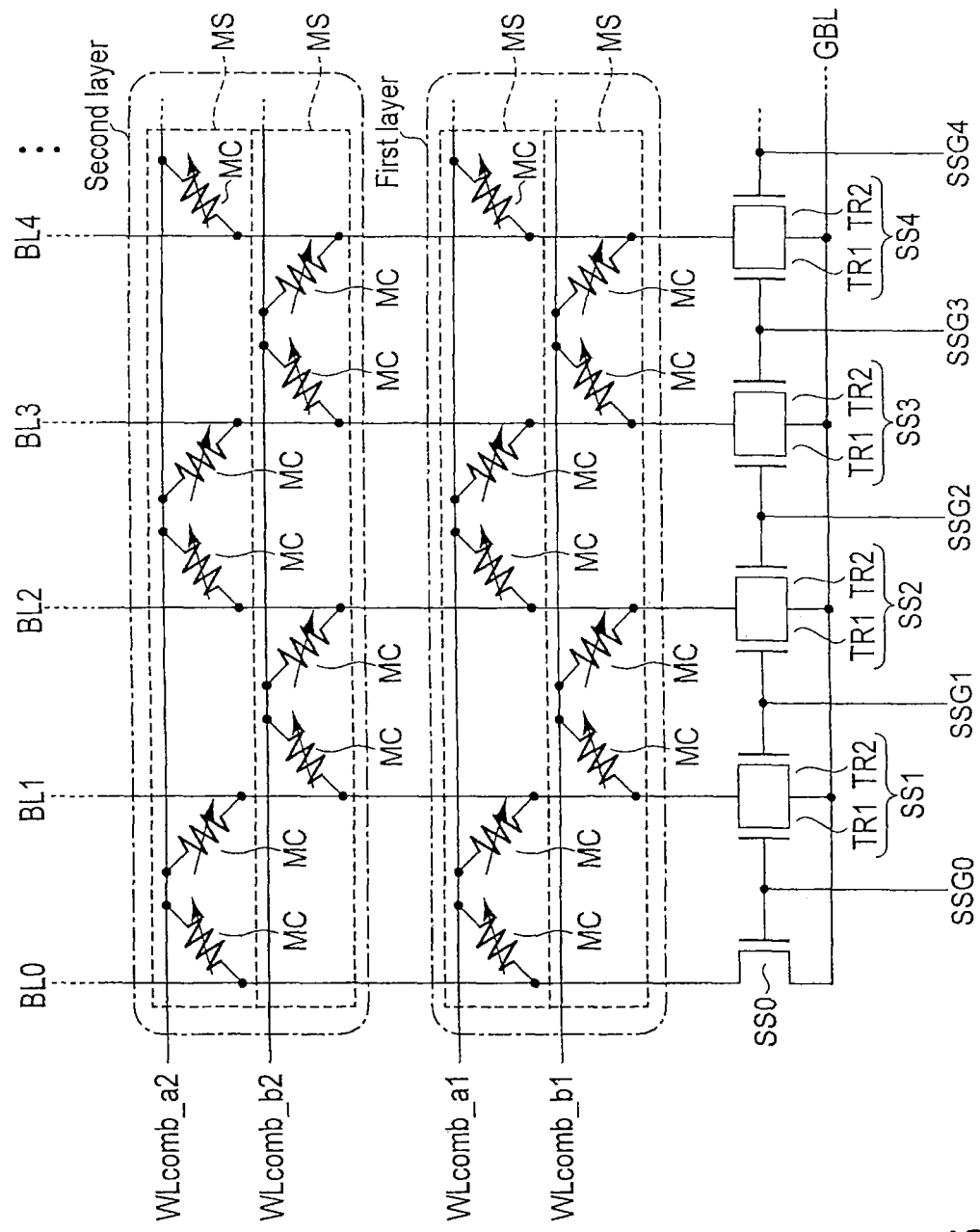
FIG. 5 is an example of a circuit diagram of the memory cell array.

Next, the memory cell array relating to the first embodiment is described with reference to FIG. 2 to FIG. 5. FIG. 2 illustrates an example of the memory cell array. FIG. 3 is a layout in a plane defined by a first direction and a second direction in FIG. 2, and is, in particular, a view for describing a plan-view pattern of word lines WL. FIG. 3 illustrates a pattern of word lines WL in one layer of a plurality of layers in FIG. 2. In FIG. 3, areas indicated by hatching represent a layout of word lines WL. FIG. 4 illustrates an example of a partial cross-sectional view of the memory cell array and an equivalent circuit thereof. FIG. 4 illustrates a partial cross section in a plane defined by the first direction and a third direction in FIG. 2. FIG. 5 illustrates an equivalent circuit of the memory cell array 21.

As illustrated in FIG. 2, in the memory cell array, a plurality of global column lines 1, row lines 2 and column lines 3 are included. The plural global column lines 1 are formed in parallel along the first direction, and are disposed, for example, in a lowermost layer of the memory cell array. The plural row lines 2 are formed in parallel along the second direction which is perpendicular to the first direction, and are provided at a higher position than the global column lines 1 in the third direction which crosses the first and second directions. A plurality of layers (first layer, second layer, third layer, . . . in FIG. 1) of the plural row lines are provided in the third direction (a direction normal to the plane in which the global column lines 1 are arranged).

The column lines 3 extend in the third direction between neighboring row lines 2, and the plural column lines 3 are disposed in the first and second directions. On end (lower end) of the column line 3 is electrically connected to any one of the global column lines 1. To be more specific, the column lines 3, which are arranged in the same column in the first direction in a two-dimensional plane defined by the first direction and second direction, are electrically connected to the same global column line 1.

A memory cell MC including a variable resistance element is formed between each row line 2 and column line 3. In this example, a resistance change material 4 is formed on the entirety of a side surface (facing the row line 2) of the column line 3. That part of the resistance change material 4, which is disposed between the column line 3 and row line 2, functions as a memory cell MC.

In the meantime, the resistance change material 4 in this example is provided on two side surfaces (two side surfaces facing the row lines 2) which are opposed to each other in the first direction, these two side surfaces being one of two pairs of opposed side surfaces of the bit line 3. The resistance change material 4 is not provided on the two side surfaces (two side surfaces not facing the row lines 2) which are opposed to each other in the second direction.

A sheet selector (select element) SS is provided between the global column line 1 and the associated column line. The sheet selector SS is, for example, an FET (Field Effect Transistor). There is a case in which this FET is called "select FET". In this case, the sheet selector SS includes a source region 5 which is formed on the global column line 1, a semiconductor layer (channel region) 6 which is formed on the source region 5, and a drain region 7 which is formed on the semiconductor layer 6. The semiconductor layer 6 is, for example, a silicon layer.

In addition, a select gate line (a select gate electrode of the select FET) 8 extending in the second direction is formed between neighboring semiconductor layers 6. The select gate line 8 is disposed in parallel to the row line 2. Further, a gate insulation layer 9 is formed between the select gate line 8 and the semiconductor layer 6.

Incidentally, like an ordinary MOS-type memory device, there is a case in which the global column line 1, row line 2 and column line 3 are referred to as a global bit line GBL, word line WL and bit line BL, respectively.

The word "sheet" means a set of memory cells which are selected by any one of the select gate lines 8. In FIG. 2, a set of memory cells in a plane defined by the second direction and third direction is the sheet.

As illustrated in FIG. 3, every other word line WL in one layer is commonly connected. In other words, the memory cell array includes two sets of word lines WL, each of the two sets having a comb-shaped structure. Linear regions of the word lines WL in the second direction alternately belong to either of the comb-shaped structures.

Further, the present structure may be described in another way as follows. When a plurality of word lines WL are labeled as WL0, WL1, WL2, . . . , WL7 from the right side on the sheet of FIG. 3, an electrically identical voltage is applied to odd-numbered word lines WL1, WL3, . . . , WL7 (or these word lines are commonly connected). On the other hand, an electrically identical voltage is applied to even-numbered word lines WL0, WL2, . . . , WL6 (or these word lines are commonly connected). Different voltages are applicable between the odd-numbered word lines and the even-numbered word lines (or the odd-numbered word lines and the even-numbered word lines are separated).

In the description below, the set of odd-numbered word lines is referred to as a word line comb WLcomb_a, and the set of even-numbered word lines is referred to as a word line comb WLcomb_b. When both sets are not distinguished, the sets are simply referred to as a word line comb WLcomb.

In the meantime, FIG. 3 illustrates the case in which eight word lines, five global bit lines and 45 bit lines BL are included. However, this case is merely an example, and the numbers of these conductor lines are properly variable.

Next, as illustrated in FIG. 4, a source region 5, a channel region 6 and a drain region 7 for forming a sheet selector SS are successively stacked on one global bit line GBL. Gate insulation films 9 are formed on side surfaces of this stacked structure.

A select gate line 8 (SSG) is provided between the channel regions 6 which neighbor in the first direction. A select FET (e.g. MOS transistor), which becomes the sheet selector SS, is formed of the source region 5, channel region 6, drain region 7, gate insulation layer 9 and select gate line 8 (SSG).

Specifically, the sheet selector SS includes two gates connected to different select gate lines SSG, with respect to one set of the source region 5, channel region 6 and drain region 7. In other words, two select FETs are provided for one bit line BL, and these select FETs share the source region 5, channel region 6 and drain region 7 and have the gates connected to different select gate lines SSG. In addition, a plurality of sheet selectors SS, which are associated with different bit lines BL and neighbor in the first direction, share the gate (select gate line SSG).

A columnar bit line BL is formed on the drain region 7 of each sheet selector SS. A resistance change material 4 functioning as a memory cell MC is formed on side surfaces of the bit line BL. In addition, a word line WL is formed in a region between bit lines BL which neighbor in the first direction. The resistance change material 4 is formed by using, for instance, HfO as a material, such that the resistance change material 4 is put in contact with the bit line BL and word line WL.

The resistance change material 4, which is typified by HfO, is a material which makes a transition between at least two resistance values of a low resistance state (LRS) and a high resistance state (HRS). The resistance change material in the high resistance state makes a transition to the low resistance state when a predetermined voltage or more is applied, and the resistance change material in the low resistance state makes a transition to the high resistance state when a predetermined current or more flows therein.

In particular, the resistance change material, which makes a transition from the high resistance state to low resistance state and a transition from the low resistance state to high resistance state by the application of voltages with different polarities, is called a bipolar operation element. The resistance change material 4, which performs such an operation, can be formed of, aside from HfO, a thin film including at least one of $TiO_2$, $ZnMn_2O_4$, NiO, $SrZrO_3$, $Pr_{0.7}Ca_{0.3}MnO_3$, carbon, etc.

In addition, as the resistance change material 4, use may be made of Si in a polycrystalline or amorphous state, or Ge, SiGe, GaAs, InP, GaP, GaInAsP, GaN, SiC, SiO, SiON, SiN, HfSiO, AlO, etc. Further, as the resistance change material 4, a multilayer film of the above-described materials may be used. Besides, an electrode of, for example, Ag, Au, Ti, Ni, Co, Al, Fe, Cr, Cu, W, Hf, Ta, Pt, Ru, Zr or Ir, or a nitride or a carbide thereof, may be disposed between the resistance change material 4 and bit line 3. As the electrode, a material in which the above-described material is added to polycrystalline silicon may also be used.

Thus, memory cells MC, each including the resistance change material 4 provided between the word line WL and bit line BL, are disposed, for example, in a three-dimensional matrix. In this structure, the word lines WL and bit lines BL have a simple line & space pattern. It should suffice if the word lines WL and bit lines BL have a positional relationship of mutual crossing, and there is no need to take into consideration a displacement in the word line direction and bit line direction.

Accordingly, the precision in alignment in the memory cells at the time of manufacture can be very relaxed, and the manufacture can easily be performed. In addition, this structure is a high-integration structure in which 1-bit information can be stored in a $2F^2$ area.

As illustrated in FIG. 5, memory cells MC, each including a variable resistance element (the resistance change material 4 in FIG. 2 and FIG. 4), are arranged in a matrix in the memory cell array 21. In the memory cell MC, one end of the variable resistance element is connected to any one of the bit lines BL (BL0, BL1, . . . ), and the other end thereof is connected to any one of the word line combs WLcomb (WLcomb_a, WLcomb_b).

Incidentally, in FIG. 5, the word line combs WLcomb_a and WL comb_b are expressed by WLcomb_ai and WL comb_bi, respectively, and "i" indicates the number of the layer in which the associated word line comb is formed ("i" indicates the numeral position in the order of layers; the first layer is i=1, the second layer is i=2, and so on).

Each bit line BL is connected to the corresponding global bit line GBL via the corresponding sheet selector SS (SS0, SS1, SS2, . . . ). Further, the gates of neighboring sheet selectors SS are connected to a common select gate line SSGj (j is a natural number). The sheet selector SS can be regarded as a set of two parallel-connected select FETs TR1 and TR2, which share the source and drain.

The gate of one (e.g. TR1) of two select FETs, which constitute a certain sheet selector SS, is made common to the gate of one (e.g. TR2) of two select FETs, which constitute a neighboring sheet selector SS.

In addition, the gate of the other (e.g. TR2) of two select FETs, which constitute a certain sheet selector SS, is made common to the gate of the other (e.g. TR1) of two select FETs, which constitute a neighboring sheet selector SS.

It should be note, however, that the sheet selector SS at the endmost position is composed of only the transistor TR1 or transistor TR2.

The three-dimensional multilayer-type memory cell array of FIG. 2 includes a plurality of structures shown in FIG. 5.

Specifically, FIG. 5 illustrates an example of a memory cell arrangement MS included in a two-dimensional plane defined by the first direction and third direction in FIG. 2. A plurality of these memory cell arrangements MS are disposed along the second direction. At this time, the word line combs WLcomb_ai, the word line combs WLcomb_bi and the select gate lines SSGj are commonly connected between the plural memory cell arrangements MS. Conversely, the bit lines BL and global bit lines GBL are separated between the memory cell arrangements MS.

<External Appearance of Memory Device>

Figures 6, 7:
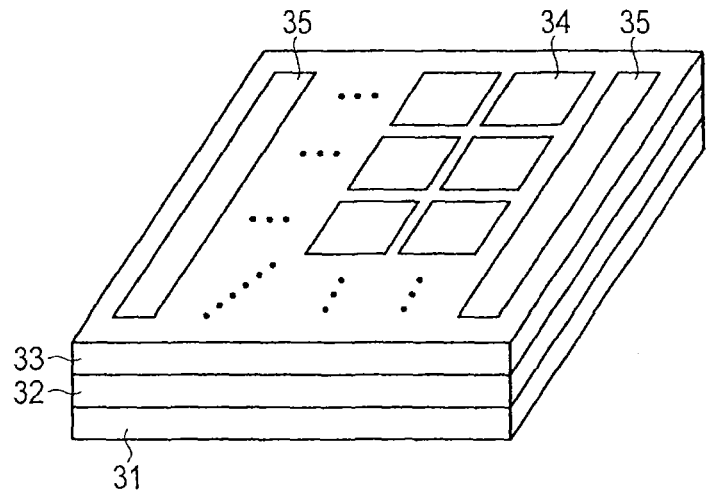
FIG. 6 is an example of an external appearance view of the memory device.
FIG. 7 is an example of a view illustrating a bias relationship at a time of an operation of the memory device.

Next, referring to FIG. 6, the external appearance of the memory device relating to the first embodiment is schematically described. FIG. 6 illustrates an example of the external appearance of the memory device.

As shown in FIG. 6, a CMOS circuit 32 including a wiring layer by a conventionally used process is formed on a semiconductor substrate (e.g. silicon substrate) 31. A layer 33 including a plurality of memory cell sections 34 is formed on the CMOS circuit 32. Each of the memory cell sections 34 in FIG. 6 corresponds to the memory cell array in FIG. 2, and wiring lines are formed, for example, based on a 20 nm design rule. In addition, a part, which is called a peripheral circuit in an ordinary memory and includes the decoders 22 to 24 and controller 25 shown in FIG. 1, is included in the CMOS circuit 32 in FIG. 6.

In the meantime, the CMOS circuit 32, excluding a connection part thereof with the memory cell sections 34, can be designed/fabricated, for example, based on a 100 nm design rule which is more relaxed than in the memory cell sections 34. The layer 33 includes an electrical connection part for connection to the CMOS circuit 32, at a periphery of each of the memory cell sections 34. Blocks, each including the memory cell section 34 and connection part as a unit, are arranged in a matrix.

Further, through-holes are formed in the layer 33, and input/output sections 35 of the present device, which include terminals with electrical couplings to input/output sections of the CMOS circuit 32 via these through-holes, can be formed, for example, at end portions of the layer 33.

On the other hand, since the memory cell sections 34 and the CMOS circuit 32 are coupled in a direction perpendicular to the substrate surface, the operation time can be shortened and the number of cells, which enable simultaneous read/write, can remarkably be increased, without an increase in chip area.

Incidentally, it is possible to form wiring lead-out pads on the input/output sections 35 of the device, and to perform bonding to a lead frame in a packaging process.

<Operation>

Figure 8:
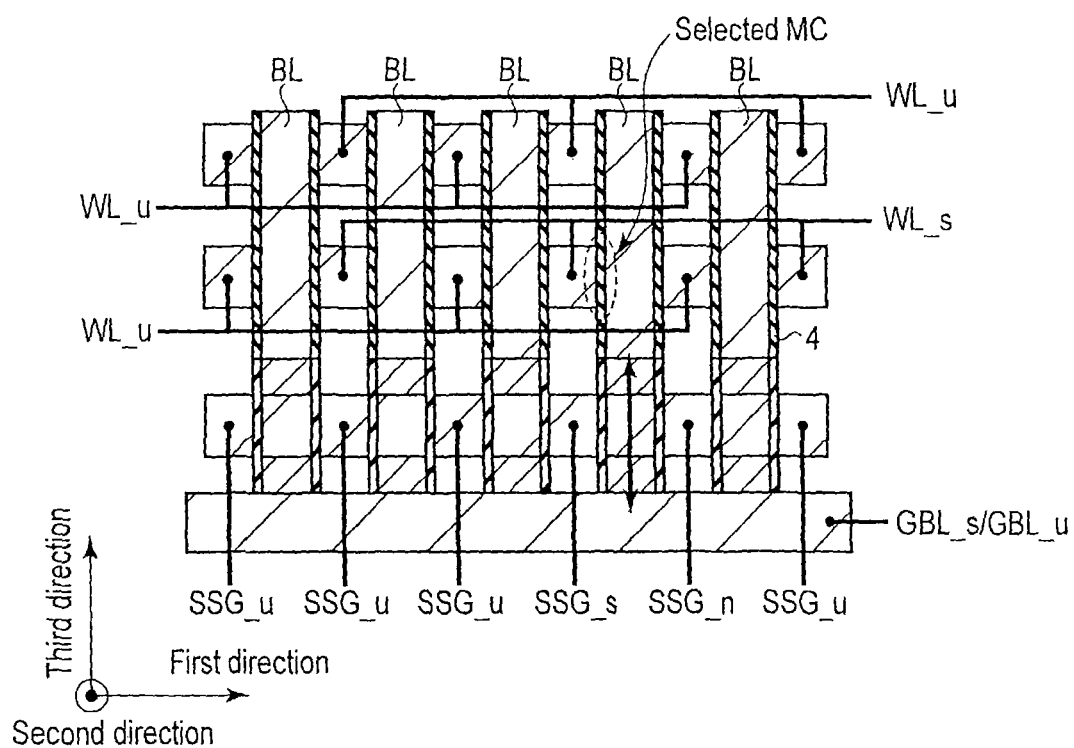
FIG. 8 is an example of a cross-sectional view of the memory cell array.

Next, referring to FIG. 7 and FIG. 8, a description is given of a basic operation of the memory device relating to the first embodiment.

FIG. 7 illustrates an example of a bias relationship at a time of an operation of the memory device. FIG. 8 is a schematic view illustrating a cross section of the memory device relating to the first embodiment, and a bias state of each part at a time of operation, and FIG. 8 shows a plane defined by the first direction and third direction in FIG. 2.

In the description below, of the global bit lines GBL, a selected global bit line is labeled as GBL_s, and a non-selected global bit line is labeled as GBL_u. In addition, of the word lines WL, a selected word line is labeled as WL_s, and a non-selected word line is labeled as WL_u. Furthermore, of the select gate lines SSG, two select gate lines SSG corresponding to the bit lines BL, to which the selected memory cell MC is connected, are selected, and these are labeled as SSG_s and SSG_n. The other select gate lines SSG are not selected, and these are labeled as SSG_u.

Figure 9:
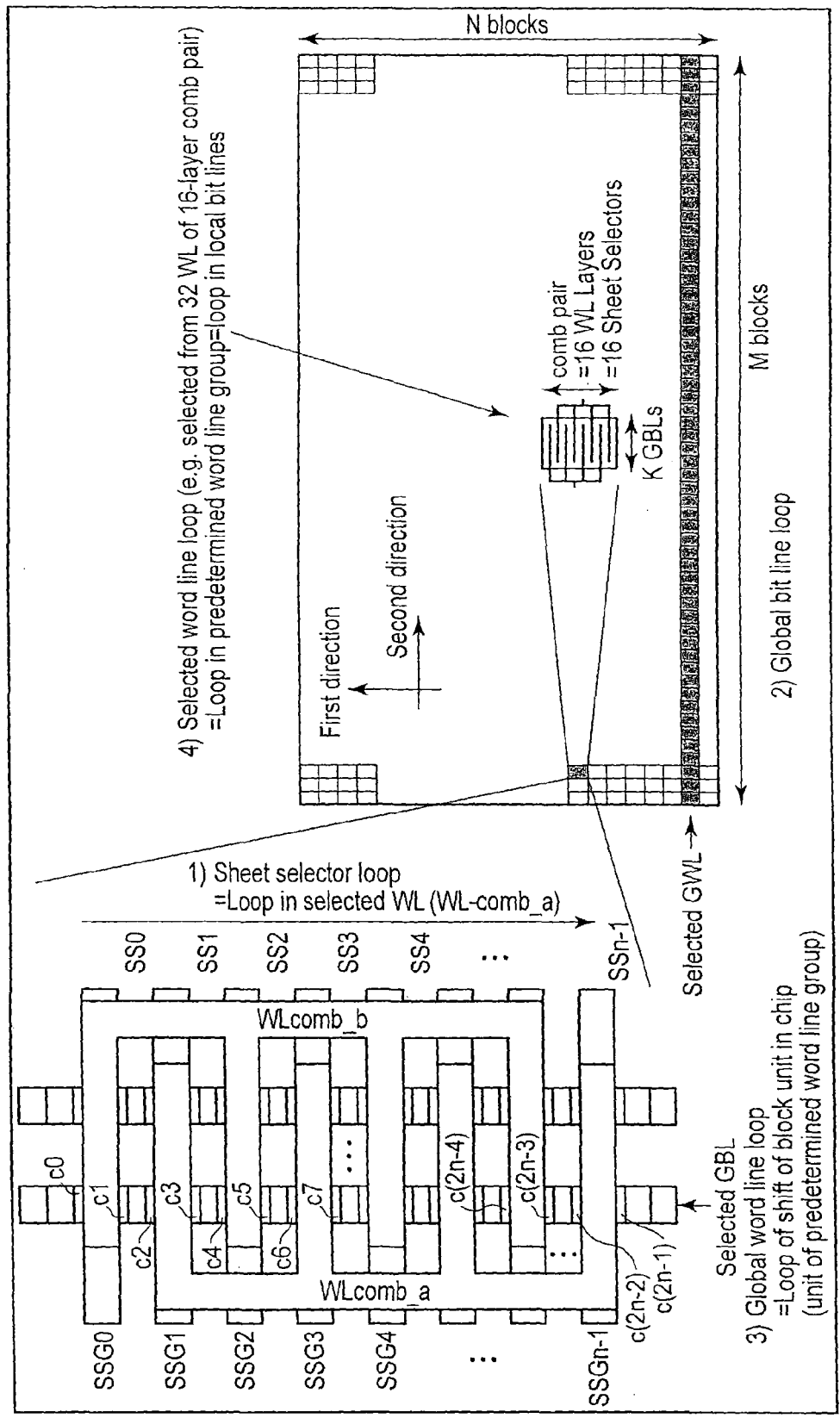
FIG. 9 illustrates an example of a block structure of the memory cell array.

FIG. 9 illustrates an example of a block structure of the memory cell array. As shown in a right part of FIG. 9, the memory cell array includes a plurality of blocks. In the example of FIG. 9, an N-number of blocks are disposed in a first direction, and an M-number of blocks are disposed in a second direction. In addition, global bit lines GBL are disposed in the second direction. One block has a structure as shown in a central part of FIG. 9.

In the first embodiment, selection of a block can be executed by two-dimensional decoding. Specifically, the control lines of word line WL drivers of blocks arranged in the second direction can be commonly selected by the global word line GWL, and the source lines of word line WL driver of blocks arranged in the first direction can be selected by a common source line.

One block includes, for example, a k-number of global bit lines GBL, and a p-number of word line layers. In addition, one block includes two word line combs WL comb per word line layer. In this case, n/2 word lines are connected per block, per word line comb and per global bit line. Specifically, an n-number of memory cells MC are connected per block, per n-number of word line comb and per global bit line GBL, and an n-number of sheet selectors SS are formed in order to select each memory cell MC. In this case, as illustrated in FIG. 9, a loop of successively selecting sheet selectors SS belonging to one word line comb is defined as "1) sheet selector loop". For example, sheet selectors belonging to WLcomb_a are sheet selectors SS0 to SSn−1. Similarly, sheet selectors belonging to WLcomb_b are sheet selectors SSn−1, SS0 to SSn−2. Specifically, when the word line WLcomb_a has been selected and sheet selectors SS have been successively selected in the order of SS0 to SSn−1, memory cells c2, c3, c6, c7, . . . , c2n−2, c2n−1 are selected. In addition, when the word line WLcomb_b has been selected and sheet selectors SS have been successively selected in the order of SSn−1, SS0 to SSn−2, memory cells c0, c1, c4, c5, . . . , c2n−4, c2n−3 are selected.

Besides, there are a global bit line loop for successively selecting one or plural global bit lines from a plurality of global bit lines GBL in a block, a global word line loop for selecting one or plural global word lines GWL from a plurality of global word lines GWL in a block, and a selected word line loop for selecting one or plural word lines from a plurality of word lines in a block.

<Write Operation>

At a time of a write operation (RESET operation) of storing information in a cell, the controller 25 applies a write voltage Vw (>0V) to a selected global bit line GBL_s, and applies a voltage Vwf (>0V) to a non-selected global bit line GBL_u and a non-selected word line WL_u, so that the cell voltage of a half-selected cell becomes half the voltage of the selected cell. In addition, in the state in which the selected word line WL_s and non-selected select gate line are at 0 V, the controller 25 applies a write select gate voltage Vg_w (>0V) to both select gate lines (SSG_s, SSG_n) of the sheet selector which is connected to the bit line that is directly connected to the selected cell, and executes write.

As a result, in the sheet selector SS connected to the selected bit line BL, a channel is formed by two select gate lines SSG_s and SSG_n, and a write voltage Vw is transferred from the GBL_s to the selected memory cell MC. On the other hand, 0 V is transferred from the WL_s to the selected memory cell MC.

In this manner, by the application of a potential difference of Vw to both ends of the variable resistance element of the memory cell MC, the resistance state of the memory cell MC transitions to the high resistance state. As a result, data is written in the memory cell.

Incidentally, at a time of select release of the sheet selector, since the selected gate line, selected global bit line and selected word line are set at non-select voltages, two voltages for the selected line are described.

<Erase Operation>

On the other hand, at a time of an erase operation (SET operation) of erasing information of a cell, the controller 25 applies a voltage, in which an offset voltage Vof (about 1 V) is added to an erase voltage Ves (>0 V), to the selected word line WL_s, taking it into account that the memory cell performs a bipolar operation, and applies a voltage, in which a voltage Vof is added to a voltage Vef, to a non-selected global bit line GBL_u and a non-selected word line WL_u, so that the cell voltage of a half-selected cell becomes half the voltage of the selected cell. In addition, in the state in which the voltage Vof is applied to the selected global bit line GBL_s and in which the non-selected select gate line is at 0 V, the controller 25 applies an erase select gate voltage Vg_e to both select gate lines (SSG_s, SSG_n) of the sheet selector which is connected to the bit line that is directly connected to the selected cell, and executes erase.

As a result, as has been described in connection with the time of the write operation, the voltage Ves is transferred to the selected memory cell MC. Then, by the application of a potential difference of Ves to both ends of the variable resistance element, the resistance state of the memory cell MC transitions to the low resistance state. As a result, data of the memory cell MC is erased.

The reason why the offset Vof of about 1 V is delivered to the global bit line and word line is as follows. In consideration of the characteristic of the sheet selector which will be described later, by setting the potential of the selected global bit line GBL_s at a value which is higher than the potential of the non-selected select gate line SSG_u by about 1 V, a leak current to the non-selected cell can be greatly reduced. In addition, in order to provide a predetermined potential difference by avoiding a negative voltage circuit which requires a relatively large circuit area, a method of increasing the voltages of the global bit lines and word lines as a whole is effective.

<Read Operation>

Furthermore, at a time of a read operation of reading out information of a cell, the control circuit 25 applies a voltage, in which an offset voltage Vo is added to a READ voltage Vr, to the selected global bit line GBL_s, non-selected global bit line GBL_u and non-selected word line WL_u. In addition, the controller 25 applies an offset voltage Vo to the selected word line WL_s. In this state, the select gate line voltage is controlled, and read is executed.

As a result, in the same manner as described in connection with the above-described write operation, the voltage Vr is transferred to the selected memory cell MC via the selected bit line BL. In this case, a current flowing in the selected memory cell MC varies depending on the resistance state (HRS or LRS) of the selected memory cell MC. For example, the data stored in the selected memory cell MC is discriminated by detecting the value of this current by the sense amplifier connected to the selected global bit line GBL_s.

Normally, the number of selected word lines WL_s is only one for a single memory cell array, but the number of selected global bit lines GBL_s may be plural at the same time. Thereby, since the number of bits, which can simultaneously be written/erased/read, increases, the band width can be improved.

Incidentally, at a time of select release of the sheet selector, since the selected gate line and selected word line are set at non-select voltages, two voltages for the selected line are described (since the voltages of the selected global bit line and non-selected global bit line are equal, the voltage may be only one).

The reason why the offset voltage is delivered to the global bit line and word line is as follows. Normally, immediately after write or erase of the element is executed, read of the element is executed, and it is confirmed whether the element has a desired resistance value. If the element has a resistance value outside the range of desired resistance values, additional write or erase is executed. Thus, if there is a large voltage difference between the write or erase operation bias condition and the read bias condition, and if an operation with a large voltage change at a node with a large parasitic capacitance is executed, there occurs an unnecessary increase in power consumption or a delay in operation time. In the present embodiment, since the parasitic capacitance of the global bit line is the greatest, it is preferable to execute such setting that this voltage is equalized as much as possible between the time of write or erase and the time of read. More preferably, since the number of non-selected global bit lines is greater than the number of selected global bit lines, the offset voltage Vo should preferably be set such that the voltage Vwf and the voltage Vr+Vo are substantially equal at the time of write and the voltage Vef+Vof and the voltage Vr+Vo are substantially equal at the time of erase, so that the potential of the non-selected global bit line may not greatly vary.

<Operation of Sheet Selector at Time of Large-Current Operation SET/RESET Operation>

There is a demand for a sheet selector SS which causes a large current (ON current) to flow to a selected bit line BL, and causes little current to flow to a non-selected bit line BL (OFF leak is small). At this time, in many cases, in a sheet selector SS using a MOS transistor which makes use of normal interface channel conduction, if an OFF leak is decreased, an ON current is also decreased.

This being the case, a description is given of an example in which a large-current operation is used, as an example for causing a large ON current to flow.

Next, referring to FIG. 10, a SET/RESET operation including a sheet selector large-current operation relating to the first embodiment is described. FIG. 10 is an example of a flowchart of the SET/RESET operation including the sheet selector large-current operation.

[Step S1]

To start with, the controller 25 applies a non-select voltage (e.g. 3.0 V) to all global word lines GWL and global bit lines GBL, and sets a standby state. Next, the controller 25 sets a GWL address for selecting a word line group. The controller 25 sets, for example, a selected global word line at a select global word line voltage. Incidentally, the controller 25 keeps the global word lines, other than the selected global word line, at a non-select voltage.

[Step S2]

Subsequently, the controller 25 sets a GBL address for a selected global bit line. The controller 25 sets, for example, a selected global bit line at a select global bit line voltage (e.g. 0.8 V). The controller 25 can also increase the speed by executing a parallel operation by simultaneously selecting a plurality of selected global bit lines.

[Step S3]

Next, the controller 25 sets a WL address for a selected word line. The controller 25 sets, for example, a selected word line at a select word line voltage, and sets non-selected word lines, other than the selected word line, at, e.g. 3.0 V as a non-select voltage (non-select word line voltage).

[Step S4]

Next, the controller 25 sets an address of a sheet selector SS relating to a selected cell. Then, in accordance with the address of the bit line that is selected, the controller 25 set a gate voltage of the sheet selector SS. The controller 25 applies, for example, 0 V to the gate electrode of a sheet selector SS which is not selected.

[Step S5]

The controller 25 applies a select gate voltage to the gate electrode (hereinafter also referred to as a first gate electrode or the like) of the transistor TR2 of, for example, a selected sheet selector SS, which is formed on the plane of the channel region 6 which is the same plane as the plane of the column line 3 to which the selected cell is connected.

[Step S6]

After the controller 25 has applied the select gate voltage to the first gate electrode of the transistor TR2 of the selected sheet selector SS, the controller 25 applies, after the passage of a first time (e.g. 50 nsec), a select gate voltage to the gate electrode (hereinafter also referred to as a second gate electrode or the like) of the transistor TR1 which is formed on the plane of the channel region 6 which is opposed, in the first direction, to the plane of the channel region 6 that is the same plane as the plane of the column line 3 to which the selected cell is connected.

[Step S7]

Then, after the passage of a target SET/RESET pulse time, the controller 25 operates the gate voltage and source-drain voltage of the sheet selector SS, as will be described later, and executes select release of the sheet selector SS.

[Step S8]

The controller 25 repeats steps S4 to S7 by the sheet selector address loop, and completes SET/RESET in the selected word line.

[Step S9]

The controller 25 repeats steps S3 to 8 by the word line loop in the word line group, and completes SET/RESET in the word line group.

[Step S10]

The controller 25 repeats steps S2 to 9 by the global bit line loop in the page range, and completes SET/RESET in the global bit lines in the page range.

[Step S11]

In addition, the controller 25, at last, confirms that the data in the page agrees with target data, and, for example, when the read data does not agree with planned write data, the controller 25 repeats the loop of steps S2 to S10 once again with respect to the disagreeing data.

[Step S12]

The controller 25 finally confirms that the data in the page agrees with target data, and then completes the SET/RESET operation.

In the present embodiment, the SET/RESET of data of a page unit as a file memory has been described, but the data unit may be some other data unit, such as a segment unit or a bit unit.

<Examples of Set Values of Voltages at SET Time>

Figure 15:
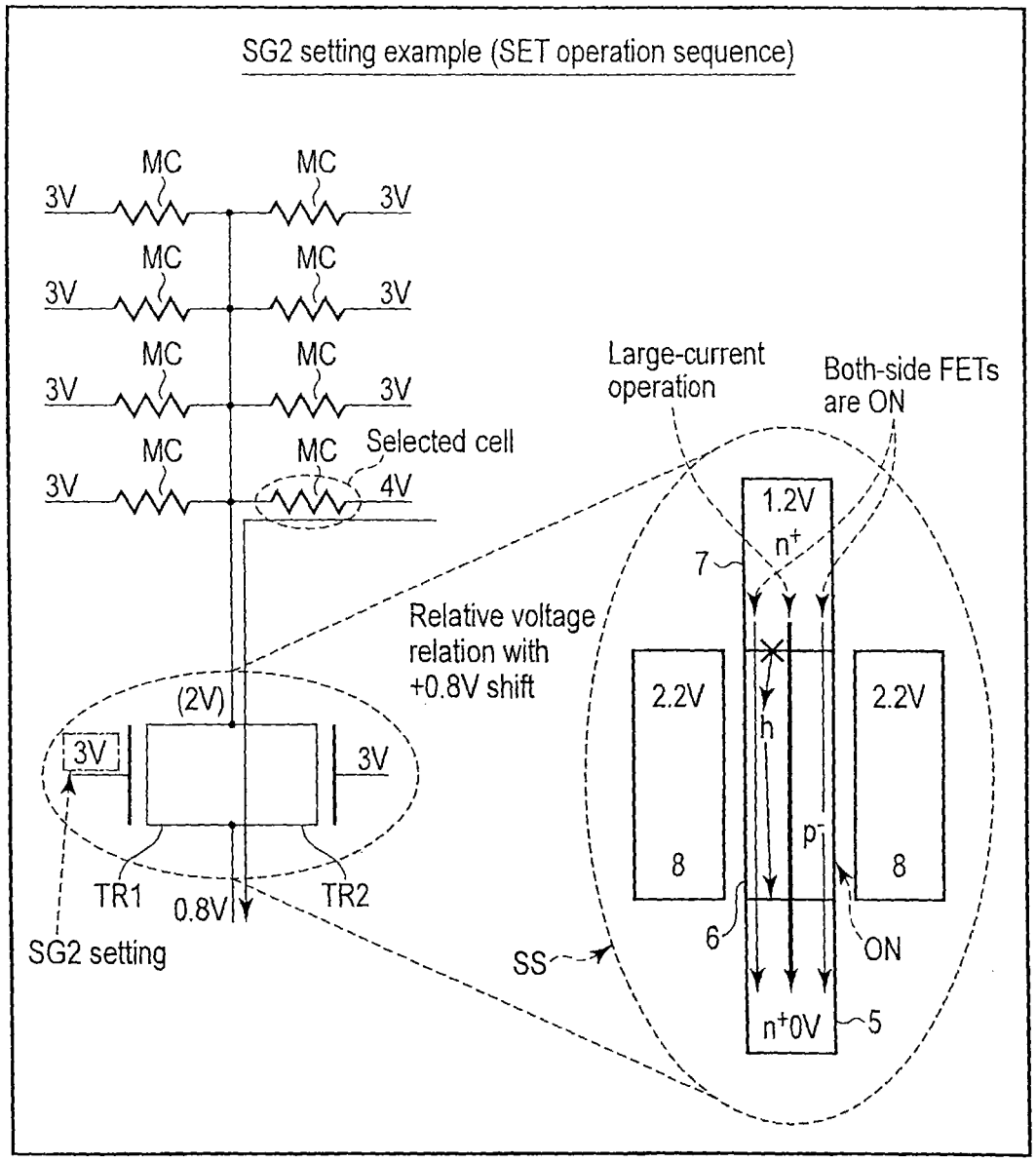
Figure 16:
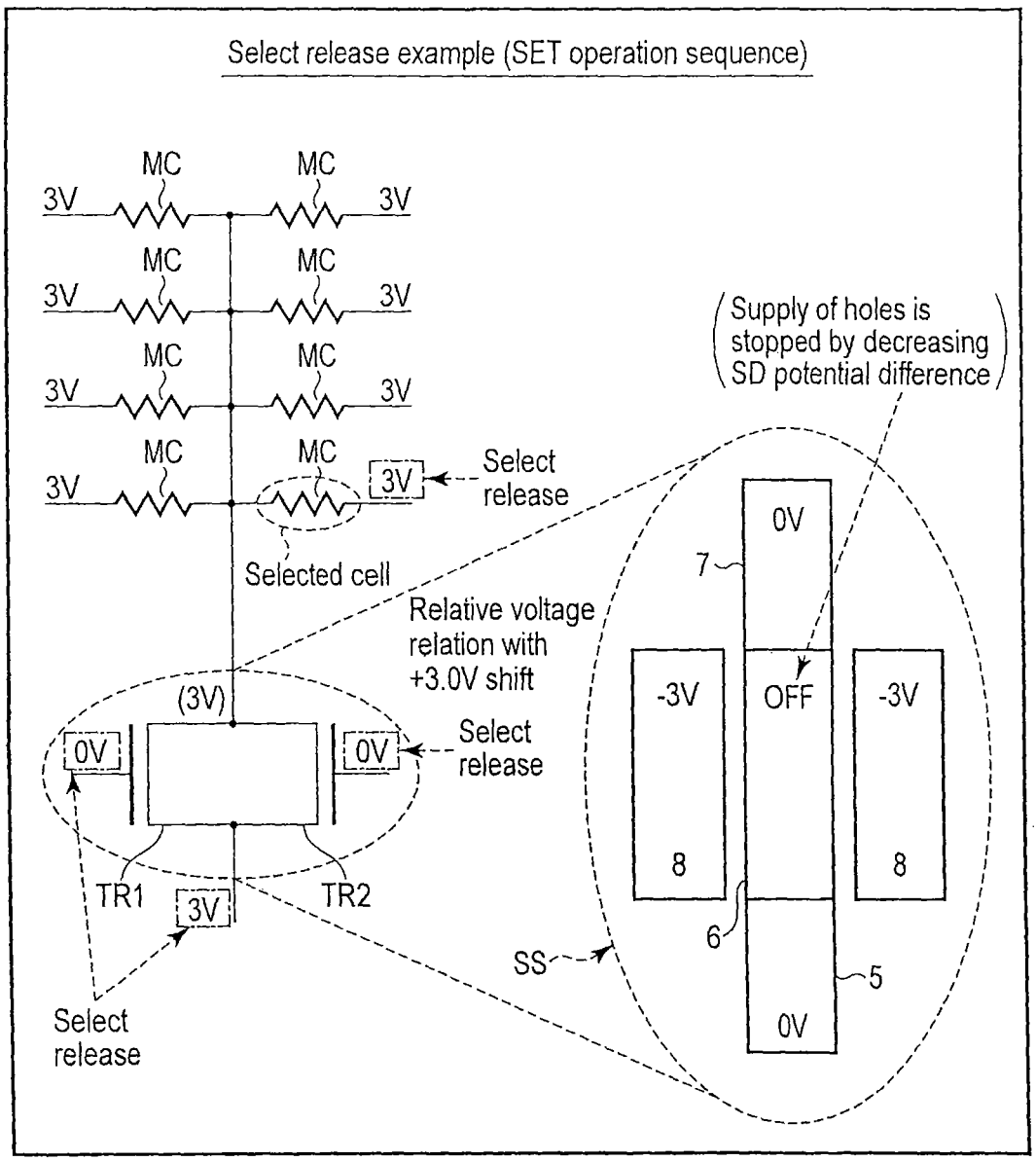
Figure 17:
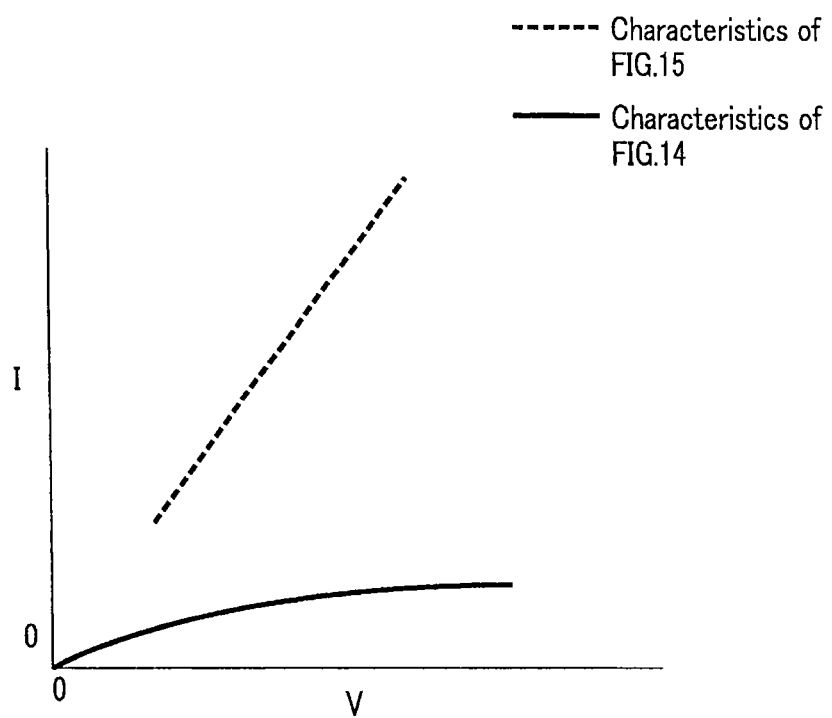
FIG. 17 is a graph which schematically illustrates I-V characteristics of FIG. 14 and FIG. 15.

Next, referring to FIG. 11 to FIG. 17, a description is given of more specific examples of set values of voltages at SET time, and a principle of start/release of a large-current operation by a series of processes. FIG. 11 illustrates an example of time dependency of a voltage at each node at a time when the SET operation is executed by the loop of FIG. 10, and FIG. 12 to FIG. 16 illustrate bias examples at the time of the SET operation. FIG. 17 is a graph which schematically represents I-V characteristics of FIG. 14 and FIG. 15.

FIG. 12 to FIG. 16 schematically illustrate, in enlarged scale, voltages and operation states relating to one sheet selector. Incidentally, in the schematic view of the sheet selector, the voltages as a whole are lowered for the purpose of convenience, and the source voltage is so set as to become, e.g. 0 V.

As illustrated in FIG. 11, when a selected cell is to be SET, the controller 25 applies pulses of a predetermined SET time length, by setting a voltage of a selected global bit line GBL_s at, e.g. 0.8 V, setting a voltage of a non-selected global bit line GBL_u at 3 V, setting a voltage of a selected word line WL_s at 4 V, setting a voltage of a non-selected word line WL_u at 3 V, and setting a voltage of a select gate line SSG relating to the selected cell at, e.g. 3 V.

Figure 12:
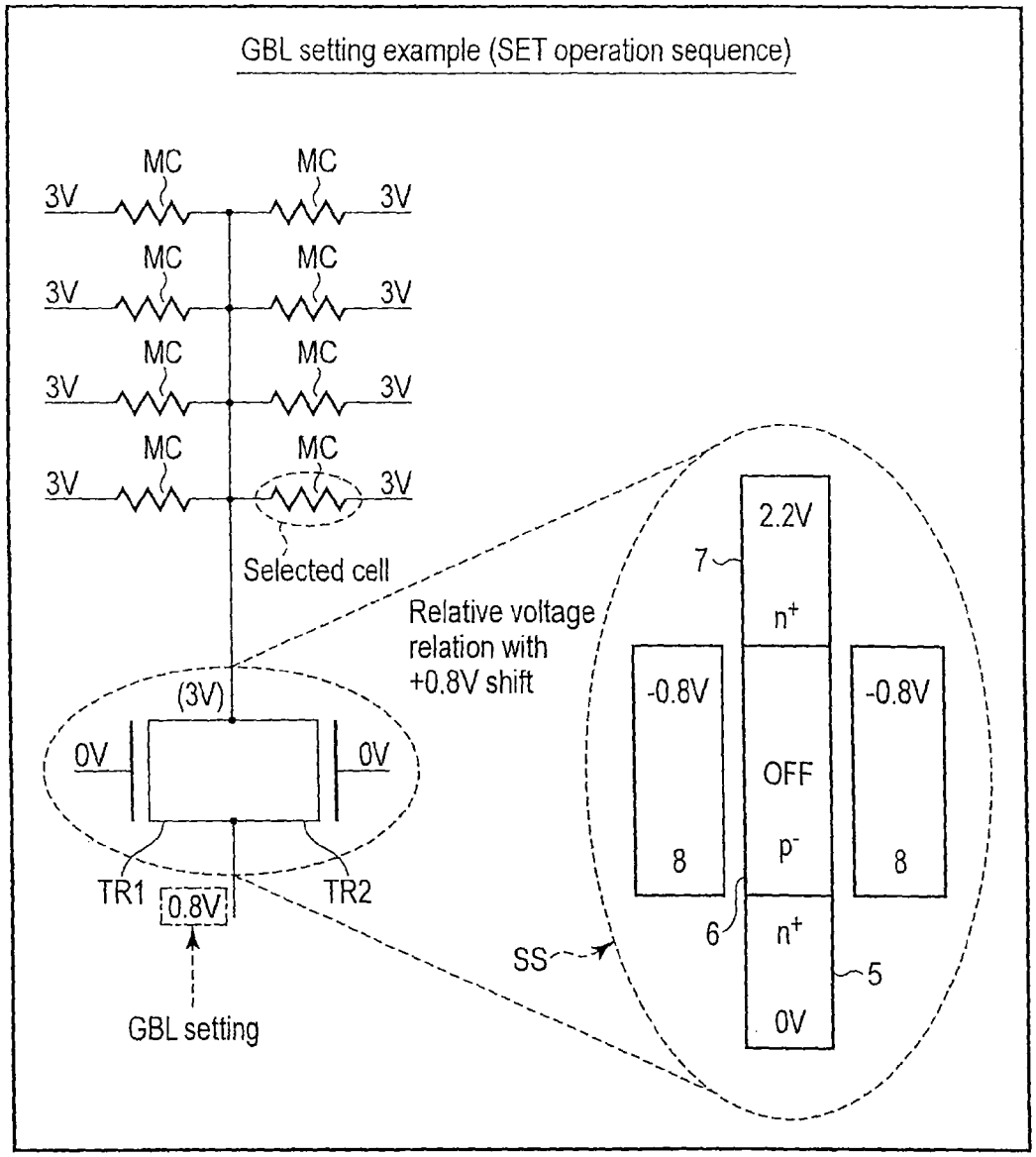

As shown in FIG. 11 and FIG. 12, at the stage of step S2 of FIG. 10, the controller 25 sets the voltage of the selected global bit line GBL_s at, e.g. 0.8 V, sets the voltage of the non-selected global bit line GBL_u at, e.g. 3 V, and sets the voltage of the non-selected word line WL_u at, e.g. 3 V. In this state, the sheet selector SS remains OFF state.

Figure 13:
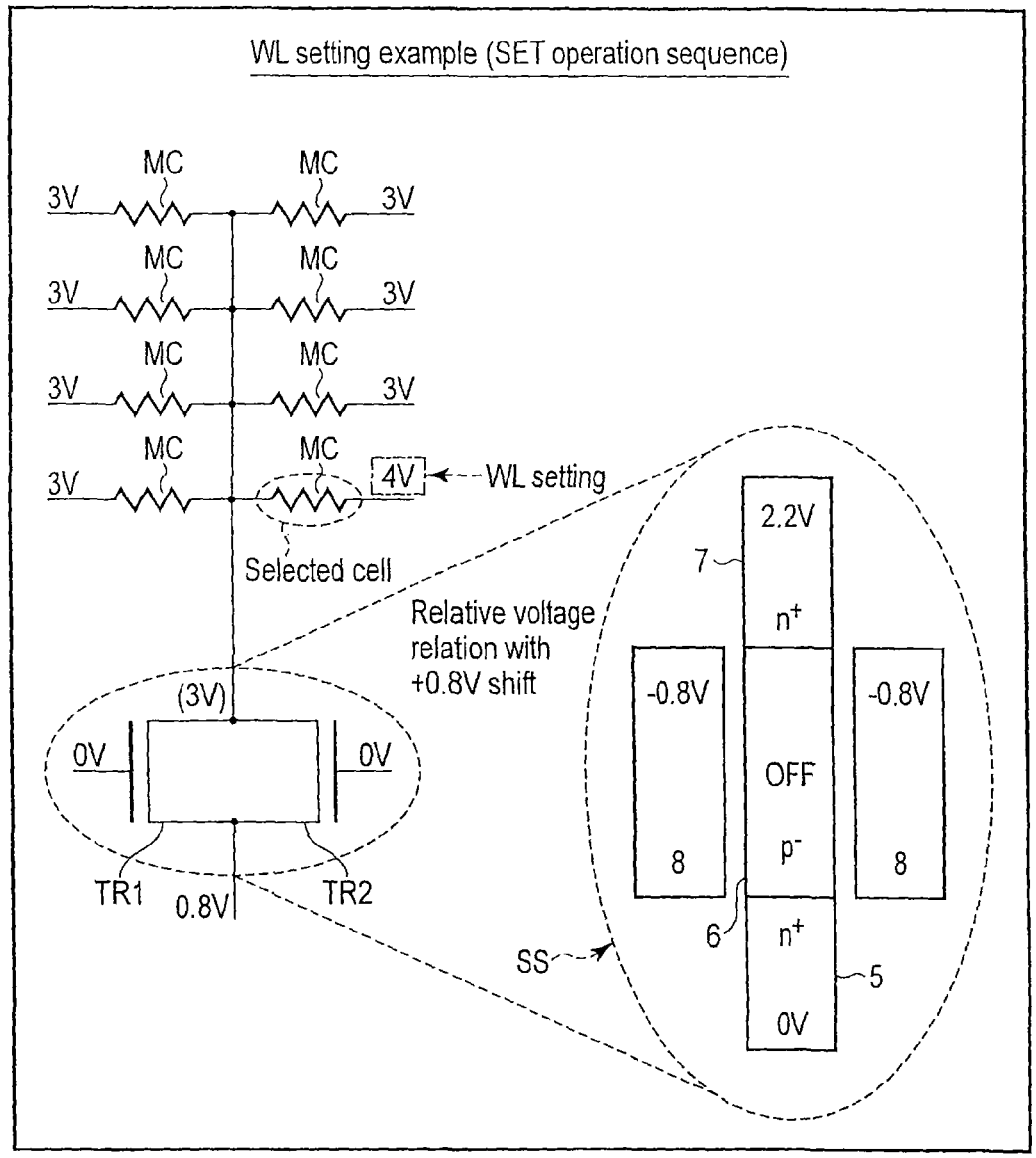

As illustrated in FIG. 11 and FIG. 13, at the stage of step S3 of FIG. 10, the controller 25 sets the voltage of the selected word line WL_s at, e.g. 4 V. In this state, too, the sheet selector SS remains OFF state.

As illustrated in FIG. 11 and FIG. 14, at the stage of step S5 of FIG. 10, the controller 25 sets the first gate of the transistor TR2 of the selected sheet selector, which is connected to the selected cell in the third direction, at, e.g. 3 V. At this stage, only the MOSFET interface channel on one side (transistor TR2 side) of the sheet selector is turned ON, and a current of a certain degree flows. However, since the voltage that is applied to the cell is sufficiently small and the current flowing in the selected cell is also sufficiently small, the resistance state of the selected cell is unchanged.

As described above, since only the channel of the one side is ON, the ON current is not enough, and the drain potential is in a relatively high state of, e.g. 1.8 V. As a result, at the drain end, the ratio of generation of holes by impact ionization increases. Then, the generated holes diffuse in the channel region 6 by the electric field at the drain end, and are accumulated in the vicinity of the opposite-side (transistor TR1 side) channel interface, which is at a relatively negative voltage (e.g. −0.8 V).

As shown in FIG. 11 and FIG. 15, at the stage of step S6 of FIG. 10, the controller 25 sets the second gate of the transistor TR1 at, e.g. 3 V. At this time, the transistor TR1 is opposed, in the first direction, to the transistor TR2 of the selected sheet selector connected to the selected cell in the third direction. At this stage, the sheet selector starts a large-current operation and, in addition to the current flowing in the left and right MOSFET interface channels, a bipolar current flowing near the center, other than the interface channel of the semiconductor layer 6, begins to flow. Thereby, since the controller 25 can supply a sufficient current to the selected cell and the drain voltage lowers, the selected cell voltage becomes a target value. Thus, the SET operation of the selected cell can be exactly realized.

The operation in FIG. 15 will now be described more specifically. If the controller 25 raises the left-side gate voltage to a positive from the state of FIG. 14, the holes accumulated near the left-side channel interface are released. In the case where a hole current due to the release of holes has a predetermined magnitude or more, a large-current operation is executed, and carriers (electrons, holes) flow in the vicinity of the center, other than the interface channel of the semiconductor layer 6. In a concrete example, in the case where the channel width is 20 nm, channel length is 250 nm and gate oxide film thickness is 5 nm, if a so-called substrate capacitance or fringe capacitance is added, an electrical charge amount of about $8e^{-17}C$ is released as holes, while the left-side gate voltage is raised from −0.8 V to 2.2 V. If the pulse rising time of the gate voltage is, for example, 10 nsec, a hole current of 8 nA occurs, which is enough to cause the element having a cross-sectional area of 20 nm×20 nm to perform a large-current operation (current density: 2000 A/cm$^2$).

In the meantime, a comparison is made between the time that is needed for accumulation of holes in the vicinity of the left-side channel interface and the rising time of the left-side gate voltage which is needed for release of holes and execution of a large-current operation. In this case, although the hole current in the vicinity of the left-side channel interface is smaller than the hole current of released holes and only a part of the hole current in the vicinity of the left-side channel interface is accumulated in the vicinity of the channel interface, the electrical charge amounts of both are substantially equal. Thus, there is a feature that the former time is longer than the latter time. Hence, there is a feature that a time difference (first time difference) from the setting of one gate voltage at a select voltage until the setting of the other gate voltage at a select voltage is longer than the rising time when the other gate voltage is set at the select voltage (see "Rising time" in FIG. 11).

Once a bipolar current begins to flow, a part of this increased current further causes impact ionization. Thus, enough holes are continuously supplied to the semiconductor layer 6, and the large-current operation is continued. If a bipolar current flowed excessively, the drain voltage would drop, and hence the impact ionization ratio would sharply decrease. Then, the supply of holes would be stopped, and the bipolar current would sharply decrease. However, before such a situation occurs, the drain voltage rises once again, the supply of holes by impact ionization is resumed, and the bipolar current is maintained. Specifically, since the bipolar current has such a mechanism that the bipolar current is automatically controlled within a range of predetermined values by self-feedback, there is an advantage that such an overcurrent as to cause device breakdown does not occur. In addition, since the large-current operation is not executed in an element in which only one gate voltage is selected, a selectivity ratio to a neighboring cell can be increased.

As illustrated in FIG. 11 and FIG. 16, at the stage of step S7 of FIG. 10, the controller 25 executes select release of the sheet selector. In this case, the controller 25 restores the voltage of the selected global bit line to the non-select voltage (e.g. 3 V), restores the voltage of the selected word line to the non-select voltage (e.g. 3 V), and sets both gate voltages of the sheet selector at, e.g. 0 V, thereby reducing the carriers flowing in the sheet selector to substantially zero.

In addition, as illustrated in FIG. 17, the I-V characteristics of the state of FIG. 14 simply become the I-V characteristics of a MOSFET. Incidentally, both the ordinate and abscissa are linear scales. In this case, if the large-current operation is executed and a transition occurs into the state of FIG. 15, a bipolar current, in addition to the MOSFET currents on both sides, flows as illustrated in FIG. 17, the I-V characteristics change into steep ones, and a high current can be obtained with a low voltage.

Thereby a sufficient current is supplied to the selected cell, and the SET operation of the selected cell can exactly be realized.

<Example of Set Values of Voltages at RESET Time>

Figure 18:
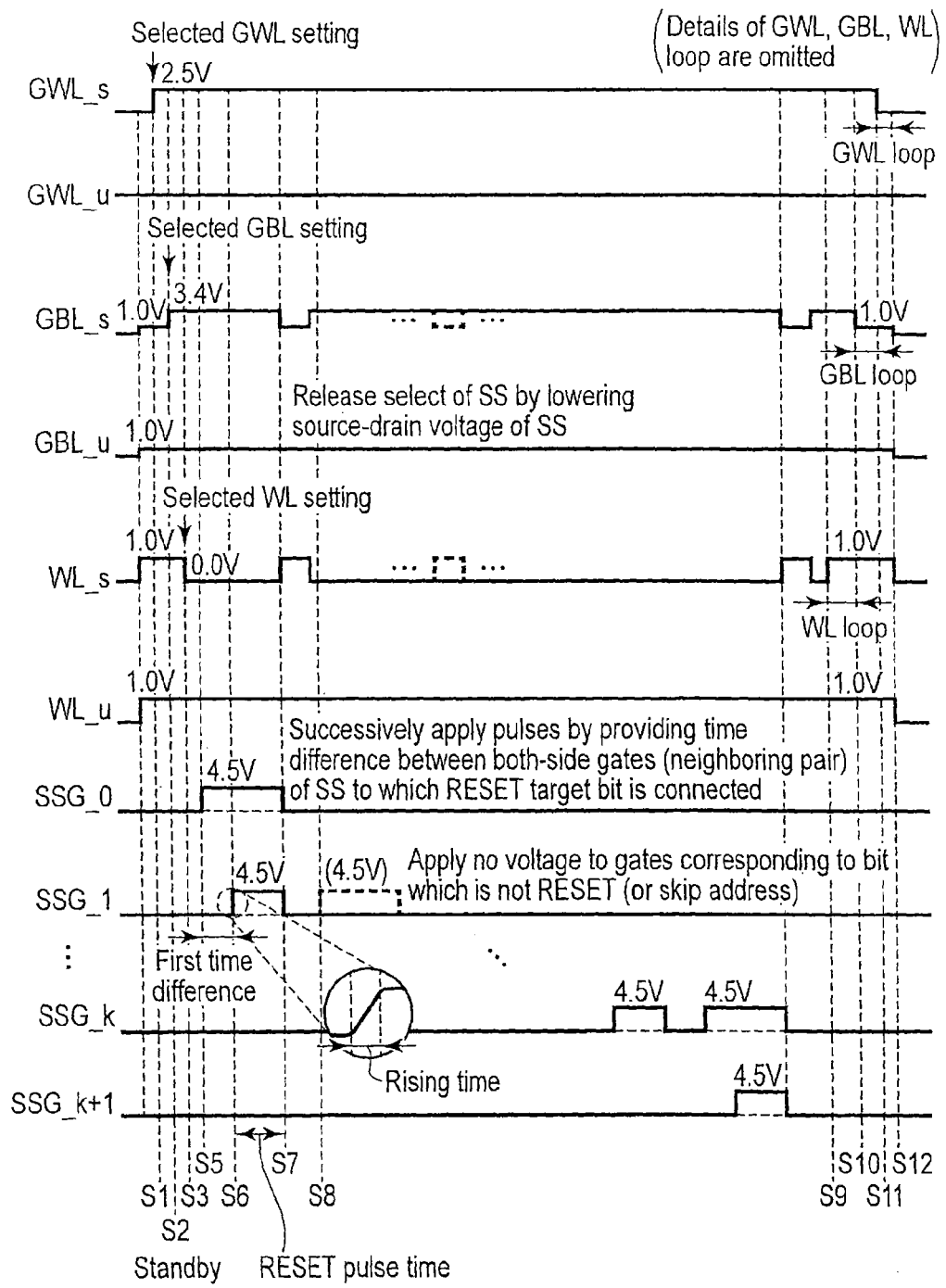
FIG. 18 is an example of a waveform diagram of a RESET operation relating to the first embodiment.

Next, referring to FIG. 18 to FIG. 23, a description is given of more specific examples of set values of voltages at RESET time, and a principle of start/release of a large-current operation by a series of processes. FIG. 18 illustrates an example of time dependency of a voltage at each node at a time when the RESET operation is executed by the loop of FIG. 10, and FIG. 19 to FIG. 23 illustrate bias examples at the time of the RESET operation. In addition, FIG. 19 to FIG. 23 illustrate an example in which the direction of current is reversed, compared to the case of SET, in accordance with the bipolar operation of the resistance change element. Accordingly, the relationship between the source and drain is reversed in the up-and-down direction in the Figure, compared to the case of SET.

FIG. 19 to FIG. 23 schematically illustrate, in enlarged scale, voltages and operation states relating to one sheet selector. Incidentally, in the schematic view of the sheet selector, the voltages as a whole are lowered for the purpose of convenience, and the source voltage is set, for example, as to to become 0 V.

Figure 19:
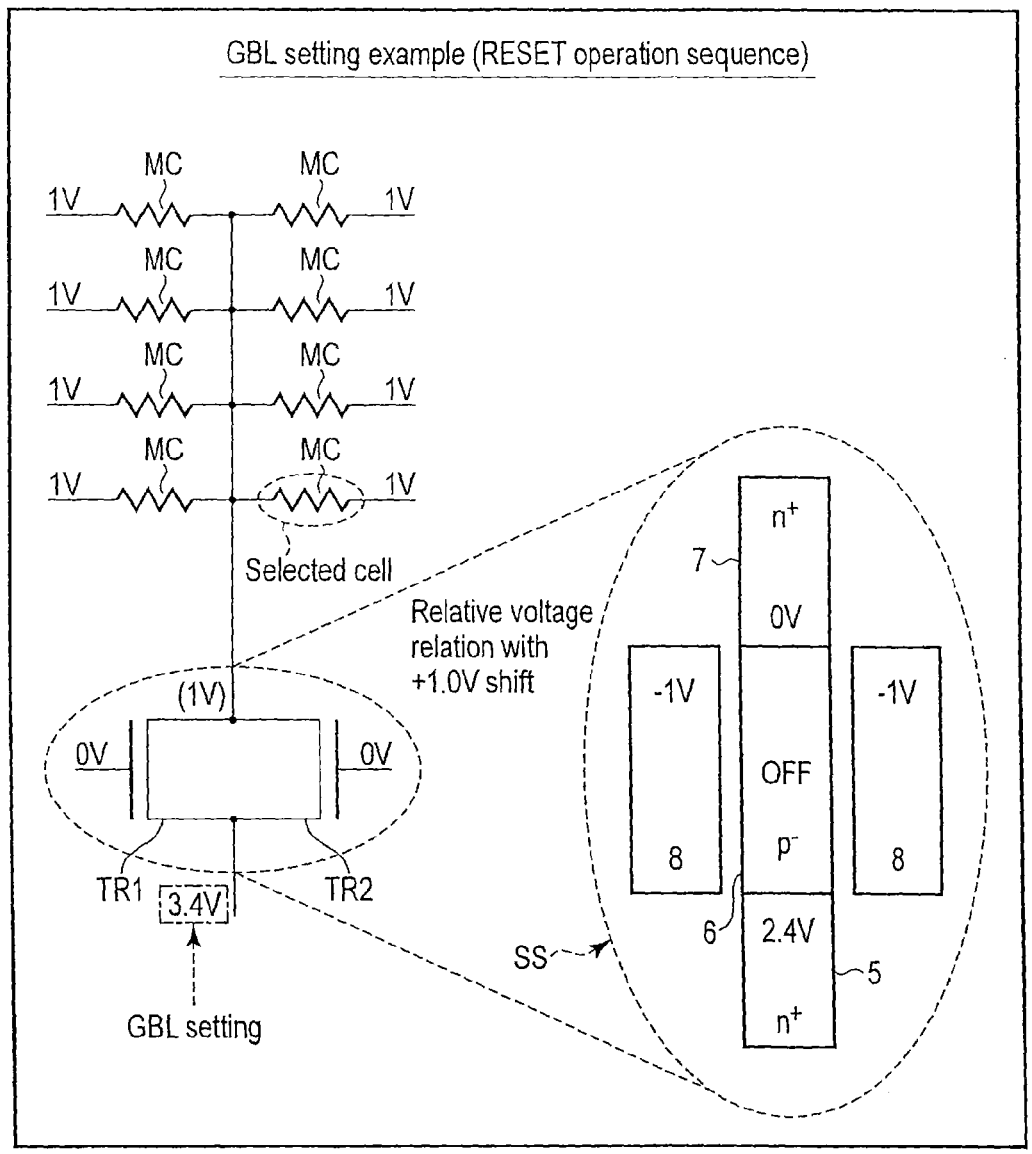

As illustrate in FIG. 18 and FIG. 19, to start with, at the stage of step S2 of FIG. 10, the controller 25 sets the voltage of the selected global bit line at, e.g. 3.4 V. In this state, the sheet selector SS remains OFF state.

Subsequently, as illustrated in FIG. 18 and FIG. 20, at the stage of step S3 of FIG. 10, the controller 25 sets the selected word line at, e.g. 0 V. In this state, too, the sheet selector SS remains OFF state.

Figure 21:
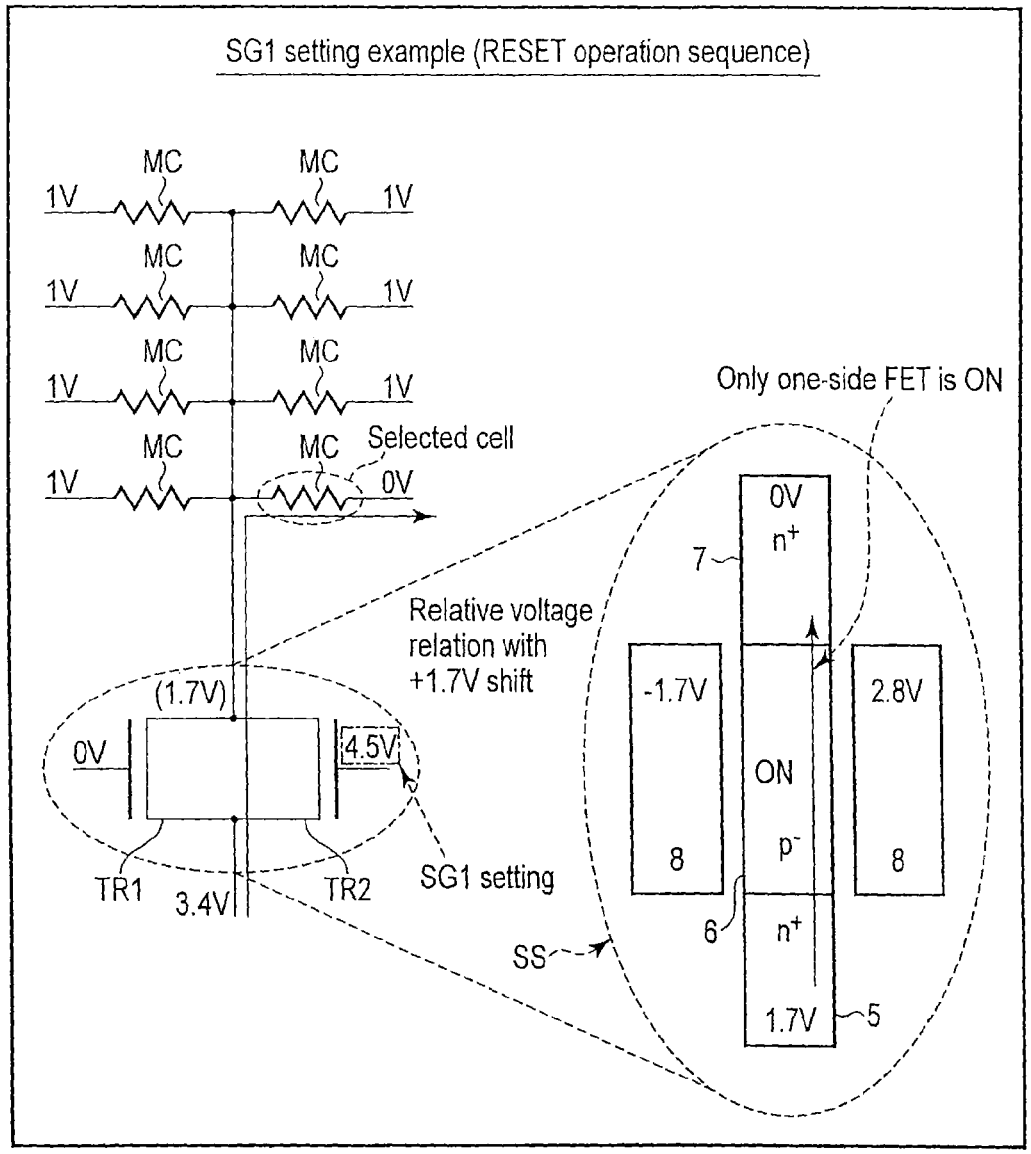

Further, as illustrated in FIG. 18 and FIG. 21, at the stage of step S5 of FIG. 10, the controller 25 sets the first gate of the transistor TR2 of the selected sheet selector SS, which is connected to the selected cell in the third direction, at, e.g. 4.5 V. At this stage, only the MOSFET interface channel on the right side of the sheet selector SS is turned ON, and a current of a certain degree flows. However, since the voltage that is applied to the cell is sufficiently small and the current flowing in the cell is also sufficiently small, the resistance state of the selected cell is unchanged.

Figure 22:
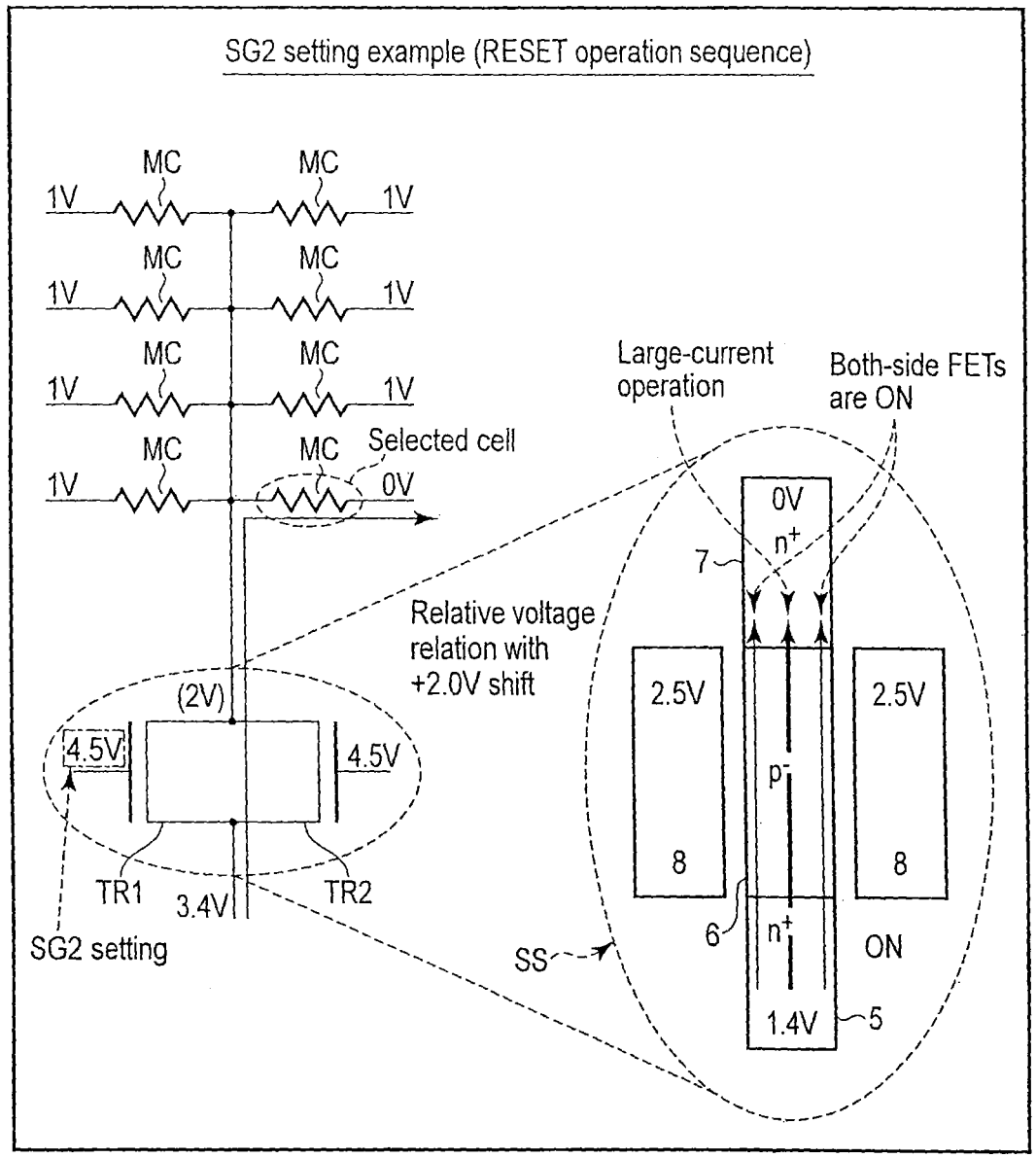

Subsequently, as shown in FIG. 18 and FIG. 22, at the stage of step S6 of FIG. 10, the controller 25 sets the second gate of the transistor TR1 at, e.g. 4.5 V. At this time, the transistor TR1 is opposed, in the first direction, to the transistor TR2 of the select sheet selector SS that is connected to the selected cell in the third direction. At this stage, the sheet selector SS starts a large-current operation and, in addition to the current flowing in the left and right MOSFET interface channels, a bipolar current flowing in the bulk portion begins to flow. Thereby, since a sufficient current can be supplied to the cell and the drain voltage lowers, the selected cell voltage becomes a desired value. Thus, the RESET operation of the selected cell can be exactly realized.

Figure 23:
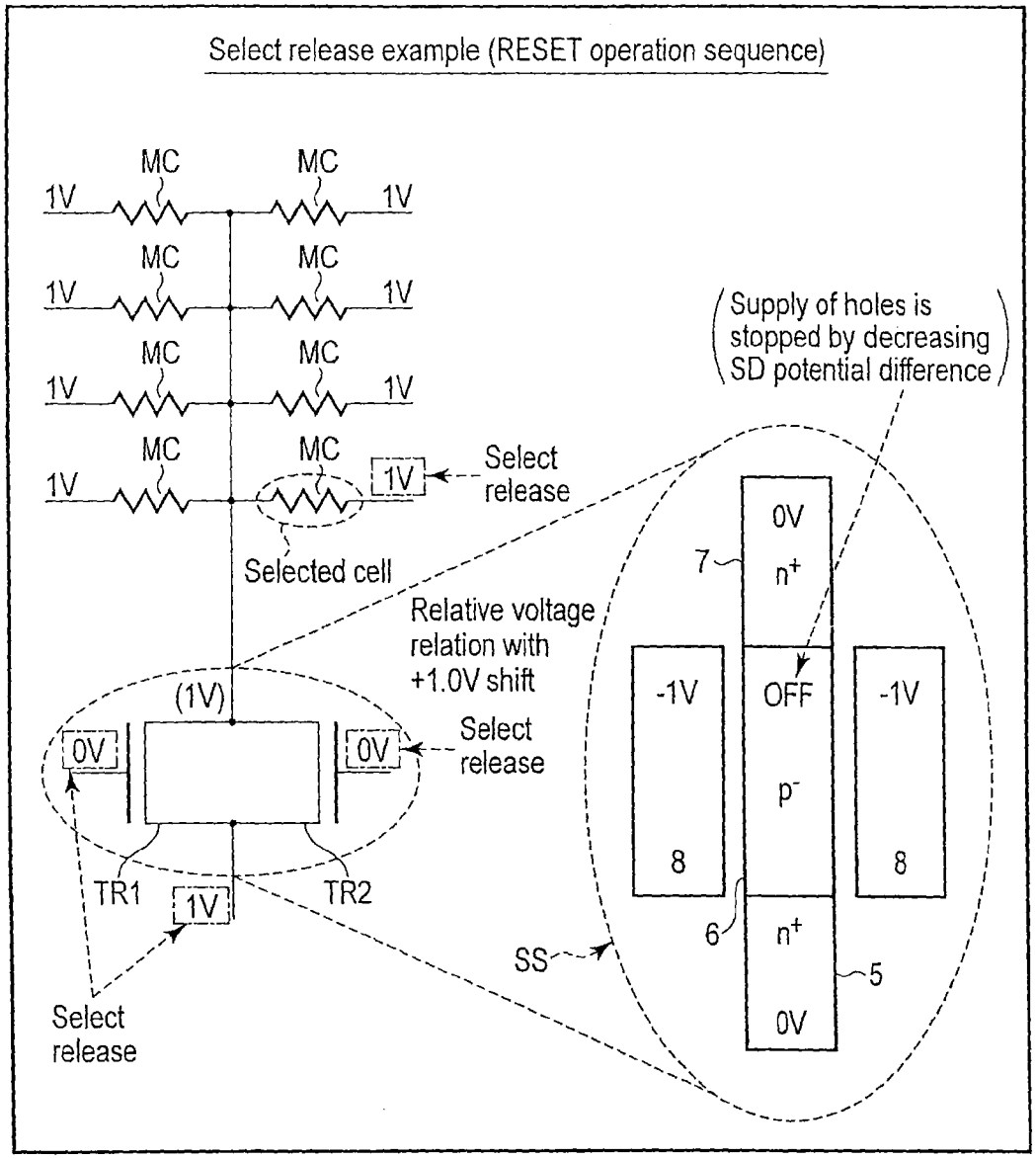

Then, as illustrated in FIG. 18 and FIG. 23, at the stage of step S7 of FIG. 10, the controller 25 executes select release of the sheet selector SS after the passage of a predetermined RESET pulse time. In this case, the controller 25 restores the voltage of the selected global bit line to the non-select voltage (e.g. 1 V), restores the voltage of the selected word line to the non-select voltage (e.g. 1 V), and sets both gate voltages of the sheet selector SS at, e.g. 0 V, thereby reducing the carriers flowing in the sheet selector SS to substantially zero.

<Advantageous Effects of the First Embodiment>

In the above-described first embodiment, in the memory device relating to the first embodiment, in the SET or RESET operation for the selected cell, for example, a time difference of 50 nsec is provided after setting, at the select voltage, the gate electrode of the transistor TR2 of the selected sheet selector SS relating the selected cell, the transistor TR2 being connected to the selected cell in the third direction. Then, the gate electrode of the transistor TR1, which is opposed, in the first direction, to the transistor TR2 of the selected sheet sector SS, is also set at the select voltage.

As a result, the sheet selector SS is caused to execute the large-current operation, in addition to the operation dominated by interface conduction. Thereby, the driving current of the sheet selector SS is secured.

Thereby, a current by the large-current operation is let to flow in the vicinity of the center of the channel region 6 that is sandwiched by both select gates. Accordingly, in addition to the interface conduction current by the conventional FET operation, the current by the large-current operation flows, and the driving current of the sheet selector can be increased. At the same time, since the current by the large-current operation flows only in the vicinity of the center of the channel region 6 that is sandwiched by both select gates, the selectivity ratio of the current in the selection/non-selection in relation to the other sheet selector, which shares only one of the select gates, can be increased.

As a result, even if the three-dimensional multilayer structure is used, a simple cell decode method can be realized, and a desired cell driving power can be secured. Therefore, a memory device, which can easily realize high integration, can be provided.

(Modifications)

Next, Modifications 1 to 3 will be described. The basic structure and basic operation of memory devices relating to Modifications 1 to 3 are the same as those of the memory device relating to the above-described first embodiment. Thus, a description is omitted of matters described in the above first embodiment and matters easily known by analogy from the above first embodiment.

Figure 24:
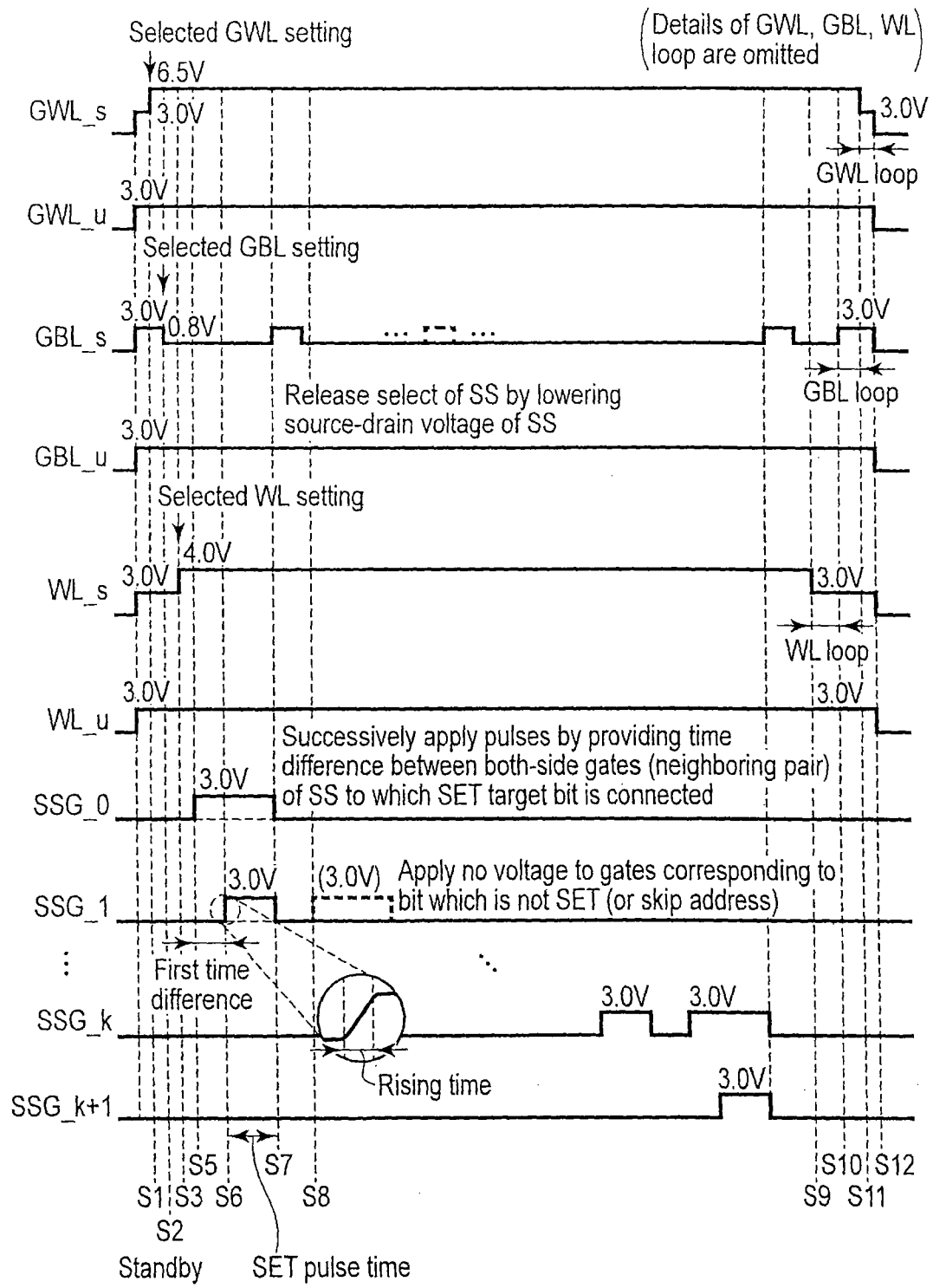
FIG. 24 is an example of a waveform diagram of a SET operation relating to Modification 1.
Figure 27:
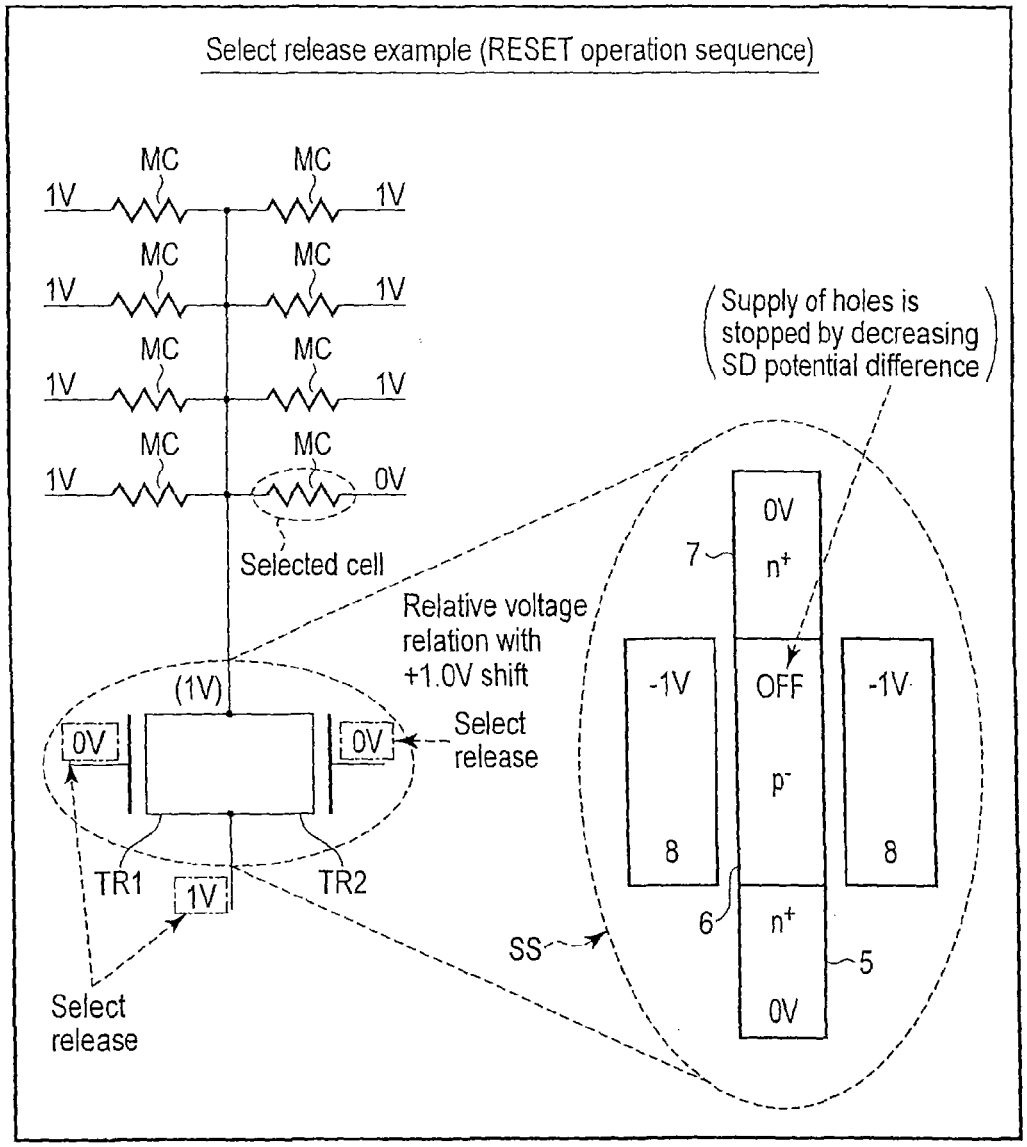
FIG. 27 illustrates an example of sheet selector select release at a time of the RESET operation relating to Modification 1.
Figure 28:
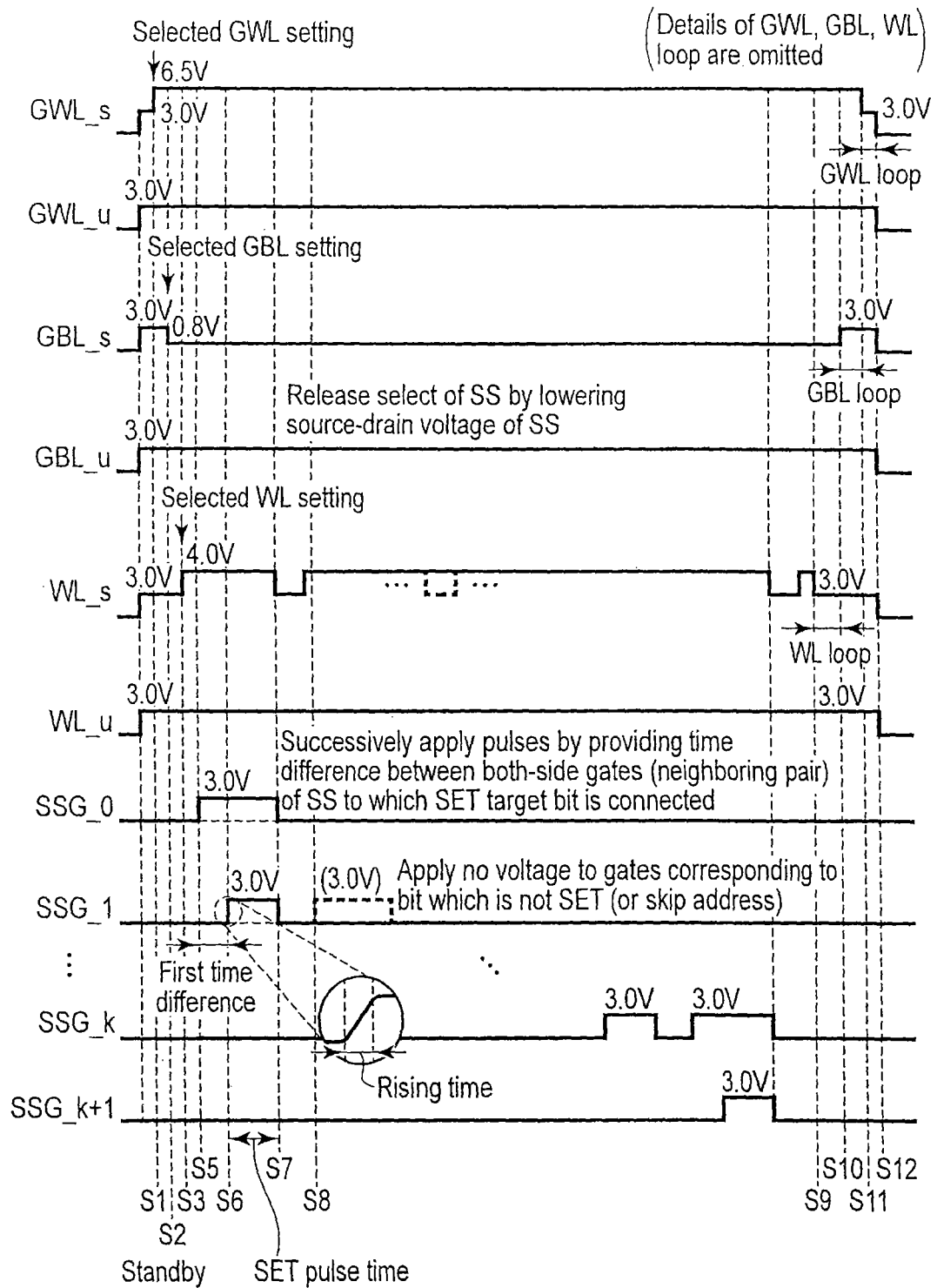
FIG. 28 is an example of a waveform diagram of a SET operation relating to Modification 2.
Figure 29:
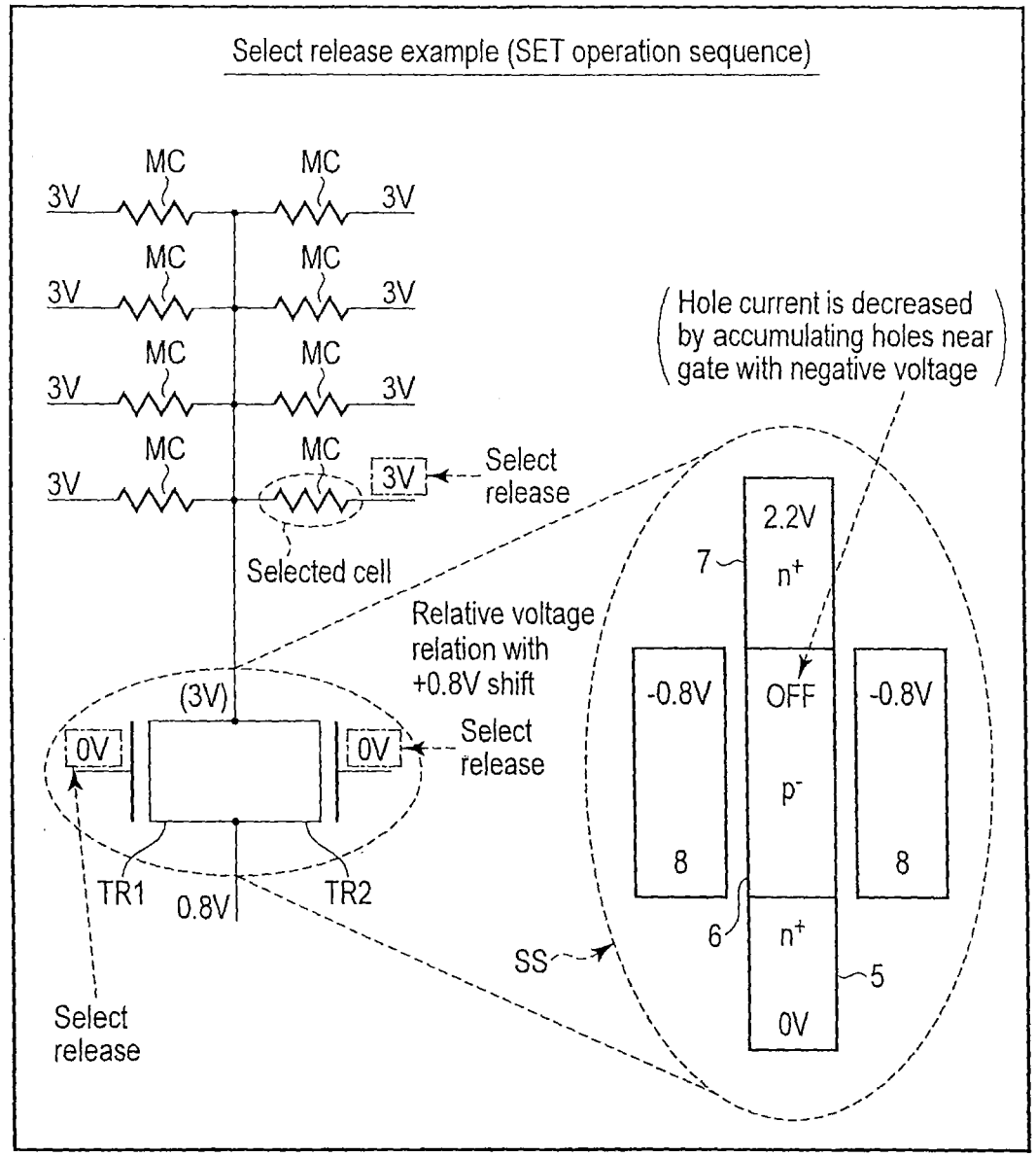
FIG. 29 illustrates an example of sheet selector select release at a time of the SET operation relating to Modification 2.
Figure 30:
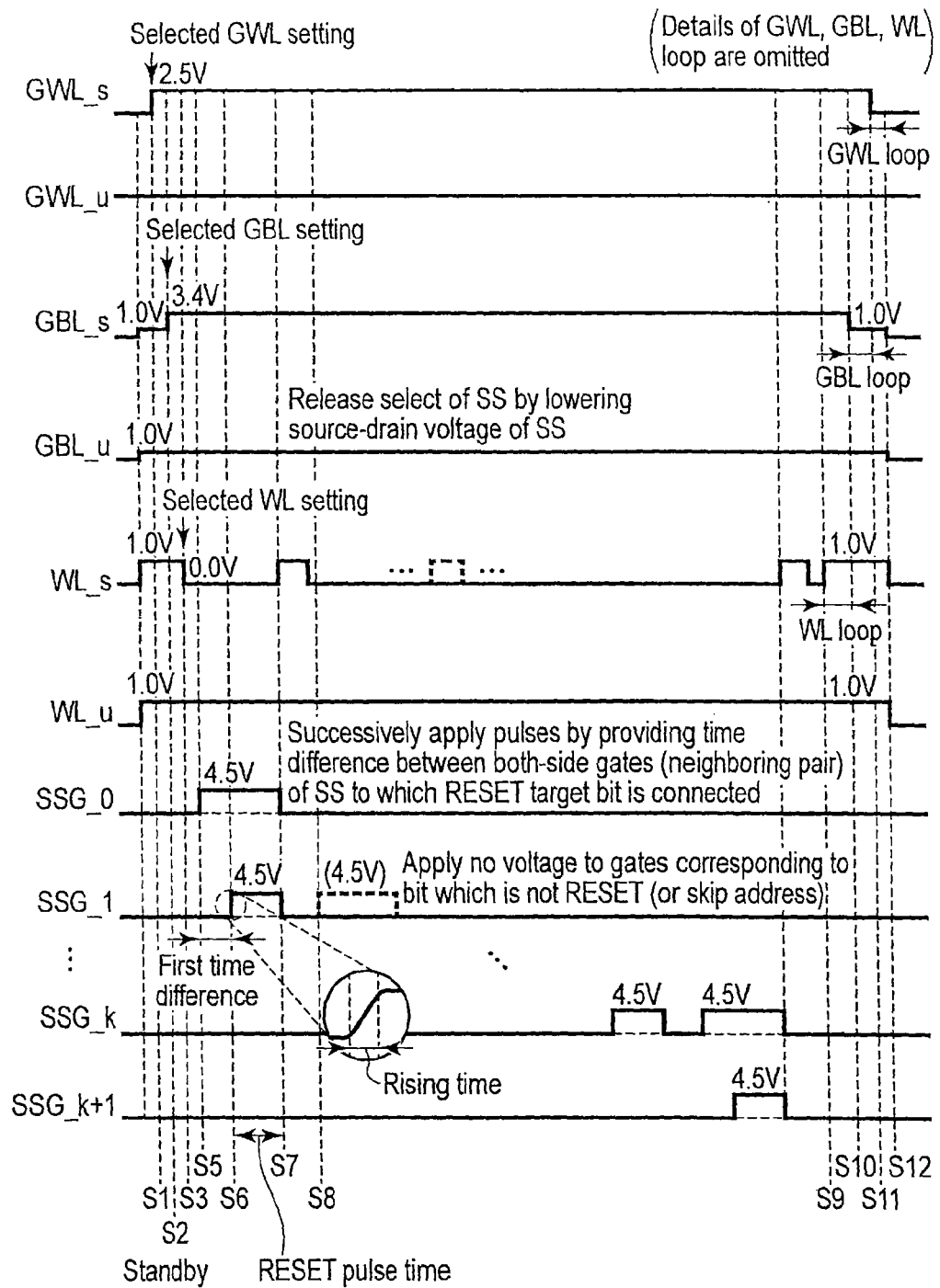
FIG. 30 is an example of a waveform diagram of a RESET operation relating to Modification 2.
Figure 32:
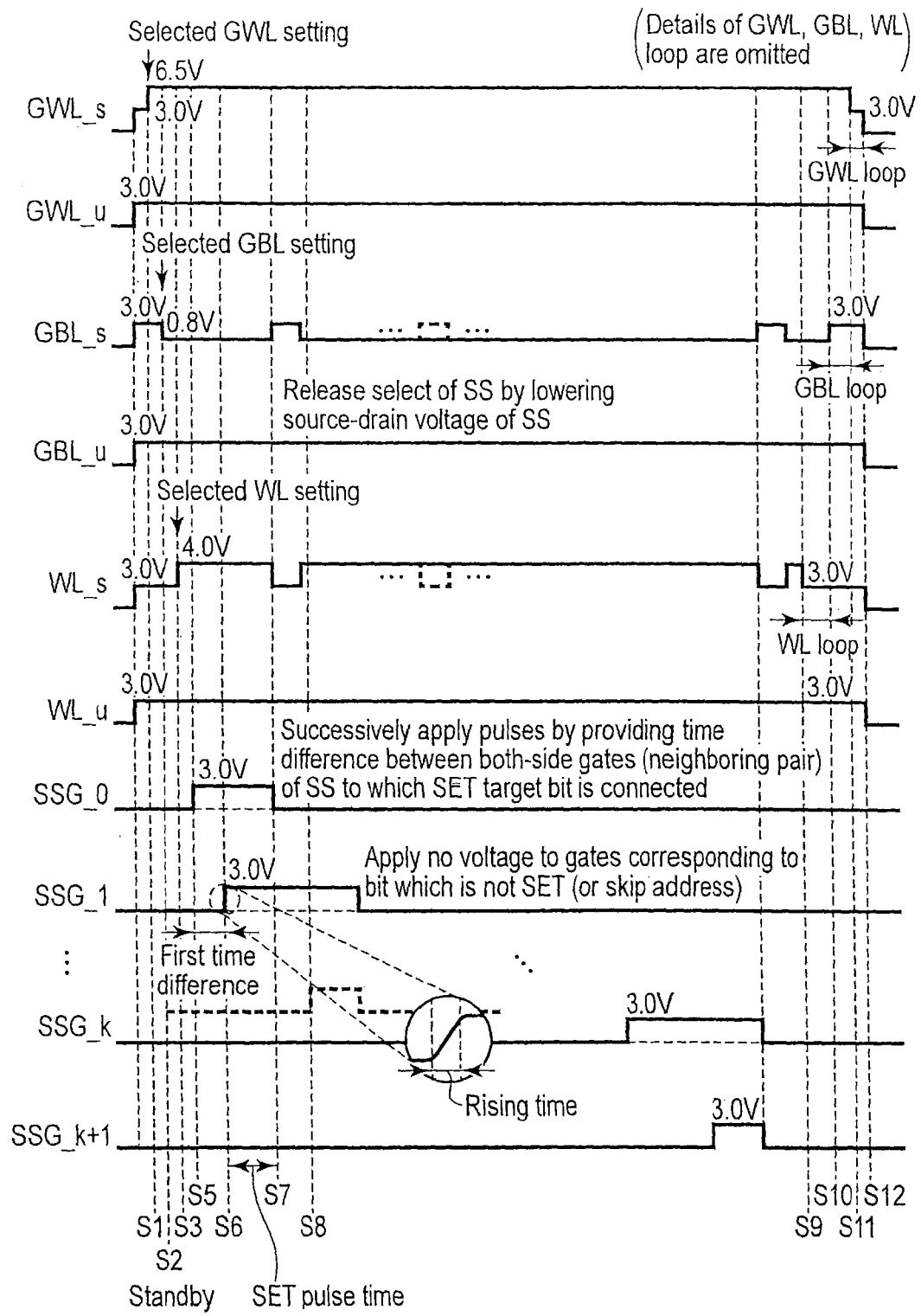
FIG. 32 is an example of a waveform diagram of a SET operation relating to Modification 3.
Figure 33:
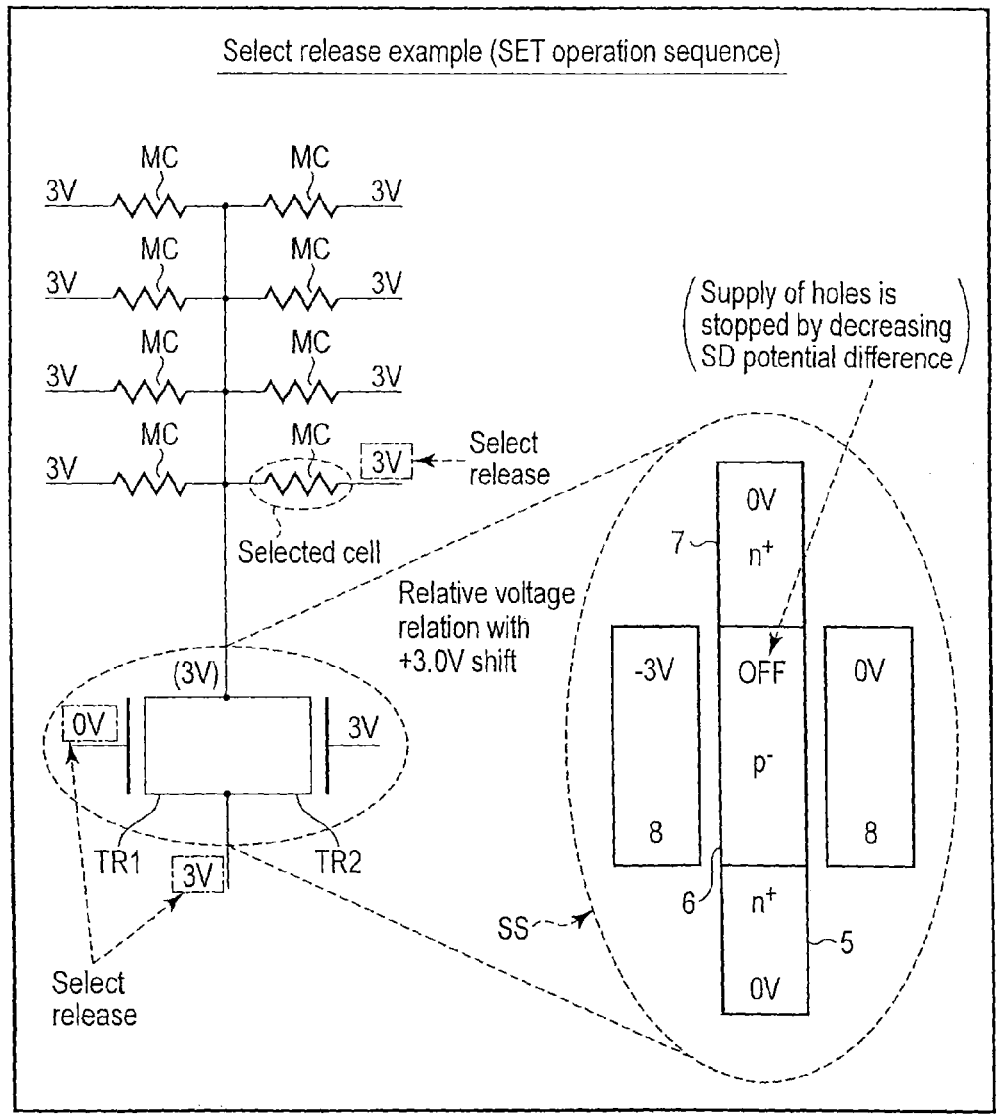
FIG. 33 illustrates an example of sheet selector select release at a time of the SET operation relating to Modification 3.
Figure 34:
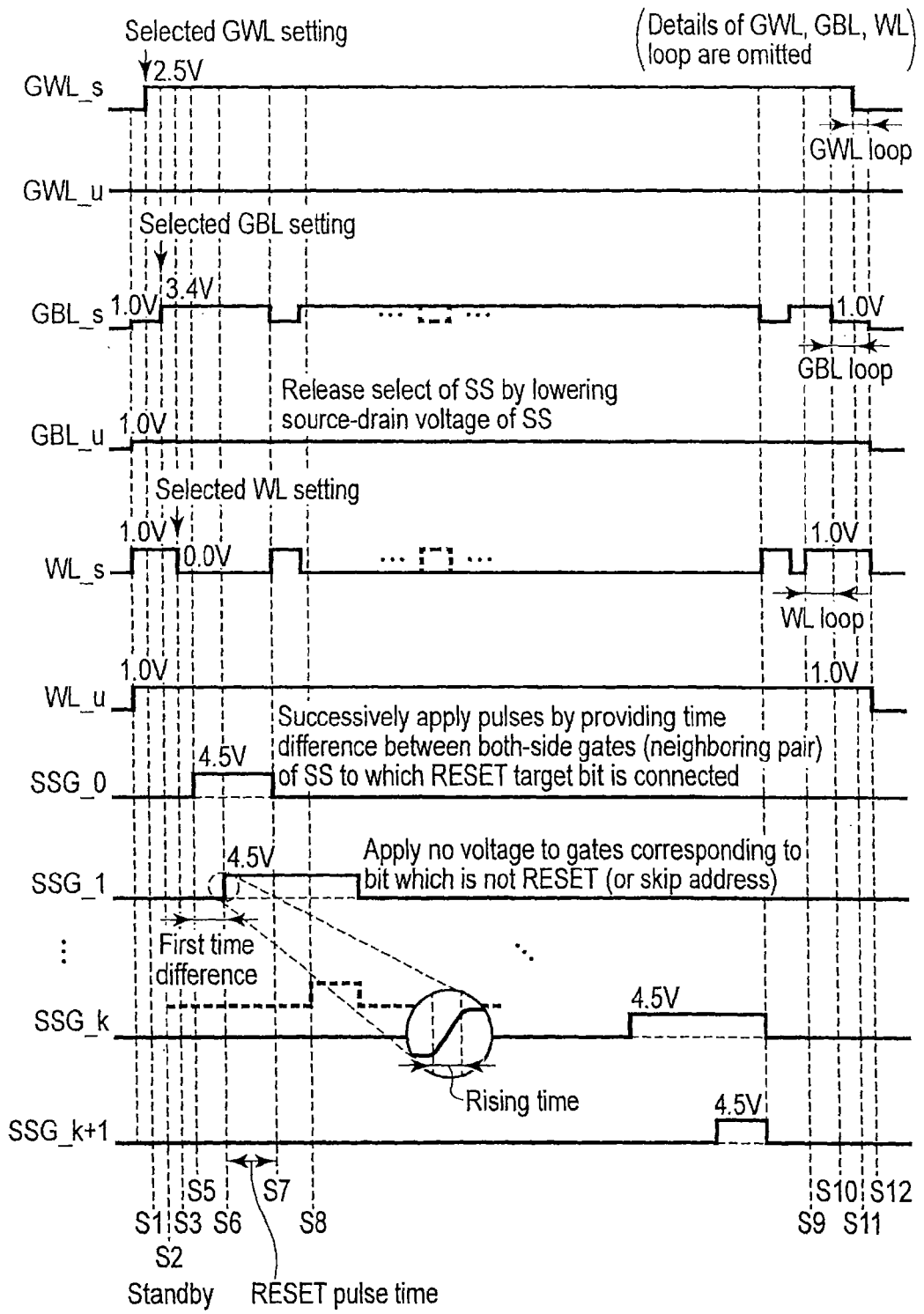
FIG. 34 is an example of a waveform diagram of a RESET operation relating to Modification 3.

Next, referring to FIG. 24 to FIG. 35, a description is given of examples of set values of voltages relating to Modifications 1 to 3, and a principle of executing/releasing a large-current operation by a series of processes. FIG. 24, FIG. 28 and FIG. 32 illustrate examples of time dependency of a voltage at each node at a time when the SET operation is executed by the loop of FIG. 10, and FIG. 25, FIG. 29 and FIG. 33 illustrate other examples of sheet selector select release at a time of the SET operation. In addition, FIG. 26, FIG. 30 and FIG. 34 illustrate examples of time dependency of a voltage at each node at a time when the RESET operation is executed by the loop of FIG. 10, and FIG. 27, FIG. 31 and FIG. 35 illustrate other examples of sheet selector select release at a time of the RESET operation. Incidentally, in the schematic views of the sheet selector in FIG. 25, FIG. 27, FIG. 29, FIG. 31, FIG. 33 and FIG. 35, the voltages as a whole are lowered for the purpose of convenience, and the source voltage is so set as to become, e.g. 0 V.

<Modification 1>

<Examples of Set Values of Voltages at SET Time>

As illustrated in FIG. 24, in a SET operation in Modification 1, the method of applying a voltage to the selected word line WL_s is different from the method in the SET operation of the first embodiment illustrated in FIG. 11. To be more specific, in step S3 to step S9, the controller 25 sets the selected word line WL_s at a select word line voltage (e.g. 4 V).

Figure 25:
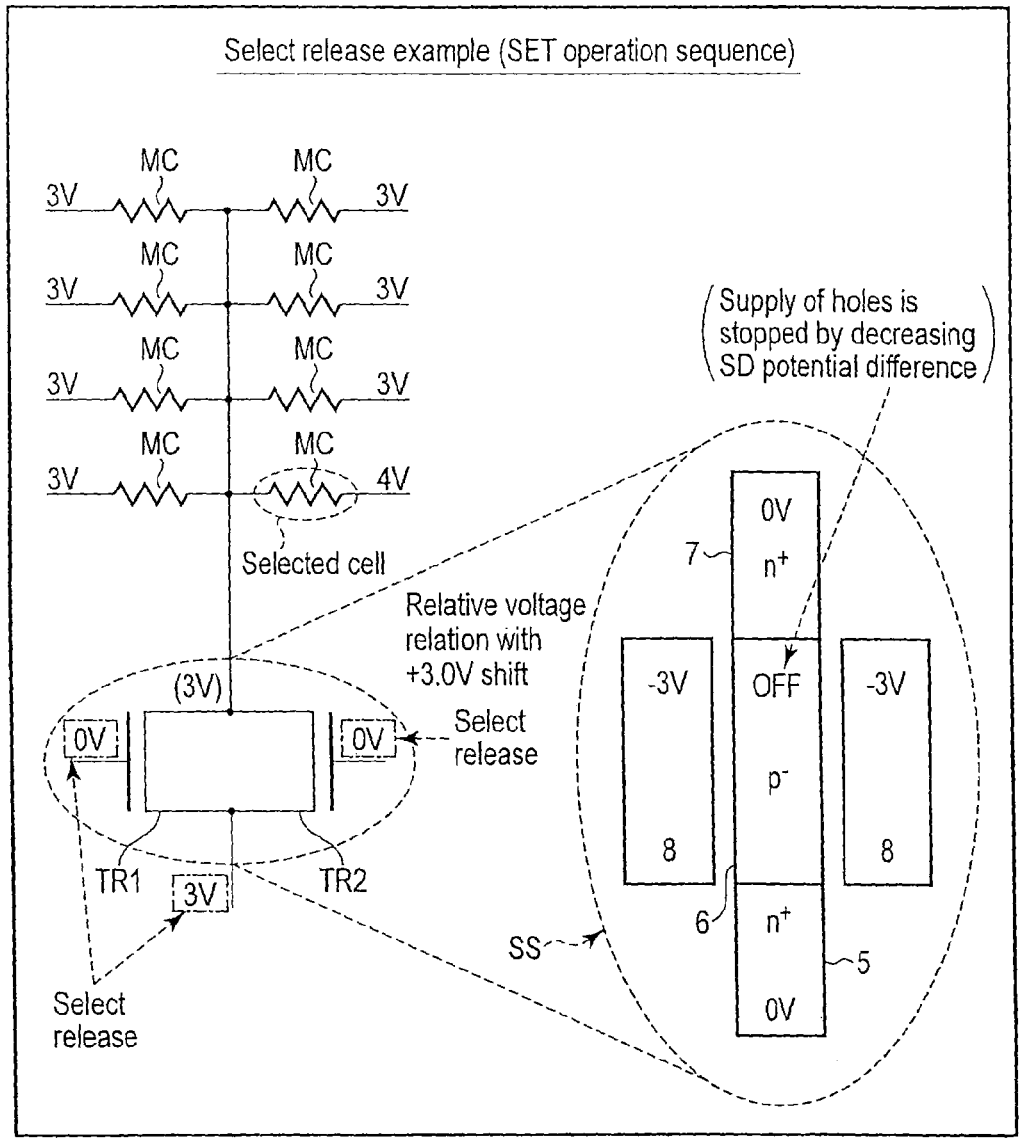
FIG. 25 illustrates an example of sheet selector select release at a time of the SET operation relating to Modification 1.

In addition, as illustrated in FIG. 25, in the sheet selector select release at the time of the SET operation of Modification 1, the controller 25 restores the voltage of the selected global bit line to the non-select voltage (e.g. 3 V), while keeping the select word line voltage, and sets both gate voltages of the sheet selector at, e.g. 0 V, thereby reducing the carriers flowing in the sheet selector to substantially zero.

<Example of Set Values of Voltages at RESET Time>

As illustrated in FIG. 26, in a RESET operation in Modification 1, the method of applying a voltage to the selected word line WL_s is different from the method in the RESET operation of the first embodiment illustrated in FIG. 18. To be more specific, in step S3 to step S9, the controller 25 sets the selected word line WL_s at a select word line voltage (e.g. 0 V).

In addition, as illustrated in FIG. 27, in the sheet selector select release at the time of the RESET operation of Modification 1, the controller 25 restores the voltage of the selected global bit line to the non-select voltage (e.g. 1 V), while keeping the select word line voltage, and sets both gate voltages of the sheet selector at, e.g. 0 V, thereby reducing the carriers flowing in the sheet selector to substantially zero.

<Modification 2>

<Examples of Set Values of Voltages at SET Time>

As illustrated in FIG. 28, in a SET operation in Modification 2, the method of applying a voltage to the selected global bit line GBL_s is different from the method in the SET operation of the first embodiment illustrated in FIG. 11. To be more specific, in step S2 to step S9, the controller 25 sets the selected global bit line GBL_s at a select global bit line voltage (e.g. 0.8 V).

In addition, as illustrated in FIG. 29, in the sheet selector select release at the time of the SET operation of Modification 2, the controller 25 restores the voltage of the selected word line WL_s to the non-select voltage (e.g. 3.0 V), while keeping the select global bit line voltage, and sets both gate voltages of the sheet selector at, e.g. 0 V, thereby reducing the carriers flowing in the sheet selector to substantially zero.

<Example of Set Values of Voltages at RESET Time>

As illustrated in FIG. 30, in a RESET operation in Modification 2, the method of applying a voltage to the selected global bit line GBL_s is different from the method in the RESET operation of the first embodiment illustrated in FIG. 18. To be more specific, in step S2 to step S9, the controller 25 sets the selected global bit line GBL_s at a select global bit line voltage (e.g. 3.4 V).

In addition, as illustrated in FIG. 31, in the sheet selector select release at the time of the RESET operation of Modification 2, the controller 25 restores the voltage of the selected word line WL_s to the non-select voltage (e.g. 1.0 V), while keeping the select global bit line voltage, and sets both gate voltages of the sheet selector at, e.g. 0 V, thereby reducing the carriers flowing in the sheet selector to substantially zero.

<Modification 3>

<Examples of Set Values of Voltages at SET Time>

As illustrated in FIG. 32, in a SET operation in Modification 3, the method of applying a voltage to the second gate of the selected sheet selector is different from the method of applying a voltage to the second gate of the sheet selector SS which is selected in the SET operation of the first embodiment illustrated in FIG. 11. To be more specific, in step S6 to step S9, the controller 25 applies, in the loop of sheet selectors SS, the select gate voltage to the second gate of the i-th selected sheet selector SS, until the (i+1)th SET in the selected word line is completed, by making use of the fact that the i-th second gate is identical to the (i+1)th first gate.

In addition, as illustrated in FIG. 33, in the select release of the sheet selector at the time of the SET operation of Modification 3, the controller 25 sets, while keeping one gate voltage of the sheet selector SS, the other gate voltage at, e.g. 0 V, and sets the selected global bit line voltage at the non-select voltage (e.g. 3 V) and the select word line voltage at the non-select voltage (e.g. 3 V), thereby reducing the carriers flowing in the sheet selector SS to substantially zero.

<Example of Set Values of Voltages at RESET Time>

As illustrated in FIG. 34, in a RESET operation in Modification 3, the method of applying a voltage to the second gate of the selected sheet selector is different from the method in the RESET operation of the first embodiment illustrated in FIG. 18. To be more specific, in step S6 to step S9, the controller 25 applies, in the loop of sheet selectors SS, the select gate voltage to the second gate of the i-th selected sheet selector SS, until the (i+1)th SET in the selected word line is completed, by making use of the fact that the i-th second gate is identical to the (i+1)th first gate.

Figure 35:
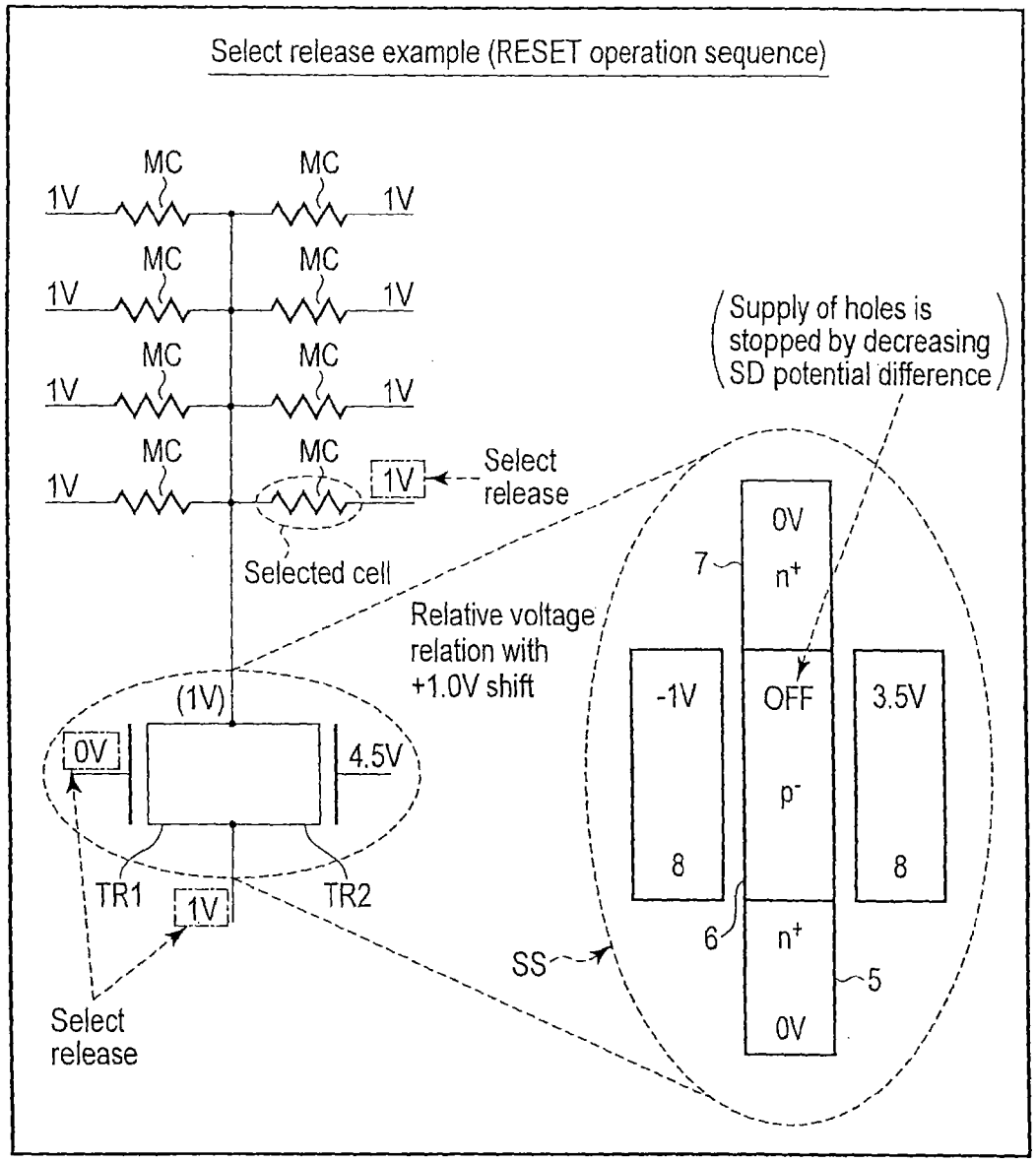
FIG. 35 illustrates an example of sheet selector select release at a time of the RESET operation relating to Modification 3.

In addition, as illustrated in FIG. 35, in the select release of the sheet selector at the time of the RESET operation of Modification 3, the controller 25 sets, while keeping one gate voltage of the sheet selector SS, the other gate voltage at, e.g. 0 V, and sets the selected global bit line voltage at the non-select voltage of, e.g. 1 V and the select word line voltage at the non-select voltage (e.g. 1 V), thereby reducing the carriers flowing in the sheet selector SS to substantially zero.

<Advantageous Effects of Modifications 1 to 3>

In each of the cases, the large-current operation release of the sheet selector is executed by the gate voltage of the sheet selector SS becoming negative. For example, the large-current operation release of the sheet selector is executed by making use of the fact that the holes in the sheet selector SS are accumulated in the vicinity of the gate electrode and thereby the hole current, which is needed to maintain the large-current operation, cannot be maintained. In addition, the large-current operation release of the sheet selector is executed by making use of the fact that the source-drain voltage of the sheet selector decreases and thereby the impact ionization ratio decreases and the hole current, which is needed to maintain the large-current operation, cannot be maintained. In the meantime, the release of the FET operation is realized regardless of the behavior of holes, by the potential of the gate becoming lower than the threshold potential of the channel. Thus, the release of the FET operation is realized in each of the examples.

In addition, at the time of the select release of the sheet selector SS, a constant voltage is maintained without varying a part of node voltage, and thereby the power consumption, which is needed for charging/discharging at a time of varying the node voltage, can be decreased. In particular, decreasing the voltage variation of the global bit line, which has a relatively large parasitic capacitance, can be effective to decrease the power consumption.

Second Embodiment

Next, a second embodiment is described. The basic structure and basic operation of a memory device relating to the second embodiment are the same as those of the memory device relating to the above-described first embodiment. Thus, a description is omitted of matters described in the above first embodiment and matters easily known by analogy from the above first embodiment.

<SET/RESET Operation Including Sheet Selector Large-Current Operation>

Figure 37:
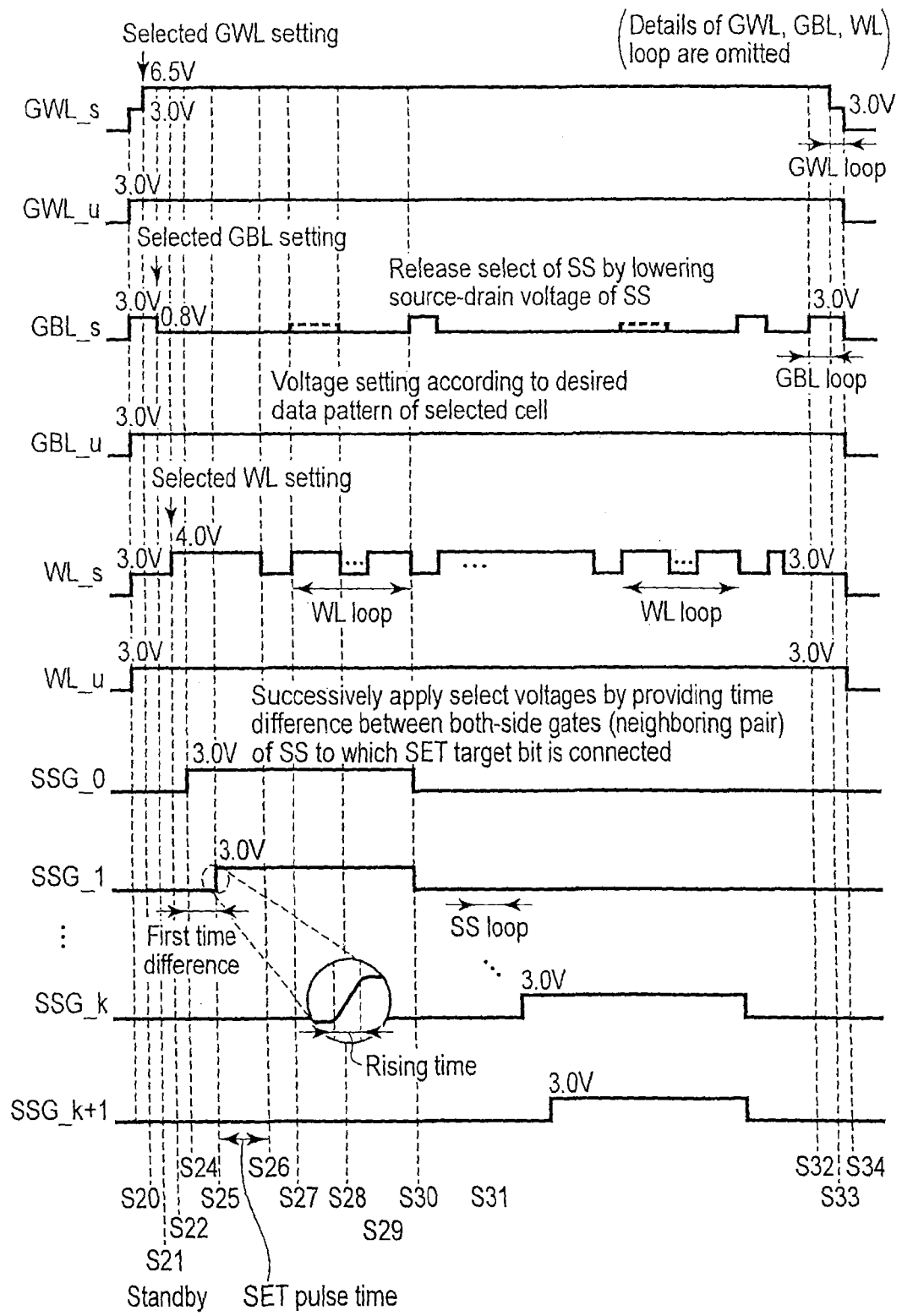
FIG. 37 is an example of a waveform diagram of a SET operation relating to the second embodiment.
Figure 38:
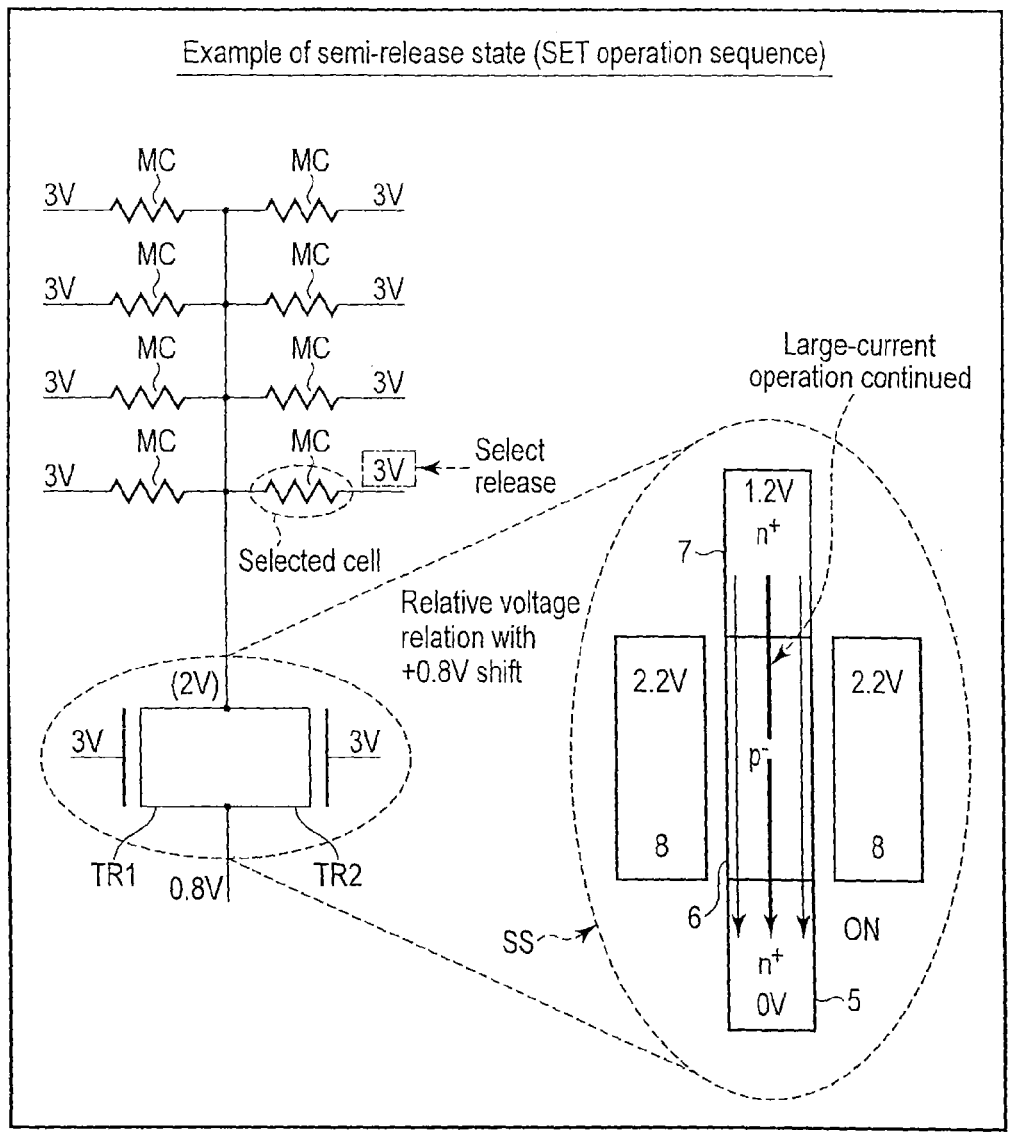
FIG. 38 and FIG. 39 illustrate bias examples at a time of the SET operation relating to the second embodiment.
Figure 39:
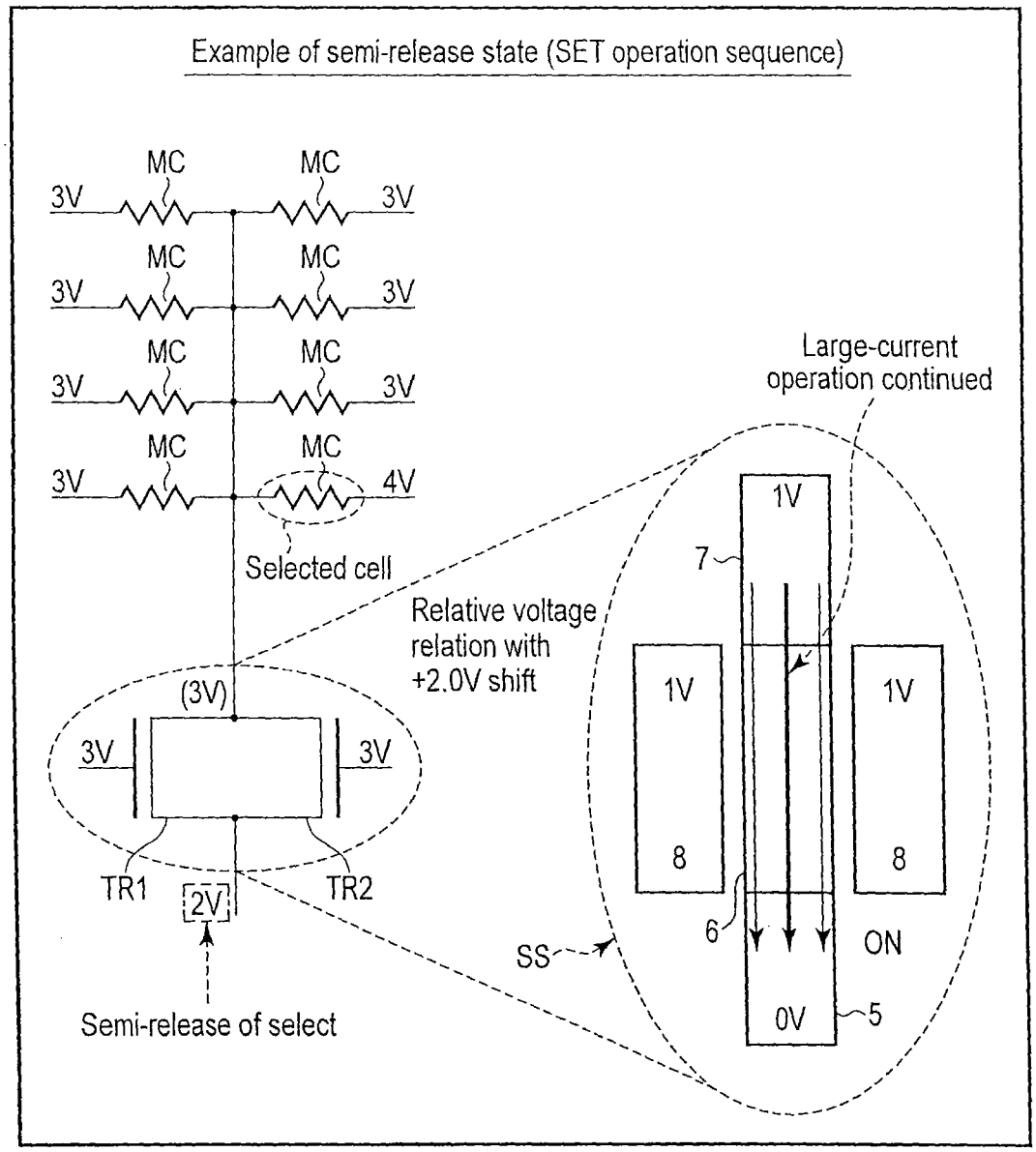
Figure 40:
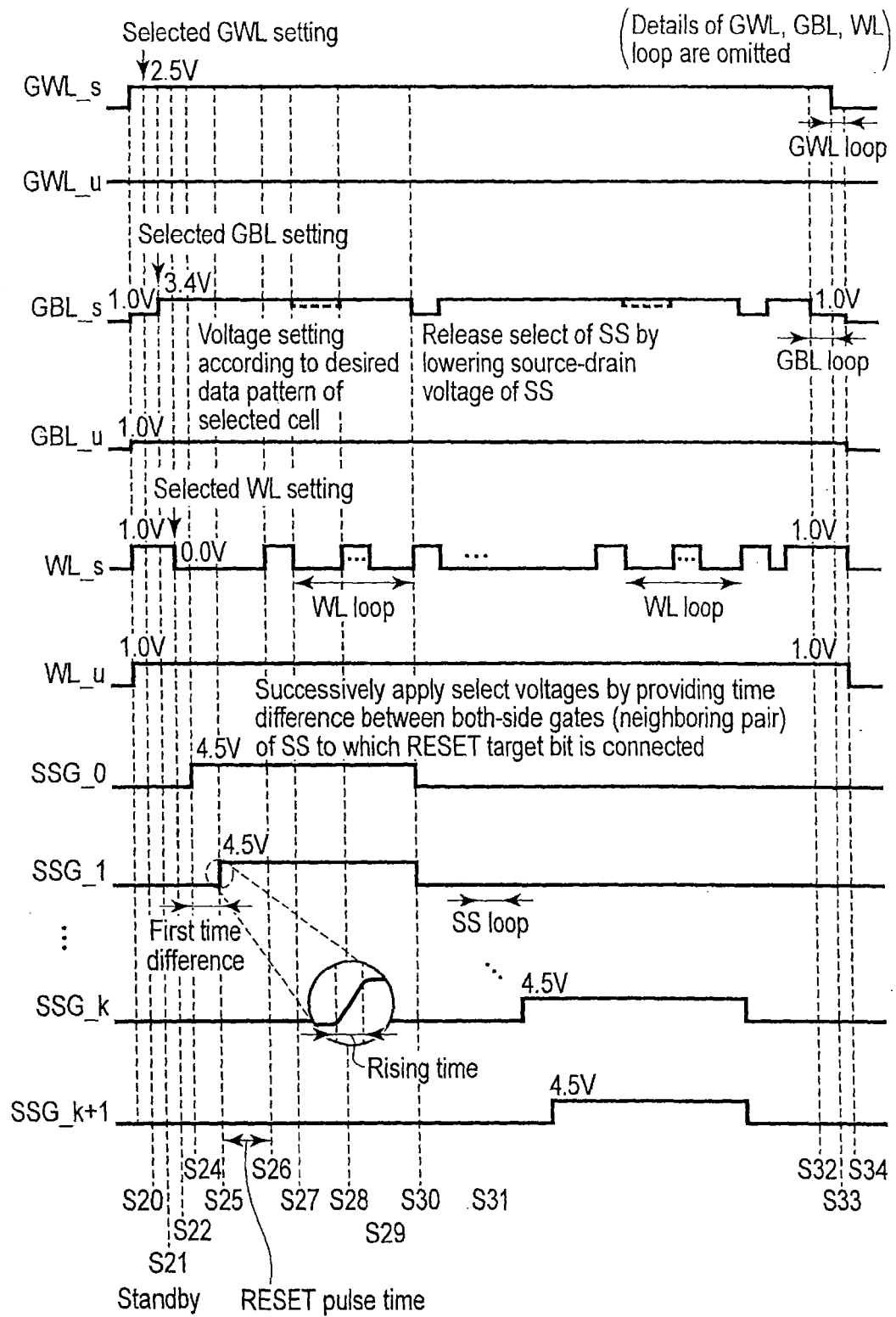
FIG. 40 is an example of a waveform diagram of a RESET operation relating to the second embodiment.
Figure 42:
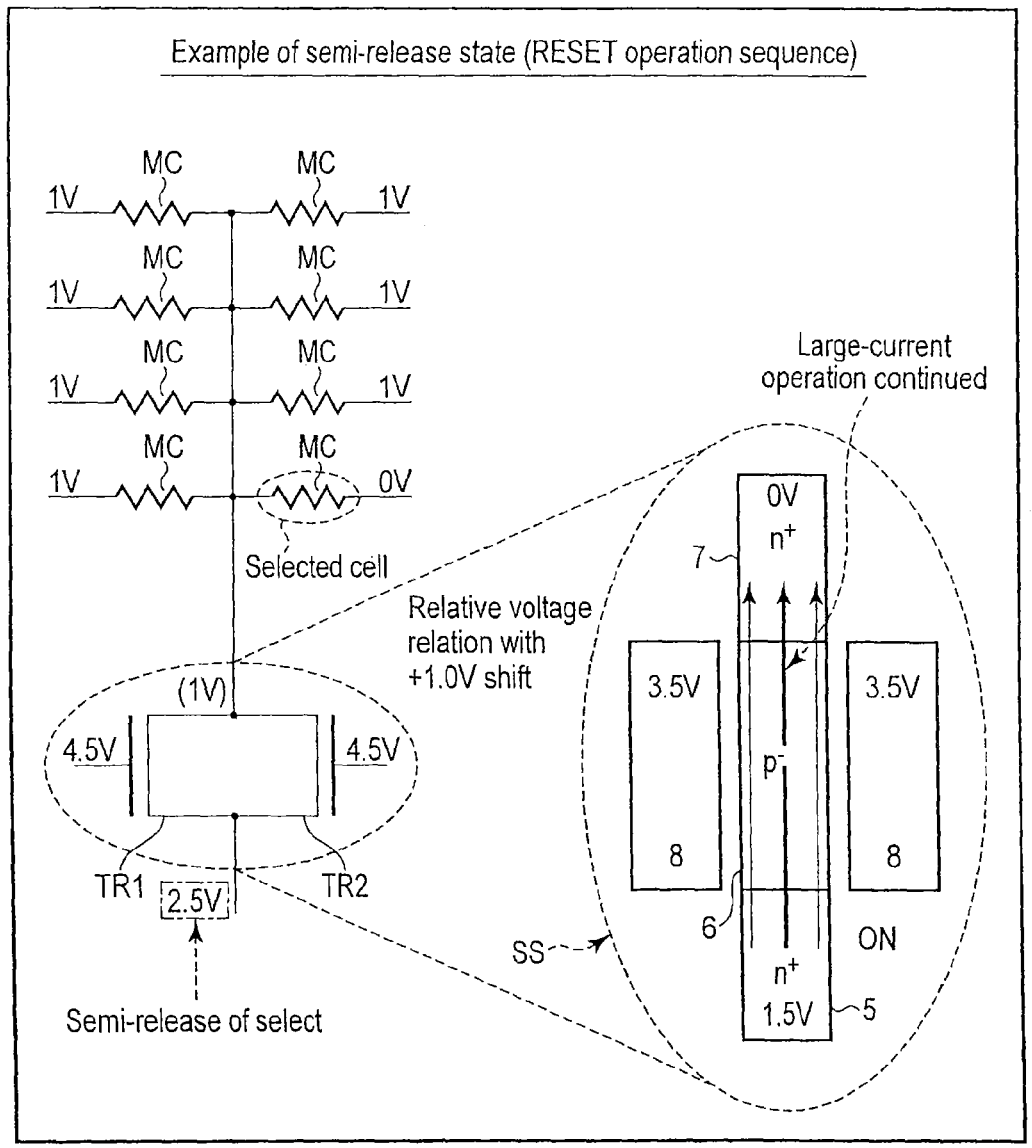

Next, referring to FIG. 36 to FIG. 43, a description is given of a SET/RESET operation including a sheet selector large-current operation relating to the second embodiment. FIG. 36 is an example of a flowchart of the SET/RESET operation including the sheet selector large-current operation of the memory device relating to the second embodiment. FIG. 37 illustrates an example of time dependency of a voltage at each node at a time when the SET operation is executed by the loop of FIG. 36, and FIG. 38 and FIG. 39 illustrate bias examples at a time of the SET operation. FIG. 40 illustrates an example of time dependency of a voltage at each node at a time when the RESET operation is executed by the loop of FIG. 36, and FIG. 41 and FIG. 42 illustrate bias examples at a time of the RESET operation. FIG. 38, FIG. 39, FIG. 41 and FIG. 42 illustrate, in enlarged scale, voltages and operation states relating to one sheet selector. Incidentally, in the schematic view of the sheet selector, the voltages as a whole are lowered for the purpose of convenience, and the source voltage is so set as to become 0 V.

[Step S20]

To start with, the controller 25 executes the same operation as in step S1 which has been described with reference to FIG. 10.

[Step S21]

Subsequently, the controller 25 executes the same operation as in step S2 which has been described with reference to FIG. 10.

[Step S22]

Next, the controller 25 sets a WL address for a first selected word line in the group. The controller 25 sets, for example, a selected word line at a select word line voltage, and sets non-selected word lines, other than the selected word line, at, e.g. 3.0 V as a non-select voltage (non-select word line voltage).

[Step S23]

Next, the controller 25 executes the same operation as in step S4 which has been described with reference to FIG. 10.

[Step S24]

The controller 25 applies a select gate voltage to, for example, the gate electrode (first gate electrode) of the transistor TR2 of a selected sheet selector SS, which is formed on the plane of the channel region 6 which is the same plane as the plane of the column line 3 to which the select cell is connected.

[Step S25]

After the controller 25 has applied the select gate voltage to the first gate electrode of the transistor TR2 of the selected sheet selector SS, the controller 25 applies, after the passage of a first time (e.g. 50 nsec), a select gate voltage to the gate electrode (second gate electrode) of the transistor TR1 which is formed on the plane of the channel region 6 which is opposed, in the first direction, to the plane of the channel region 6 that is the same plane as the plane of the column line 3 to which the select cell is connected.

[Step S26]

Next, in order to release the first selected word line in the group, the controller 25 sets the selected word line at a non-select voltage (non-select word line voltage) of, e.g. 3.0 V. During the switching of the selected word line, the large-current operation of the sheet selector SS needs to be maintained (the hole current needs to be maintained). However, as illustrated in FIG. 38, FIG. 39, FIG. 41 and FIG. 42, even if only the selected word line is set at the non-select voltage (see FIG. 38, FIG. 41), or even if the select global bit line voltage is set in a semi-release state (an example of SET: 2 V, an example of RESET: 2.5 V) (see FIG. 39, FIG. 42), the condition which is needed for maintaining the hole current can be maintained. Thus, the large-current operation is continued. In the meantime, the semi-release state is a state in which the sheet selector SS maintains the large-current operation, but a current of such a degree as not to write data in the memory cell MC is caused to flow.

[Step S27]

Next, the controller 25 sets a WL address for another selected word line in the group. The controller 25 sets, for example, the selected word line at a select word line voltage.

[Step S28]

Subsequently, in order to release the another selected word line in the group, the controller 25 sets the selected word line at a non-select voltage (non-select word line voltage).

[Step S29]

The controller 25 repeats steps S27 and S28 by the loop of the word lines in the word line group, and completes SET/RESET in the word line group.

[Step S30]

After completing the SET/RESET in the target word line group, the gate voltage and source-drain voltage of the sheet selector are operated as will be described later, and the select release of the sheet selector is executed. When the large-current operation of the sheet selector is released and the sheet selector select release is executed, like the preceding example, it should suffice if at least three of four voltages, i.e. the select global bit line voltage, select word line voltage and both gate voltages of the sheet selector, are set at non-select voltages.

[Step S31]

The controller 25 repeats steps S22 to 30 by the loop of sheet selector addresses, and completes SET/RESET in the sheet selector addresses.

[Step S32]

The controller 25 repeats steps S21 to 31 by the loop of the global bit lines in the page range, and completes SET/RESET in the global bit lines in the page range.

[Step S33]

In addition, the controller 25, at last, confirms that the data in the page agrees with target data, and, for example, when the read data does not agree with planned write data, the controller 25 repeats the loop of steps S21 to S32 once again with respect to the disagreeing data.

[Step S34]

The controller 25 finally confirms that the data in the page agrees with target data, and then completes the SET/RESET operation.

In the present embodiment, the SET/RESET of data of a page unit as a file memory has been described, but the data unit may be some other data unit, such as a segment unit or a bit unit.

<Advantageous Effects of the Second Embodiment>

According to the second embodiment, there is an advantage that the cycle time of the loop can be reduced by reducing the frequency of select and release of the sheet selector SS.

In this case, during the switching of the selected word line, the large-current operation of the sheet selector can be maintained (the hole current can be maintained) by the above-described method.

In the meantime, when the selected global bit line GBL_s is only one in the selected word line group, the controller 25 can also loop the addresses of the selected word lines WL_s (i.e. can maintain the non-select voltage at addresses for which SET/RESET is not executed, or skip the addresses) while maintaining the voltage of the selected global bit line GBL_s.

Figure 43:
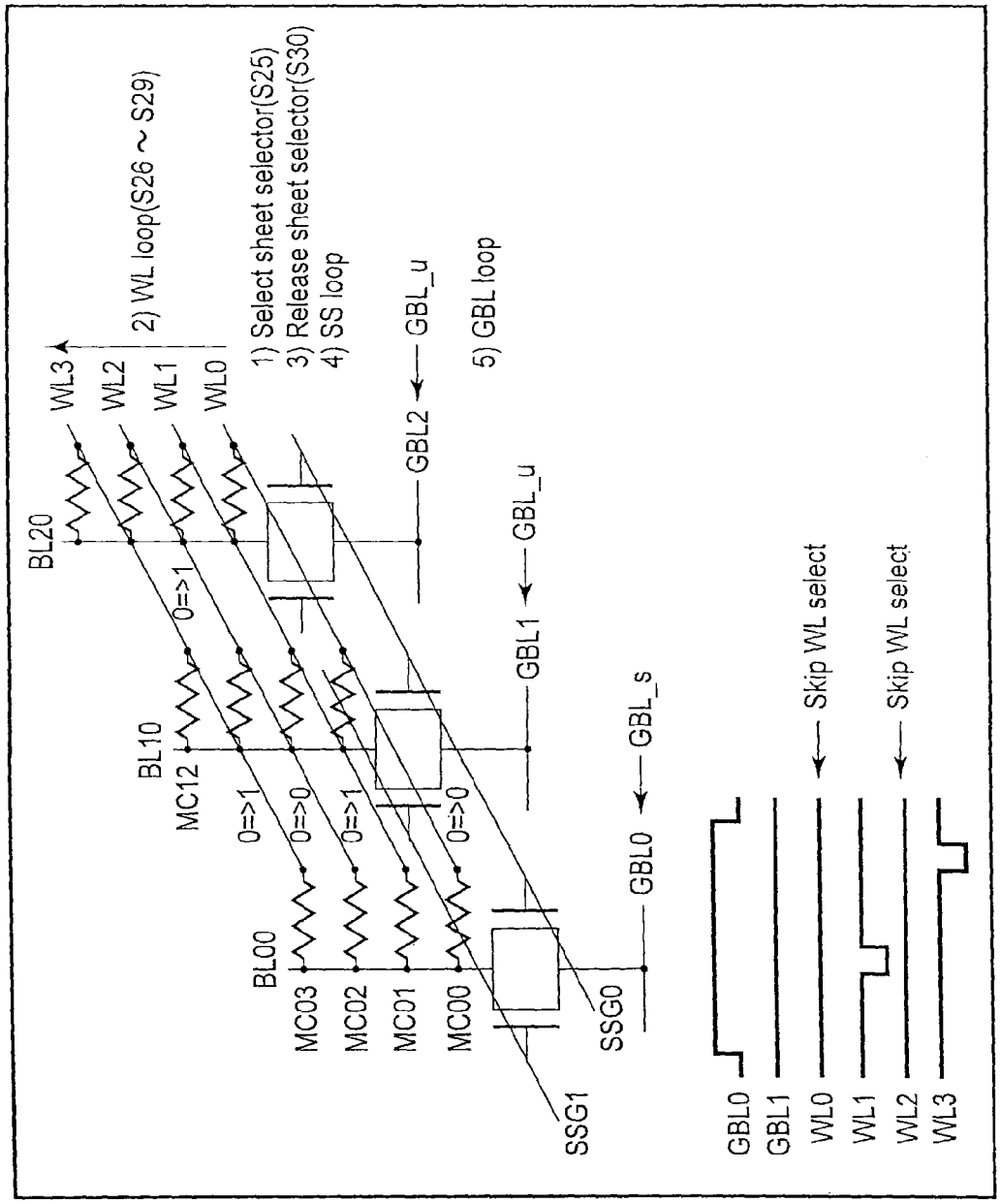
FIG. 43 is an example of a view illustrating an example of the operation of a memory device relating to the second embodiment, and is an example of a waveform diagram.

For example, as illustrated in FIG. 43, the case is now considered, in which only the global bit line GBL0 is selected and data "0", "1", "0" and "1" are stored in memory cells MC00 to MC03 which are connected to the bit line BL01. In a state before data write, data "0" is written in all memory cells MC00 to MC03. At this time, the data in the memory cells MC00, 02 does not change from data "0". Specifically, there is no need to select the word lines WL0, 2 to which the memory cells MC00, 02 are connected. Thus, the word lines WL0, 2 are not set at the select word line voltage, and the non-select word line voltage can be maintained.

Furthermore, there is no need to consider data storage, other than the global bit line GBL0. For example, the case is now considered, in which data to be stored in memory cells MC02, 12, which are connected to a common word line, are different when global bit lines GBL0 and GBL1 are selected at the same time. In this case, it is necessary to vary the voltage of the global bit line GBL0 so as not to store data in the memory cell MC02. At this time, in order not to write data in the memory cell MC02, the global bit line GBL0 is set in a semi-release state, as shown in FIG. 39 or FIG. 42.

Specifically, when only the global bit line GBL0 is selected, the state shown in FIG. 39 or FIG. 42 is needless, and the voltage variation of the global bit line with a relatively large parasitic capacitance can be decreased. Therefore, there is an advantage in operation speed and power consumption.

Third Embodiment

Next, a third embodiment is described. The basic structure and basic operation of a memory device relating to the third embodiment are the same as those of the memory device relating to the above-described first embodiment. Thus, a description is omitted of matters described in the above first embodiment and matters easily known by analogy from the above first embodiment.

Referring to FIG. 44 to FIG. 55, a description is given of a method of manufacturing a memory device relating to the above-described first embodiment, second embodiment and Modifications 1 to 3.

FIG. 44 to FIG. 55 illustrate fabrication steps of the manufacturing method of the memory device.

To begin with, for example, an ordinary CMOS circuit, which controls an operation of a ReRAM, is formed on a silicon substrate. Subsequently, an interlayer insulation layer is formed on the silicon substrate in a manner to cover the CMOS circuit. The manufacturing method to be described below relates to a structure above this interlayer insulation layer.

Figure 44:
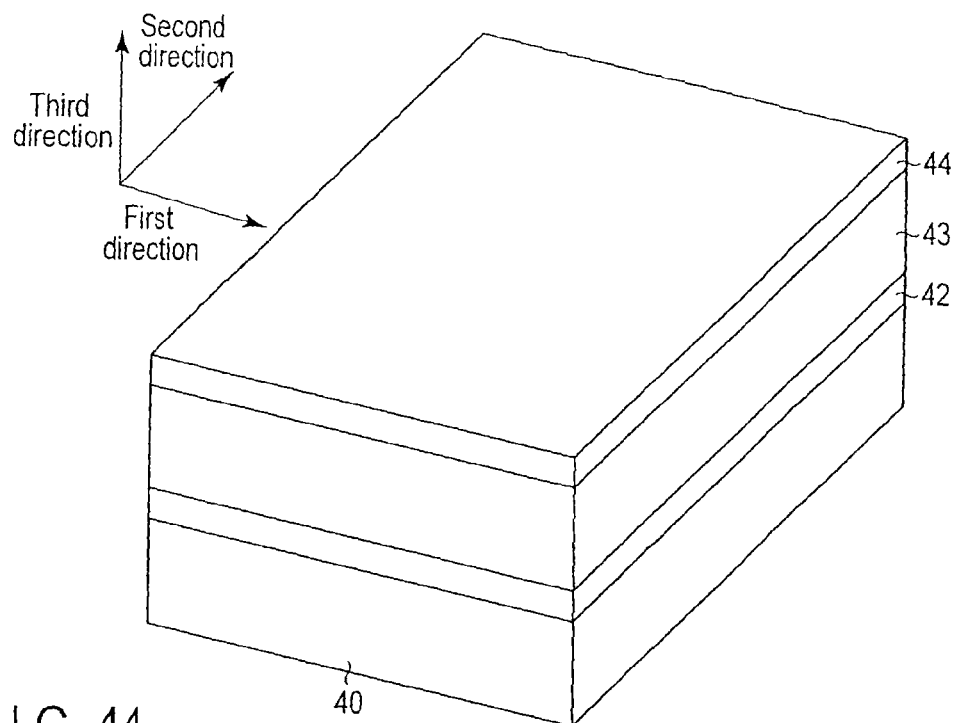

To start with, as illustrated in FIG. 44, a global bit line film 40 is formed on the interlayer insulation layer. The global bit line film corresponds to the above-described global bit line GBL. For example, the global bit line film 40 is formed by using, as a material, tungsten (W) and a TiN film functioning as a barrier metal.

Subsequently, an $n^+$ type silicon layer 42, a $p^-$ type silicon layer 43 and an $n^+$ type silicon layer 44 are successively formed on the global bit line film 40. The silicon layers 42 to 44 correspond to the above-described source region 5, channel region 6 and drain region 7, respectively.

The silicon layer 42, 44 has a dopant concentration of, e.g. about $1 \times 10^{20}$ cm$^{-3}$, and the film thickness thereof is, e.g. about 40 nm. The silicon layer 43 has a dopant concentration of, e.g. about $1 \times 10^{18}$ cm$^{-3}$, and the film thickness thereof is, e.g. about 120 nm. Thereafter, for example, anneal is performed under a condition of about 750° C. for 60 seconds, and the silicon layers 42 to 44 are crystallized.

Figure 45:
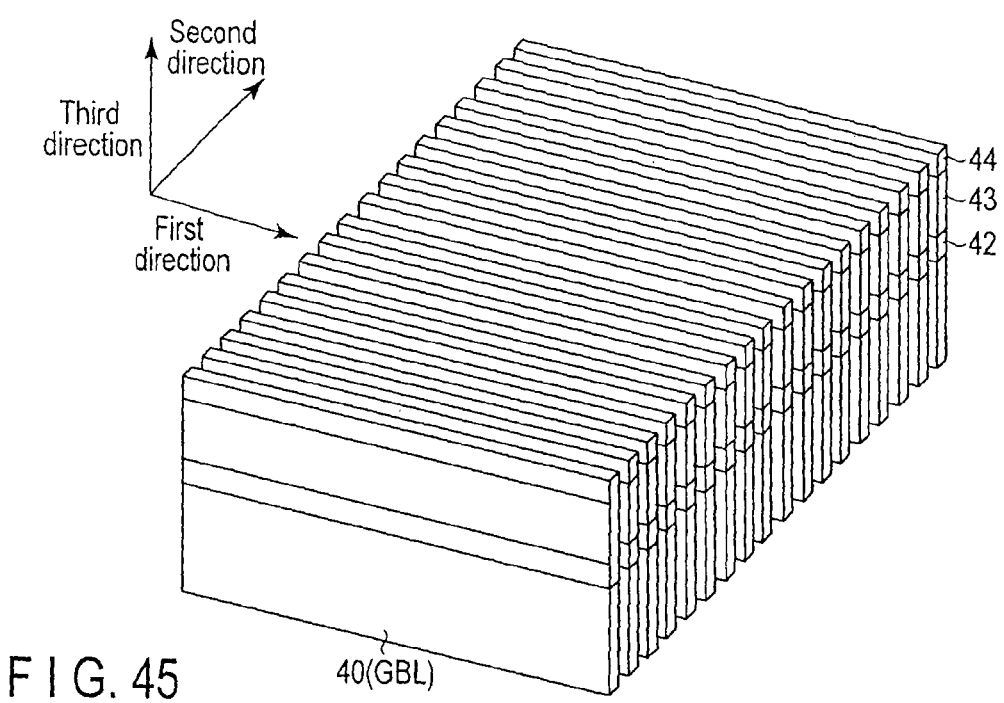

Next, as illustrated in FIG. 45, the silicon layers 42 to 44 and global bit line film 40 are patterned by a photolithography technique and an RIE technique. Thereby, stripe-shaped global bit lines 40 (GBL) extending in a first direction are formed. In the meantime, a line width and a neighboring interval of the global bit line GBL is, for example, about 20 nm, the film thickness is, for example, about 150 nm, and the sheet resistance is, for example, about 1.5 ohm/sq.

Subsequently, as illustrated in FIG. 46, an interlayer insulation layer 58 is formed on the entire surface. Then, the interlayer insulation layer 58 is polished by CMP or the like, and the upper surface of the silicon layer 44 is exposed. By this fabrication step, trench portions occurring in the step of FIG. 45 are buried by the interlayer insulation layer 58. In addition, the silicon layers 42, 43 and interlayer insulation layer 58 are patterned in stripe shapes extending in a second direction by using a photolithography technique and an RIE technique.

As a result of this step, the silicon layers 42, 43 are separated into sheet selectors SS. Incidentally, this patterning step is performed, for example, under a condition of a line width of about 16 nm and a neighboring interval of about 24 nm (half pitch is 20 nm). At bottom portions of trenches 45 formed by this step, the global bit lines 40 and interlayer insulation layer 58 are exposed.

Next, as illustrated in FIG. 47, an insulation layer 46 (e.g. a silicon oxide film) is formed on the entire surface. Subsequently, the insulation layer 46 is etched back, and thereby the insulation film 46 is left on only the bottom portions of the trenches 45. The film thickness of the left insulation layer 46 is, e.g. about 30 nm. Thus, in the trenches 45, parts of the silicon layer 42 and side surfaces of the silicon layers 43 and 44 are exposed.

Figure 48:
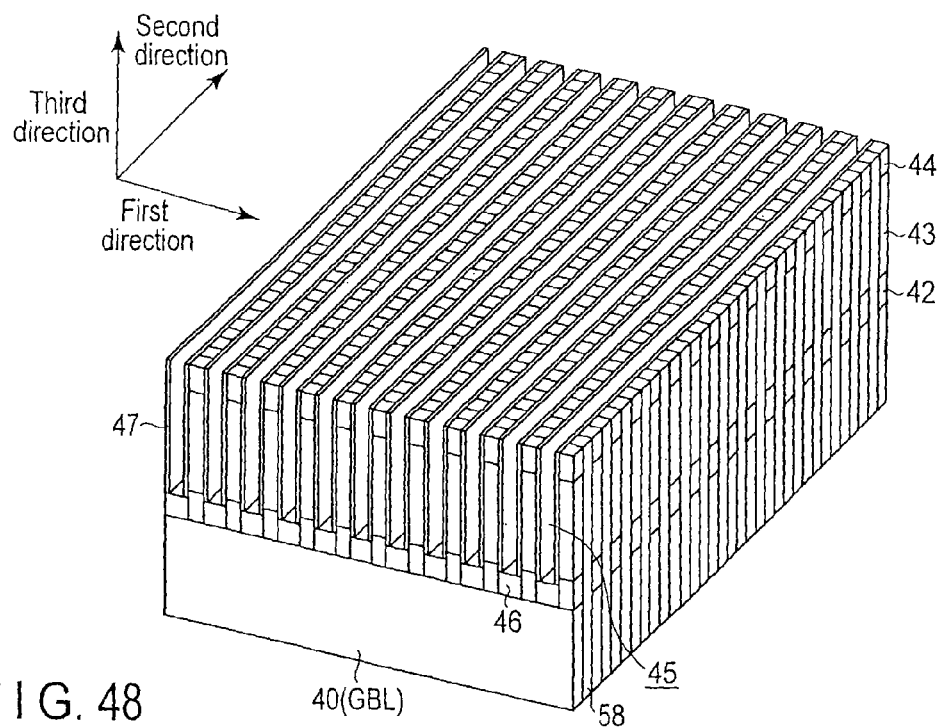

Next, as illustrated in FIG. 48, an insulation layer 47 is formed on the entire surface. The insulation layer 47 corresponds to the above-described gate insulation layer 9. Subsequently, an upper surface of the silicon layer 44 and the insulation layer 47 on the insulation layer 46 are removed, and thereby the insulation layer 47 is left on only side surfaces of the trenches 45.

Figure 49:
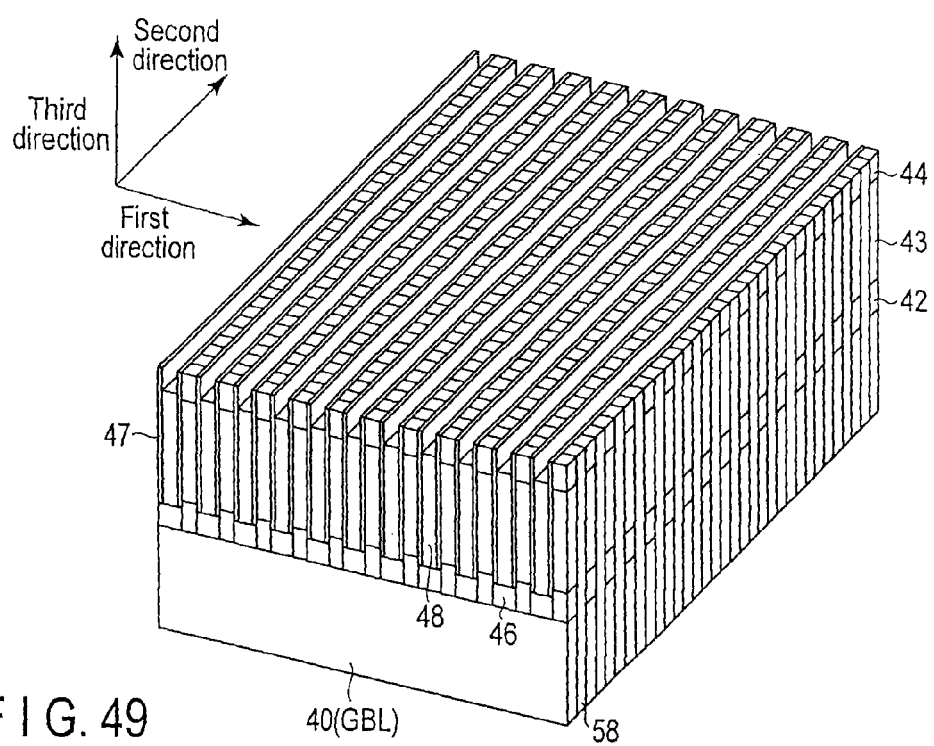

Next, as shown in FIG. 49, a conductive film 48 is buried in the trenches 45. The conductive film 48 is, for example, an $n^+$ type polycrystalline silicon layer, and corresponds to the above-described select gate line SSG. Then, the upper surface of the conductive film 48 is etched back, and the thickness of the conductive film 48 is set at, e.g. about 140 nm.

By this fabrication step, the bottom surface of the conductive film 48 is set to be lower than an interface between the silicon layers 42 and 43, and the upper surface of the conductive film 48 is set to be higher than an interface between silicon layers 43 and 44.

Next, as illustrated in FIG. 50, an insulation layer 49 (e.g. a silicon oxide film) is formed on the entire surface. Then, the insulation layer 49 is polished by, e.g. CMP, and is left only in the trenches 45. As a result, the upper surface of the silicon layer 44 is exposed.

Next, as shown in FIG. 51, an insulation layer 51 (e.g. a silicon oxide film) with a film thickness of, e.g. 20 nm is formed on the silicon layer 44 and insulation layers 49 and 58. Thereafter, 16-layer word line films 52 are formed on the insulation layer 51. The word line films 52 correspond to the word lines WL described with reference to FIG. 2.

In addition, the word line films 52 are formed by using, e.g. TiN as a material, and the film thickness thereof is, for example, about 10 nm. Besides, an insulation layer 53 (e.g. a silicon oxide film) with a film thickness of, e.g. 7 nm is formed between the stacked word line films 52. Subsequently, an insulation layer 54 (e.g. silicon oxide film) with a film thickness of, e.g. 13 nm is formed on the word line film 52 of the uppermost layer (16th layer in this example).

Next, as illustrated in FIG. 52, the insulation layers 54, 53 and 51 and word line film 52 are patterned in stripe shapes extending in the second direction by a lithography technique and an RIE technique. This patterning step is performed, for example, under a condition of a line width of about 15 nm and a neighboring interval of about 25 nm (half pitch is 20 nm).

In addition, this fabrication step is performed such that the insulation layers 54, 53 and 51 and word line film 52 are left on the underlying insulation layer 49. As a result of this step, word lines WL are formed, and the upper surfaces of the silicon layer 44 and insulation layers 58 and 47 are exposed at the bottom portions of trenches 55 occurring by the patterning.

Next, as illustrated in FIG. 53, a resistance change material 56 is formed on the bottom surfaces and side surfaces of the trenches 55 and on upper surfaces of the insulation layers 54. The resistance change material 56 corresponds to the resistance change material 4 described with reference to FIG. 2. The resistance change material is formed with a film thickness of, e.g. about 4 nm, and is formed so as not to fill the inside of the trench 55. Thereafter, etch-back is performed, thereby removing the resistance change material 56 on the bottom portion of the trench 55 and the upper surface of the insulation layer 54. As a result, the upper surfaces of the silicon layer 44 and insulation layers 58 and 47 are exposed once again at the bottom portion of the trench 55.

Next, as illustrated in FIG. 54, a bit line film 57 is formed on the entire surface, and is polished by CMP so that the bit line film 57 is left only in the trench 55. The bit line film 57 corresponds to the bit line BL described with reference to FIG. 2, and is formed by using, for example, $n^+$ type polycrystalline silicon as a material.

Next, as illustrated in FIG. 55, the bit line film 57 is patterned in a pillar shape by using a photolithography technique and an RIE technique.

This patterning step is performed, for example, under a condition that both the line width and the neighboring interval are about 20 nm. In addition, this step is performed such that the bit line film 57 is left on the underlying silicon layer 44. As a result of this step, bit lines BL are completed.

Thereafter, an interlayer insulation layer is buried in the trench between neighboring bit lines BL, and a memory cell region R1 is completed. Subsequently, like an ordinary semiconductor device, a passivation step is performed, and a wiring connection portion, which becomes an input/output portion, is formed. Finally, a post-process, such as an inspection and dicing, is performed, and thereby the memory device is completed.

In each of the above-described embodiments, etc., the number of selected word lines is only one in a memory cell arrangement, but the number of selected global bit lines may be plural at the same time. Thereby, since the number of bits, for which write, erase and read can be executed at the same time, increases, the band width can be improved.

In addition, in each of the above-described embodiments, etc., a material consisting mainly of HfO is used as the resistance change material which is used for the memory cell MC. However, use may be made of other materials, for instance, NiO, TiO2, SrZrO3, ZnMn2O4, Pr0.7Ca0.3MnO3, carbon, etc.

In each of the above-described embodiments, etc., the description has been given of the case where the resistance change material, which is used for the memory cell MC, is the bipolar operation element in which the transition from the high resistance state to the low resistance state and the transition from the low resistance state to the high resistance state are executed by the application of voltages with difference polarities. However, application is possible to the case of a unipolar operation element in which the transition of the resistance state is executed by the application of voltages of the same polarity. In this case, in order to narrow the range of supply voltages, which are required for the CMOS circuit, and to make the design of the CMOS circuit easier, it is desirable to execute SET/RESET by the application of voltages of the same polarity as in the case of read. Specifically, when a sense amplifier is connected to a global bit line, read is executed, in general cases, by increasing the global bit line voltage. Thus, it is desirable to also execute SET by the same polarity as in the case of RESET.

In the above description, for the purpose of convenience, the write operation has been described as the RESET operation, and the erase operation has been described as the SET operation. However, the write operation may be the SET operation, and the erase operation may be the RESET operation.

In each of the above-described embodiments, etc., the case has been described that the sheet selector is caused to execute the large-current operation for both the SET and RESET of the resistance change material. However, in the case where the characteristics of the resistance change material require a large current for only one of the SET and RESET, and it is preferable to limit the current for the other, it is possible to apply the large-current operation to only one of the SET and RESET, and to execute an ordinary MOSFET operation for the other. For example, in the case where the resistance change material requires a large current for the RESET operation but it is desirable, from the standpoint of operations, to limit a current including a transitional component at the time of the SET operation, it is possible to use the sheet selector by the large-current operation only in the case of RESET, and to use the sheet selector by the ordinary MOSFET operation in the case of SET. When the ordinary MOSFET operation is used, it should suffice if the accumulation time of holes is shortened by decreasing a time difference from the setting of one of the gates of the sheet selector at the select voltage to the setting of the other gate at the select voltage, or the hole current is decreased by increasing the rising time of the select voltage setting of the other gate. Similarly, in the case of READ, when there is no need to cause the sheet selector to execute the large-current operation, the ordinary MOSFET operation may be used.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A memory device comprising:
a plurality of global column lines arranged in parallel and extending in a first direction;
a plurality of row lines;
a plurality of column lines in a two-dimensional arrangement, which extend in a second direction which is perpendicular to the first direction;
a memory cell array including a plurality of memory cells each including a resistance change material, the memory cells being arranged at intersections between the row lines and the column lines;
a plurality of sheet selectors disposed between the global column lines and the column lines; and
a controller configured to control the global column lines, the row lines, the column lines, the memory cells and the sheet selectors,
the plurality of sheet selectors comprising:
a first transistor including a channel region, a first insulation layer formed on a first side surface of the channel region, and a first select gate line formed on the first insulation layer in the first direction; and
a second transistor including a channel region, a second insulation layer formed on a second side surface of the channel region, which is opposed to the first side surface in the first direction, and a second select gate line formed on the second insulation layer in the first direction, and
the controller being configured, at a time of storing or easing data in the memory cell array, to execute:

select a global column line, a row line and a select gate line in order to select the memory cells;

apply a select row line voltage to a selected row line of the plurality of row lines;

apply a non-select row line voltage to a non-selected row line of the plurality of row lines;

apply a select global column line voltage to a selected global column line of the plurality of global column lines;

apply a first non-select global column line voltage to a non-selected global column line of the plurality of global column lines;

apply a non-select selector voltage to the first and second select gate lines;

apply a first select selector voltage to the first select gate line of the first transistor of a selected sheet selector of the plurality of sheet selectors; and apply, after passage of a first time after the applying of the first select selector voltage, a second select selector voltage to the second select gate line of the selected sheet selector.

2. The device of claim 1, wherein the controller is configured to execute a rising to the select selector voltage in a shorter time than the first time when the second select selector voltage is applied to the second select gate line after the passage of the first time.

3. The device of claim 1, wherein the controller is configured to release select of a column line connected to the selected sheet selector such that three voltages of the select row line voltage, the select global column line voltage, the first select selector voltage and the second select selector voltage are set at the non-select row line voltage, the first non-select global column line voltage and the non-select selector voltage.

4. The device of claim 1, wherein the sheet selectors further comprises:

a source region disposed between a global column line and the channel region; and a drain region disposed between a column line and the channel region.

5. The device of claim 1, wherein after the select row line voltage is applied to the selected row line, the non-select row line voltage is applied to the non-selected row line, the select global column line voltage is applied to the selected global column line, the first non-select global column line voltage is applied to the non-selected global column line and the non-select selector voltage is applied to non-selected first and second select gate lines, the controller is configured to apply the select selector voltage to the first or second select gate line of the first and second transistors of the selected sheet selector.

6. The device of claim 1, wherein the resistance change material is made of at least one of materials including HfO, $TiO_2$, $ZnMn_2O_4$, NiO, $SrZrO_3$, $Pr_{0.7}Ca_{0.3}MnO_3$, or C.

7. The device of claim 1, wherein data write or data erase to the selected memory cell is executed by applying the second select selector voltage to the second select gate line.

8. The device of claim 1, wherein the select global column line voltage is higher than the first non-select global column line voltage.

9. The device of claim 1, wherein the select global column line voltage is lower than the first non-select global column line voltage.

10. The device of claim 1, wherein the select row line voltage is higher than the non-select row line voltage.

11. The device of claim 1, wherein the select row line voltage is lower than the non-select row line voltage.

12. The device of claim 1, wherein after applying the second select selector voltage to the second select gate line, the controller is configured to apply the non-select row line voltage to the selected row line and the select row line voltage to at least one of the non-selected row lines, and then the controller is configured to release select of the column line connected to the selected sheet selector.

13. The device of claim 1, wherein the first select selector voltage and the second select selector voltage are higher than the non-select selector voltage.

14. The device of claim 1, wherein the first select selector voltage is equal to the second select selector voltage.

15. The device of claim 1, wherein after the controller is configured to apply the second select selector voltage to the second select gate line, the controller is configured to set the selected global column line at a second non-select global column line voltage between the first non-select global column line voltage and the select global column line voltage.

16. A method of controlling a memory device, the device comprising:

a plurality of global column lines arranged in parallel and extending in a first direction;

a plurality of row lines;

a plurality of column lines in a two-dimensional arrangement, which extend in a second direction which is perpendicular to the first direction;

a memory cell array including a plurality of memory cells each including a resistance change material, the memory cells being disposed at junction planes of intersections between the row lines and the column lines; and a plurality of sheet selectors disposed between the global column lines and the column lines, the sheet selectors comprising:

a first transistor including a channel region, a first insulation layer formed on a first side surface of the channel region, and a first select gate line formed on the first insulation layer in the first direction; and a second transistor including a channel region, a second insulation layer formed on a second side surface of the channel region, which is opposed to the first side surface in the first direction, and a second select gate line formed on the second insulation layer in the first direction, the method comprising:

selecting a global column line, a row line and a select gate line in order to select the memory cells;

applying a select row line voltage to a selected row line;

applying a non-select row line voltage to a non-selected row line;

applying a select global column line voltage to a selected global column line;

applying a non-select global column line voltage to a non-selected global column line;

applying a non-select selector voltage to the first and second select gate lines which are not selected;

applying a first select selector voltage to the first select gate line of the first and second transistors of a selected sheet selector of the plurality of sheet selectors, the selected sheet selector being connected to a selected column line; and applying, after passage of a first time after the applying of the select selector voltage, a second select selector voltage to the second select gate line of the selected sheet selector.

17. The method of claim 16, wherein when the second select selector voltage is applied to the second select gate line after the passage of the first time, a rising to the select selector voltage is executed in a shorter time than the first time.

18. The method of claim 16, wherein releasing select of the memory cell which is selected such that three voltages of the select row line voltage, the select global column line voltage, the first select selector voltage and the second select selector voltage are set at the non-select row line voltage, the non-select global column line voltage and the non-select selector voltage which is applied to the first or second select gate line.

19. The method of claim 16, wherein after applying the select row line voltage to the selected row line, applying the non-select row line voltage to the non-selected row line, applying the
select global column line voltage to the selected global column line, applying the non-select global column line voltage to the non-selected global column line and applying the non-select selector voltage to the non-selected first and second select gate lines, the select selector voltage is applied to the first or second select gate line of the first and second transistors of the selected sheet selector.

\* \* \* \* \*